(12) United States Patent
Duong

(10) Patent No.: US 7,412,668 B1
(45) Date of Patent: Aug. 12, 2008

(54) INTEGRATED SYSTEM NOISE MANAGEMENT—DECOUPLING CAPACITANCE

(75) Inventor: Anthony T. Duong, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 217 days.

(21) Appl. No.: 11/343,461

(22) Filed: Jan. 30, 2006

(51) Int. Cl.
G06F 17/50 (2006.01)

(52) U.S. Cl. ............... 716/1; 716/6; 716/18; 716/2

(58) Field of Classification Search ............ 716/1, 716/2, 6, 18
See application file for complete search history.

(56) References Cited

U.S. PATENT DOCUMENTS

| | | | |
|---|---|---|---|
| 5,519,353 | A | 5/1996 | Rainal |
| 5,534,791 | A | 7/1996 | Mattos et al. |
| 6,687,881 | B2 | 2/2004 | Gauthier et al. |
| 7,047,515 | B1 | 5/2006 | Vitek et al. |
| 7,092,292 | B2 * | 8/2006 | Mokhlesi et al. ............ 365/206 |
| 7,254,797 | B2 | 8/2007 | Garlepp |
| 7,278,046 | B2 | 10/2007 | Chang |
| 7,287,205 | B2 | 10/2007 | Lin et al. |
| 7,302,664 | B2 | 11/2007 | Haridass et al. |
| 7,313,771 | B2 | 12/2007 | Reddy et al. |
| 2002/0040466 | A1 | 4/2002 | Khazei |
| 2003/0016049 | A1 | 1/2003 | Wei |
| 2004/0062301 | A1 | 4/2004 | Yamaguchi et al. |
| 2005/0144580 | A1 | 6/2005 | Berkram et al. |
| 2005/0283749 | A1 | 12/2005 | Yeh |
| 2006/0158828 | A1 | 7/2006 | Amey et al. |
| 2006/0184904 | A1 | 8/2006 | Murgai et al. |
| 2006/0194366 | A1 | 8/2006 | Lee et al. |
| 2006/0225009 | A1 | 10/2006 | Reddy et al. |
| 2007/0069762 | A1 | 3/2007 | Zivanovic |
| 2007/0070733 | A1 | 3/2007 | Chang |
| 2007/0102811 | A1 | 5/2007 | Swaminathan et al. |
| 2007/0109827 | A1 | 5/2007 | DelaCruz |
| 2007/0291441 | A1 | 12/2007 | Inoue et al. |

FOREIGN PATENT DOCUMENTS

JP 01222319 A 9/1989

OTHER PUBLICATIONS

U.S. Appl. No. 10/691,151, filed Oct. 21, 2003, Duong.

(Continued)

*Primary Examiner*—Thuan Do
(74) *Attorney, Agent, or Firm*—W. Eric Webostad

(57) ABSTRACT

A method for noise suppression for a system implementation of an integrated circuit design is described. First clock operating parameters for logic blocks of the integrated circuit design are obtained. Second clock operating parameters for input/output banks of the integrated circuit design are obtained. At least one switching frequency associated with at least one power supply source is obtained. First and second capacitor values for the at least one power supply source are determined responsive to the first clock operating parameters, the second clock operating parameters, and the at least one switching frequency. The first capacitor values are associated with a first frequency range of operation and the second capacitor values are associated with a second frequency range of operation which is higher than the first frequency range of operation. Third capacitor values for suppression of anti-resonances are determined.

20 Claims, 50 Drawing Sheets

OTHER PUBLICATIONS

Hobbs et al., "Simulataneous Switching Noise Suppression for High Speed Systems Using Embedded Decoupling", Proceedings of 51st Electronic Components and Technology Conference, May 29-Jun 1, 2001, pp. 339-343.

Tang et al., "Delay Uncertainty Due to On-Chip Simultaneous Switching Noise in High Performance CMOS Integrated Circuits", 2000 IEEE Workshop on Signal Processing Systems, Oct. 11-13, 2000, pp. 633-642.

Hajj, Simultaneous Switching Noise, and Reliability Analyses of VLSI Core Logic, Electrical Performance of Electronic Packaging, Oct. 25-27, 1999, p. 147.

Osorio et al., "255 CBGA Electrical Performance Comparison Through Package Electrical Characterization and System Simulations", Electrical Performance of Electronic Packaging, Oct. 2-4, 1995, pp. 95-97.

Jou et al., "Low Switching Noise and Load-Adaptive Output Buffer Design Techniques", IEEE Journal of Solid-State Circuits, vol. 36, No. 8, Aug. 2001, pp. 1239-1249.

11/343,415, Duong, Anthony T., filed Jan. 30, 2006, "Integrated System Noise Management - System Level", Xilinx, Inc., 2100 Logic Drive, San Jose, CA 95124.

11/344, 423 Duong, Anthony T., filed Jan. 30, 2006, "Integrated System Noise Management - Bounce Voltage", Xilinx, Inc., 2100 Logic Drive, San Jose, CA 95124.

11/344,313, Duong, Anthony T., filed Jan. 30, 2006, "Integrated System Noise Management - Clock Jitter", Xilinx, Inc., 2100 Logic Drive, San Jose, CA 95124.

* cited by examiner

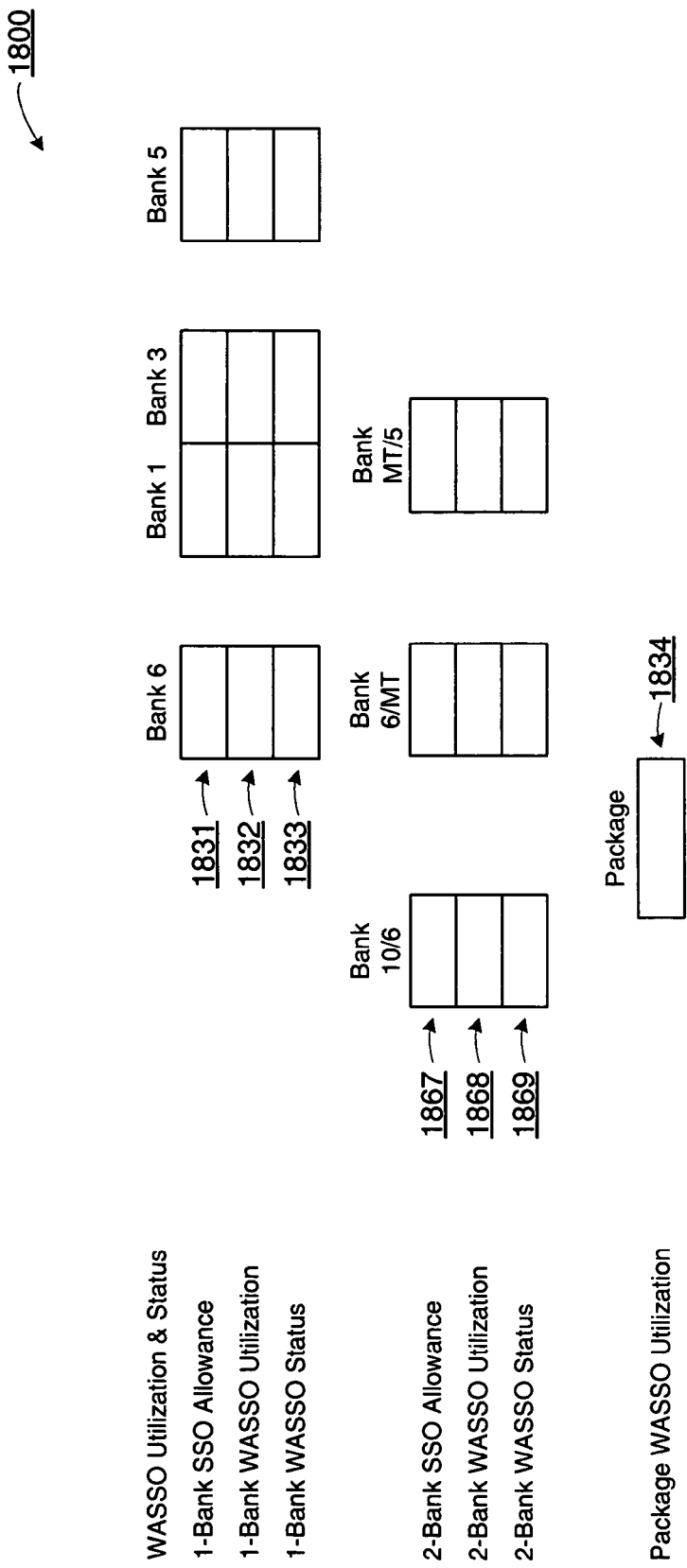

INTEGRATED SYSTEM NOISE MANAGEMENT—DECOUPLING CAPACITANCE

FIELD OF THE INVENTION

One or more aspects of the invention relate generally to noise management and, more particularly, to integrated system noise management by selecting decoupling capacitance.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, noise management was done using discrete solutions for different types of noise. However, these discrete solutions often were guesses based on previous experience. Furthermore, many of these solutions were employed after the fact, namely as a fix to noise identified after building an integrated circuit ("IC"), building a printed circuit board ("PCB"), or assembling an IC/PCB assembly. Part of the inability to dissipate noise in an integrated circuit was a failure to understand the interplay between different types of noise. Part of the inability to accurately predict noise was due to a failure to account for noise generated due to coupling an IC die to a package, a PCB, or a backplane, depending on the application.

Accordingly, it would be desirable and useful to provide means that overcome one or more of the above-identified limitations.

SUMMARY OF THE INVENTION

One or more aspects of the invention relate generally to noise management and, more particularly, to integrated system noise management by selecting decoupling capacitance.

An aspect of the invention is a method for noise suppression for a system implementation of an integrated circuit design. First clock operating parameters for logic blocks of the integrated circuit design are obtained. Second clock operating parameters for input/output banks of the integrated circuit design are obtained. At least one switching frequency associated with at least one power supply source is obtained. First and second capacitor values for the at least one power supply source are determined responsive to the first clock operating parameters, the second clock operating parameters, and the at least one switching frequency. The first capacitor values are associated with a first frequency range of operation. The second capacitor values are associated with a second frequency range of operation which is higher than the first frequency range of operation. Third capacitor values for suppression of anti-resonances are determined.

Another aspect of the invention includes software comprising code for performing the above method.

Yet another aspect of the invention is an article of manufacture. A computer useable medium has computer executable program code means embodied therein for providing system noise management for an assembly. The assembly includes an integrated circuit design to be coupled to a circuit board design. The program code means is for identifying decoupling capacitances for the assembly to reduce power distribution system noise.

BRIEF DESCRIPTION OF THE DRAWINGS

Accompanying drawing(s) show exemplary embodiment (s) in accordance with one or more aspects of the invention; however, the accompanying drawing(s) should not be taken to limit the invention to the embodiment(s) shown, but are for explanation and understanding only.

FIGS. 16B-1 through 16B-2, is a flow diagram depicting an exemplary embodiment of a system jitter predictor ("SJP") flow.

FIGS. 16C-1 through 16C-2, is a flow diagram depicting an exemplary embodiment of a Printed Circuit Board ("PCB") analysis flow.

FIGS. 16D-1 through 16D-3, is a flow diagram depicting an exemplary embodiment of an Application Specific Noise Suppression ("ASNS") flow.

FIGS. 17A-1 through 17A-5, is a spreadsheet diagram depicting an exemplary embodiment of a PCB analysis portion of a user interface.

FIGS. 17B-1 through 17B-5, is a spread sheet diagram depicting an exemplary embodiment of a WASSO analysis portion of a user interface.

FIGS. 17C-1 through 17C-5, is a spreadsheet diagram depicting an exemplary embodiment of an SJP portion of a user interface.

FIGS. 17D-1 through 17D-3, is a spreadsheet diagram depicting an exemplary embodiment of an ASNS analysis portion of a user interface.

FIGS. 18-1 and 18-2, is a spreadsheet diagram depicting an exemplary embodiment of a clock planner.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

There are many types of complex integrated circuits for which external factors affect performance. General categories of these complex integrated circuits may include system-on-chips ("SoCs"), processors, application specific integrated circuits ("ASICs"), and application specific standard products ("ASSPs"), among others. The terms "include" and "including" as used herein mean including without limitation. Examples of such integrated circuits include microprocessors, digital signal processors ("DSPs"), communication integrated circuits including framers and cross-connects, programmable logic devices ("PLDs"), memories, and graphic signal processors ("GSPs"). One type of complex programmable logic device integrated circuit is a Field Programmable Gate Array ("FPGA"), which is used for purposes of clarity by way of example and not limitation. However, from the example of an FPGA, it will be apparent that any complex integrated circuit subject to one or more performance affecting factors, such as ground bounce, clock jitter, or equivalent series resistance ("ESR") of decoupling capacitance, may be used. What follows generally includes description relating to managing noise associated with digital logic devices and, more particularly, to calculating and predicting noise generated by at least substantially simultaneous switching of transistors in such digital logic devices, including such switching in FPGAs.

Figure 1:
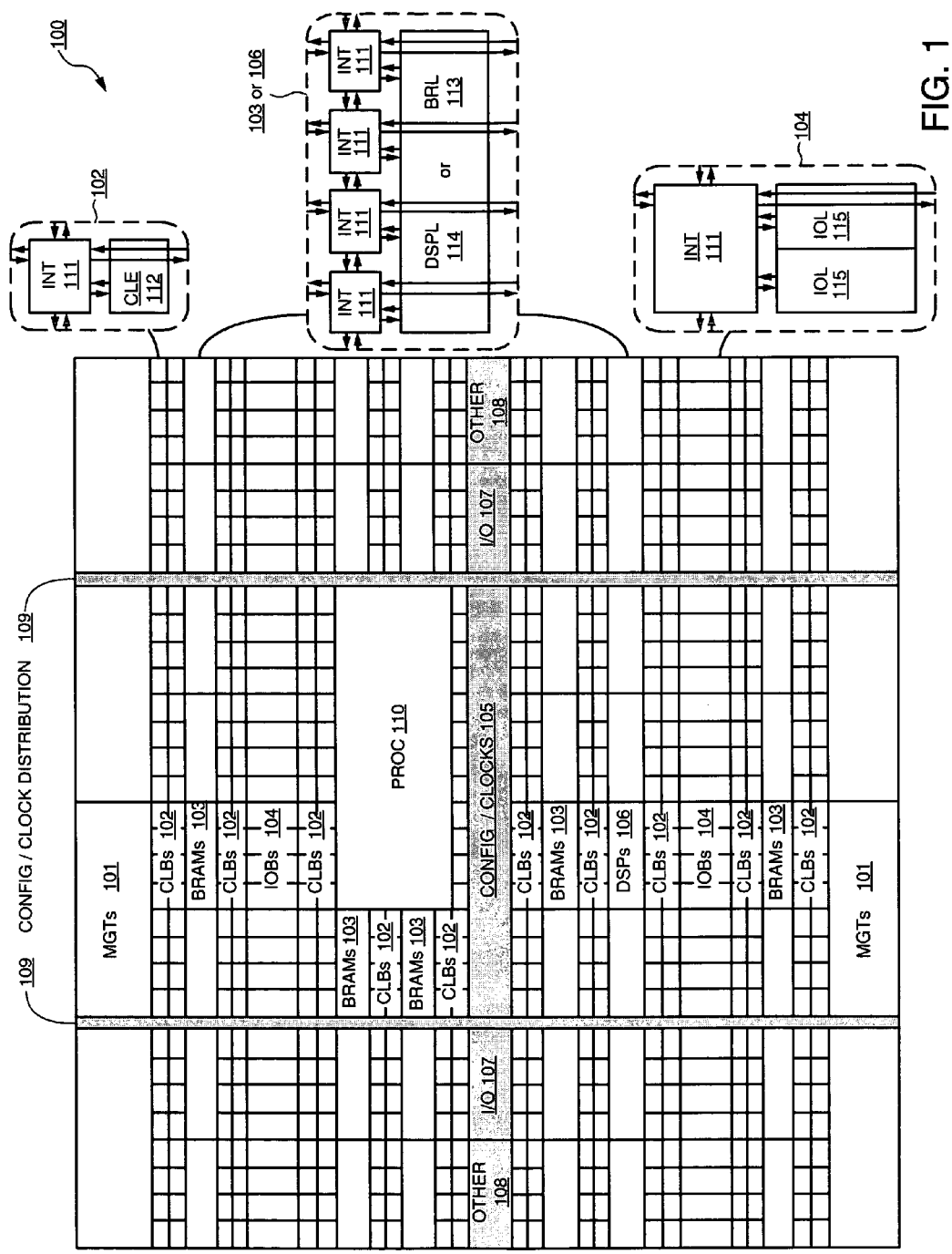
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ("I/O") ports 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2A:
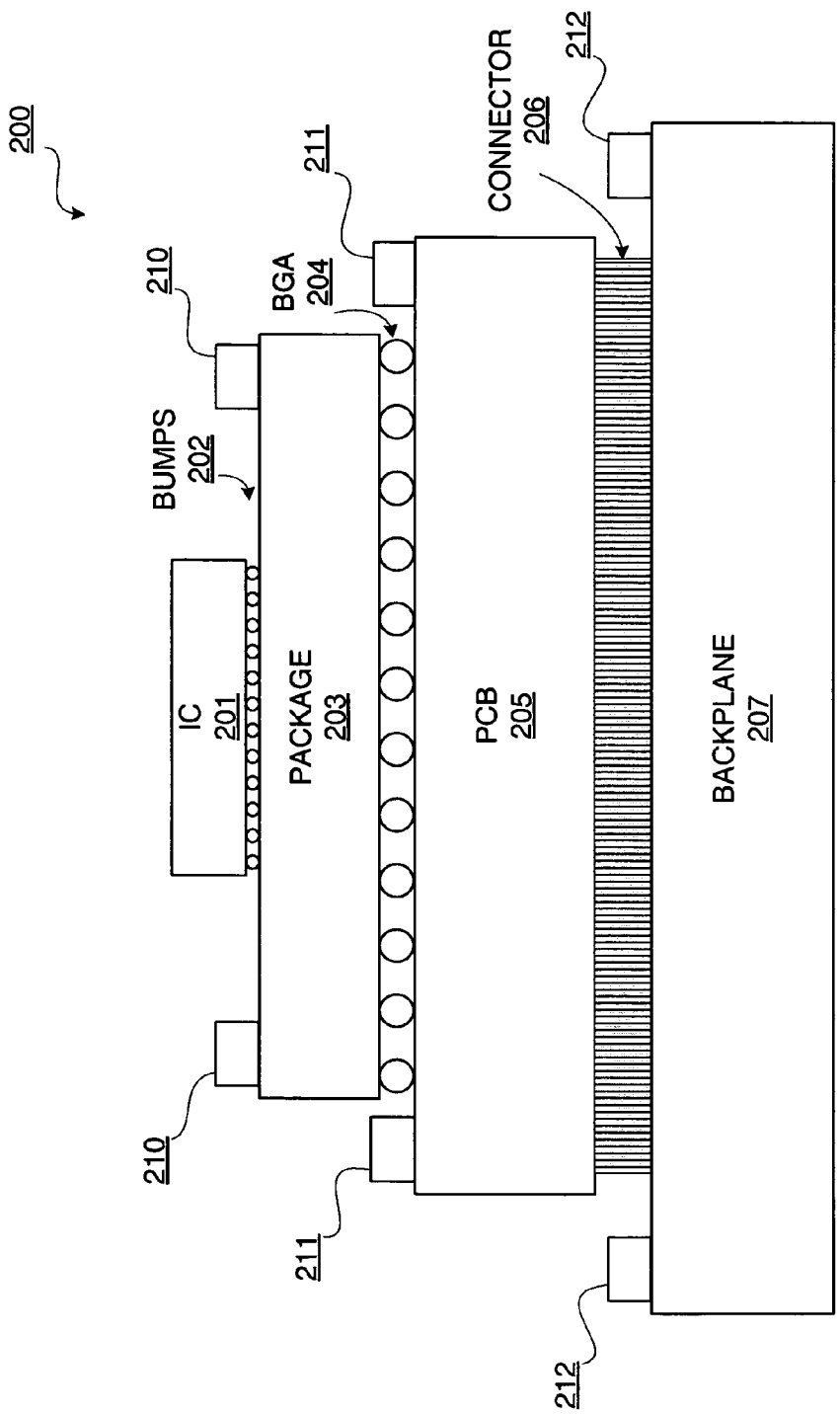
FIG. 2A is a side view depicting an exemplary embodiment of an assembly including an integrated circuit coupled to a printed circuit board ("PCB").

FIG. 2A is a side view depicting an exemplary embodiment of an assembly 200 including an integrated circuit ("IC") 201 coupled to a printed circuit board ("PCB") 205. IC 201 may be FPGA 100 of FIG. 1 or other known complex IC. Although FIG. 2B specifically identifies different types of interconnect arrays, such as solder bumps 202, ball grid array ("BGA") 204 and connector 206, it should be understood that any one of these types of interconnect arrays, or any combination of two or more of these interconnect arrays, may be used.

IC 201 is coupled to package 203 via solder bumps 202. Solder bumps 202 may be configured or otherwise laid out using repeated application of an interconnect pattern, as is known. Package 203, which may be made of an organic or inorganic material as is known, is coupled to PCB 205 via BGA 204. BGA 204 may be a fine-pitch BGA. BGA 204 may be laid out in accordance with tiling with a tile, as is known.

PCB 205 may be a line card or daughter card coupled to a backplane, motherboard, or other larger PCB via connector topology 206. Thus, although a backplane 207 is used for this example, it should be understood that other types of PCBs may be used. Connector topology 206 may be configured using one or more tiles as described below herein in additional detail. Moreover, it should be appreciated that a multi-chip module can be coupled to a PCB using one or more tiles for connector topology. Furthermore, a PCB-to-mezzanine card application may be coupled using a connector topology having one or more tiles.

Although the above description with reference to FIG. 2A has been in terms of solder bumps 202, BGA 204, and connector topology 206, it should be understood that a tile as described herein may be used with other types of connectors for communicating information. Examples of other types of connectors include optical connectors. Moreover, it should be appreciated that although a tile as described herein is used with flip-chip technology, a wirebond or other known interconnect technology may be used. Furthermore, although an example of a BGA is used, it should be understood that other connector technologies, including land grid array ("LGA") and column grid array ("CGA"), among other known connector technologies, may be used.

In order to address noise owing to components external to IC 201, such as package 203, PCB 205, and backplane 207, it is known to couple decoupling capacitors to these various IC external items. For example, one or more on-package capacitors 210 may be used for to reduce noise. Moreover, one or more on-PCB capacitors 211 may be used to reduce noise. Furthermore, one or more on-backplane capacitors 212 may be used to reduce noise. The amount of capacitance used in each of these instances is application-dependent, and may be determined as described below in additional detail.

Notably, in contrast to ASICs, FPGAs need not be manufactured with a predetermined user design in view. Thus, performance may be affected by the types and amounts of circuitry in a user's design and the operating parameters of a user's design, among other factors. For example, response of capacitors used in a user's design may affect the power distribution system ("PDS") response. This is but one example; it should be understood that there are many factors which influence performance. Accordingly, to account for these factors in a meaningful way, a software application should be variable to account for a significant number of these factors, as well as to allow variation thereof, to not only predict performance based on variables but also to allow such performance to be enhanced by variation of one or more factors. Though variability is particularly relevant for implementations using programmable logic, including I/O variability, variability of such factors may be at issue in non-programmable logic applications too.

Figure 2B:
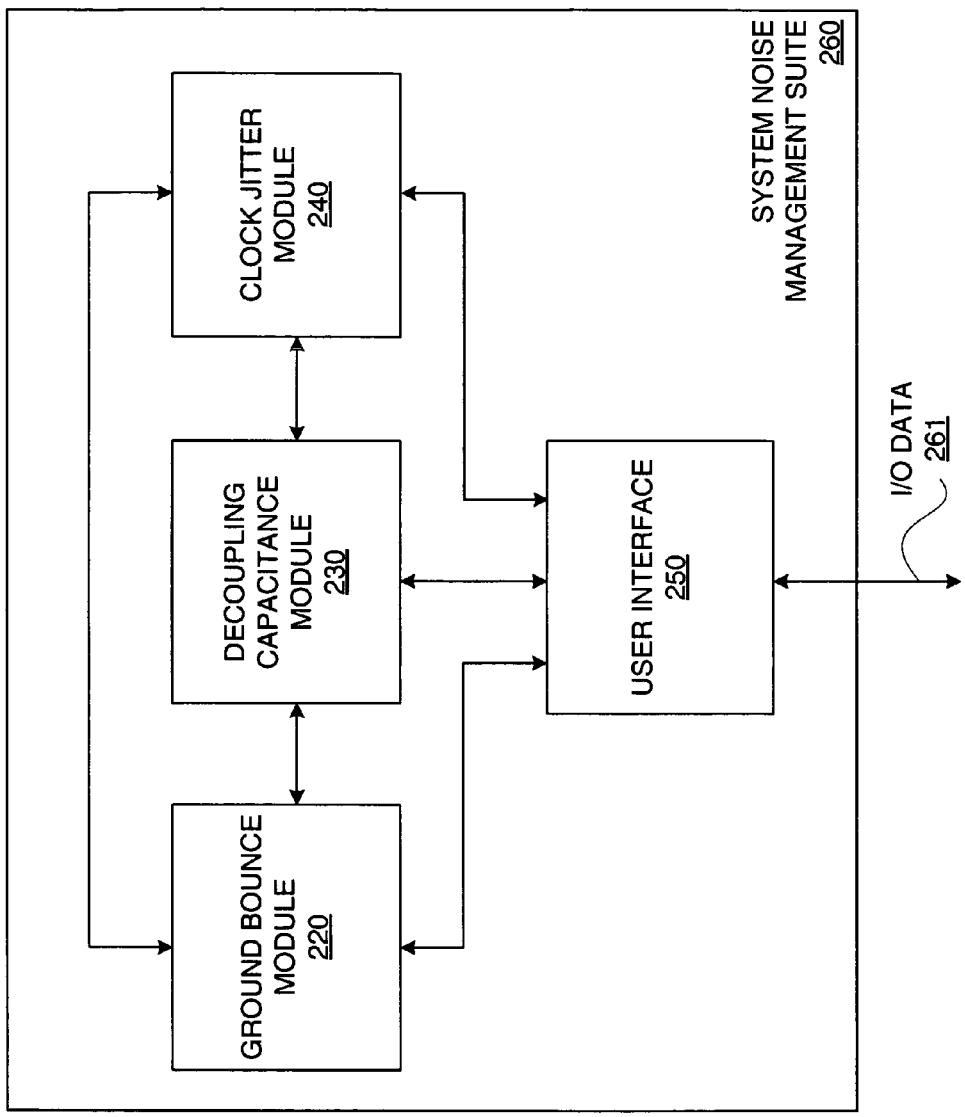
FIG. 2B is a block diagram depicting an exemplary embodiment of a system noise management suite.

FIG. 2B is a block diagram depicting an exemplary embodiment of a system noise management suite 260. System noise management suite 260, which may be an integrated software tool, includes ground bounce module 220, decoupling capacitance module 230, clock jitter module 240, and user interface 250. As described below in additional detail, system noise management suite may be implemented using a spreadsheet program, such as Excel from Microsoft of Redmond, Wash. or other known spreadsheet program. It should be appreciated that modules 220, 230, and 240 may communicate with one another. This is because calculations done in one module may be used in another module due to there being some interplay between modules. Furthermore, a single user interface 250 may be used to provide a single point of reference for communicating with each of modules 220, 230, and 240. Thus, for example, if a variable input via I/O data 261 is provided to a user interface 250, and such variable is used in more than one of modules 220, 230, and 240, such variable need not be entered more than one time. Thus, a single point of reference is provided to facilitate ease of use by providing a single user interface 250 for each of modules 220, 230, and 240. Notably, at some level of system integration with respect to coupling an integrated circuit die to a backplane, for example as described with reference to FIG. 2A, there is a degree of uncertainty with respect to the interrelationship of all the many components.

Even though ground bounce, decoupling capacitance, and clock jitter may all seem like disparate performance factors, as shall be clarified from the following description, these performance factors may overlap in instances. Accordingly, by providing a sufficiently complete integration of modules 220, 230, and 240, a user may be provided with a strategic approach to system noise management, for example for noise management of an integrated circuit die coupled to a PCB or backplane.

For example, data input via I/O data 261 may include amount of ground bounce to be tolerated by a system. Thus, it may be determined whether ground bounce is within tolerance or whether design changes may need to be made to bring ground bounce within tolerance. Data output via I/O data 261 may also include possible decoupling capacitance of values to be used to obtain a target PDS noise level. Additionally, data output via I/O data 261 may indicate the amount of clock jitter that a system integration will have, and thus such jitter may be taken into account with respect to signaling windows, for example.

More particularly with respect to FPGAs, because noise management may be done at a bank level with respect to banks of pins, an FPGA may be designed to be more like an ASIC. In other words, parameters are better understood with an ASIC design as opposed to a user-variable programmable logic solution. Thus, by providing a clearer picture of how to implement a user design in an FPGA to obtain a managed noise solution at a bank level, an FPGA design becomes more deterministic, like that of an ASIC. In other words, data output via I/O data 261 predicts behavior, and may be used to guide a user as to how to implement a design in an FPGA, including bank selection. Thus, behavior of a user design to be instantiated in an FPGA and mounted to a PCB for example may be more accurately predicted prior to actual implementation. Thus, an FPGA having a user design instantiated therein that has been corrected to account for predicted behavior is more deterministic with respect to performance obtained because predicted system noise-related timing parameters have enhanced accuracy.

Figure 2C:
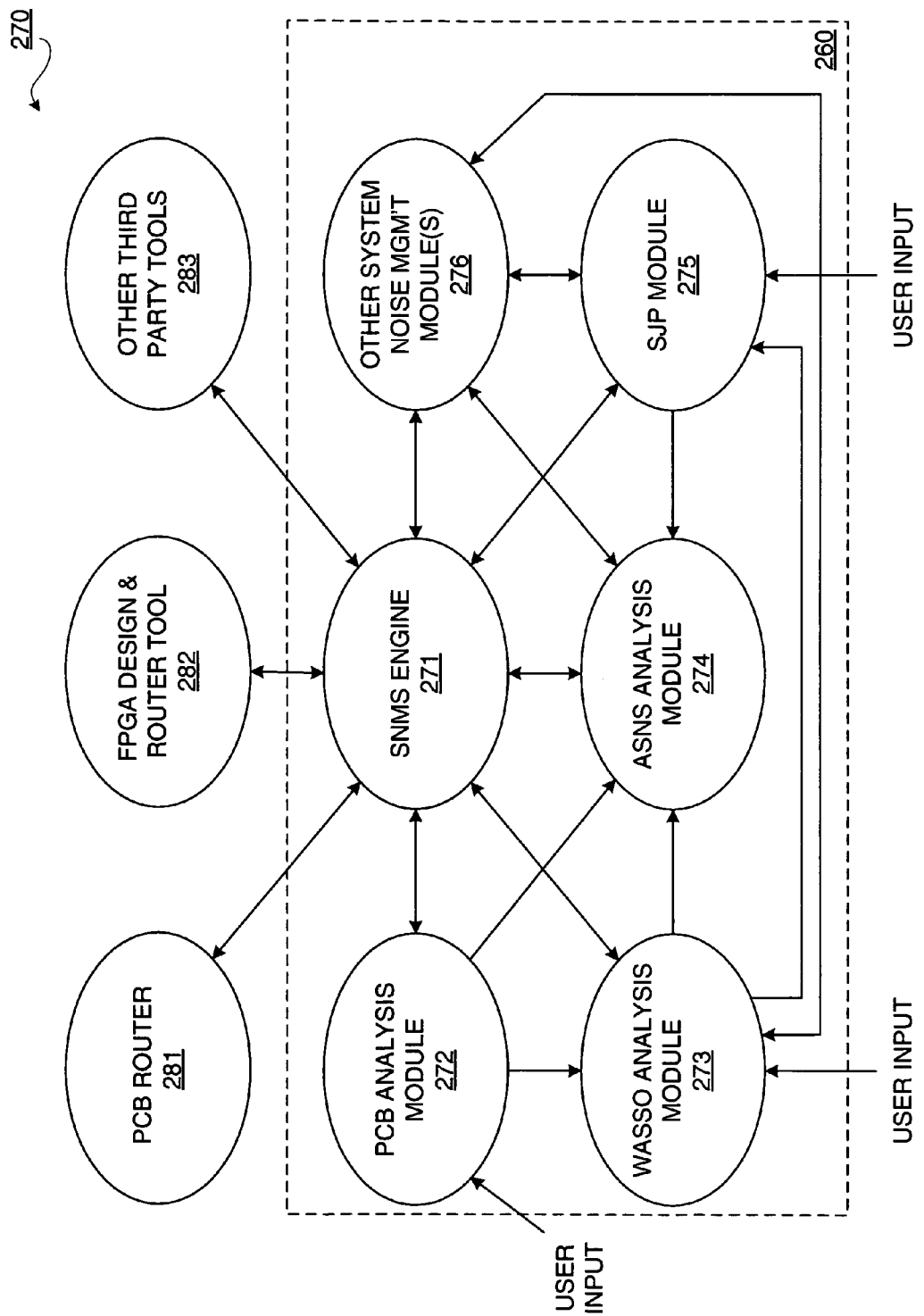
FIG. 2C is an information flow diagram depicting an exemplary embodiment of system noise management architecture.

FIG. 2C is an information flow diagram depicting an exemplary embodiment of system noise management architecture 270. System noise management architecture 270 may include system noise management suite ("SNMS") 260, where modules 272 through 275 and SNMS engine 271 form SNMS suite 260. System noise management architecture 270 includes SNMS engine 271 to access data and other information external to SNMS 260, as well as to provide exchange of information between modules. SNMS engine 271 may include formulas for calculating ground bounce, decoupling capacitance, and clock jitter, among other calculations described elsewhere herein. Additionally, SNMS engine 271 may include links for communication with modules 272 through 276 of system noise management architecture 270, as well as links for communication with PCB router 281, FPGA design and router tool 282, as well as other third party tools 283. PCB router 281 may be a software tool such as may be available from Cadence of San Jose, Calif. or other CAD/CAE software provider. PCB router 281 is for providing routing for forming a PCB, and is well known. FPGA design and router tool 282 may be an Integrated Software Environment ("ISE") tool available from Xilinx, Inc. of San Jose, Calif., or other known FPGA design and router tool.

PCB analysis module 272 may be configured to provide user input such as via user interface 250 of FIG. 2B for example. PCB analysis module 272 may be used for communicating such user input or information derived using such user input to Weighted Average Simultaneous Switching of Outputs ("WASSO") analysis module 273, Application Specific Noise Suppression ("ASNS") analysis module 274, and SNMS engine 271. WASSO analysis module 273 may receive user input, such as via user interface 250 of FIG. 2B and may provide such user input or information derived from such user input to SNMS engine 271 and ASNS analysis module 274. ASNS analysis module 274 may be configured to provide information to SNMS engine 271 as well as to one or more other system noise management module(s) 276 which may be developed. Additionally, WASSO analysis module 273 may be linked to such other system noise management module(s) 276. System jitter predictor ("SJP") module 275 is configured to receive user input, such as via user interface 250 of FIG. 2B, and to provide such user input or information derived from such user input to SNMS engine 271 and to ASNS analysis module 274. Moreover, SJP module 275 may be linked to other system noise management module(s) 276, and WASSO analysis module 273 may be configured to provide information to SJP module 275. Notably, SNMS engine 271 and modules 272 through 275 are described below in additional detail. Furthermore, one or more modules 276 may be added to provide information to ASNS analysis module 274. Thus, the benefit of a modular system is that other modules may be discretely added, and may exchange information with one or more existing modules. Additionally, it should be appreciated that some modules 272 through 275 may be combined, such as merging PCB analysis module 272 into one or both of modules 273 and 274. Moreover, not all of such modules need to be implemented, depending on what functionality is to be provided.

Figure 3:
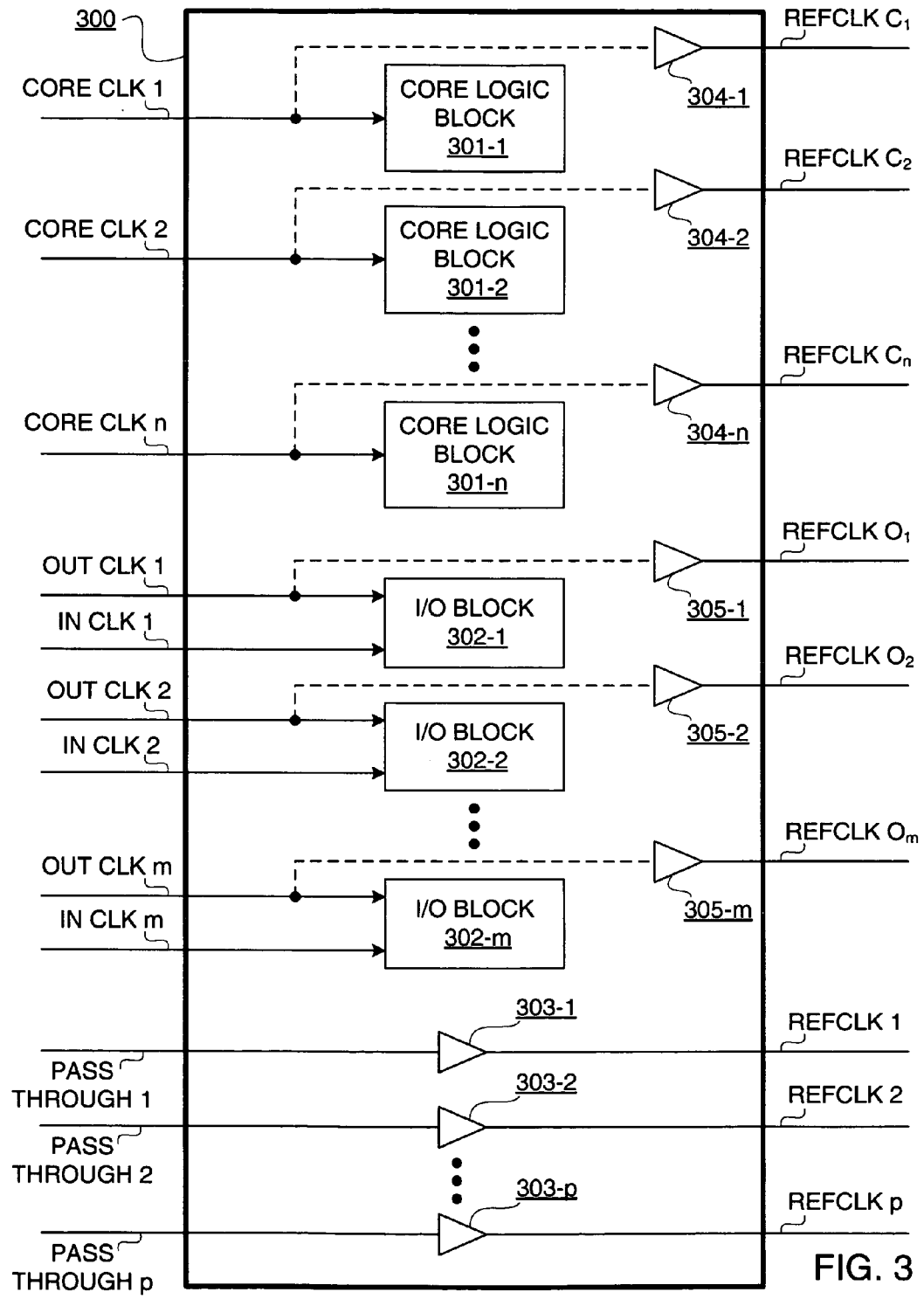
FIG. 3 is a block diagram depicting an exemplary embodiment for providing reference clock signals.

In order to more fully appreciate how signaling to and from an FPGA may be related to noise management, FIGS. 3 through 8 provide examples of FPGA signaling. In particular, FIG. 3 is a block diagram depicting an exemplary embodiment for providing reference clock signals. Notably, as used herein, the terms "clock signal" and "clock" shall be used interchangeably. More particularly, a portion 300 of an FPGA includes core logic blocks 301-1 through 301-n, I/O blocks 302-1 through 302-m, and pass-through output buffers 303-1 through 303-p, for m, n, and p all being positive integers greater than one. Core logic blocks 301-1 through 301-n may be thought of as circuit implementations instantiated in CLBs or any functionality implemented in internal-only logic blocks of an FPGA, including but not limited to BRAM, DSP, and DCM, among other known FPGA internal logic blocks, that do not directly interface to circuitry external to the FPGA without going through at least one I/O block. I/O blocks 302-1 through 302-m may be thought of as circuit functionality instantiated in IOBs.

Core clocks 1 through n are respectively provided to core logic blocks 301-1 through 301-n. Optionally, core clocks 1 through n may be respectively provided to output buffers 304-1 through 304-n to provide reference clocks $C_1$ through $C_n$ externally from an FPGA. Furthermore, each I/O block 302-1 through 302-m may respectively receive an output clock signal 1 through output clock signal m. Responsive to output clock signals 1 through m, each I/O block 302-1 through 302-m may respectively provide an input clock signal 1 through m. Optionally, output clock signals 1 through m may respectively be provided to output buffers 305-1 through 305-m for providing reference clock output signals $O_1$ through $O_m$ externally from an FPGA.

Additionally, pass-through signals 1 through p may be respectively provided to pass-through output buffers 303-1 through 303-p for respectively providing reference clock signals 1 through p externally from an FPGA. Thus, it should be appreciated that reference clock signaling, such as reference clocks $C_1$ through $C_n$, $O_1$ through $O_m$, and 1 through p, may be associated with different types of circuitry internal to an FPGA, where signals illustratively shown on the left of portion 300 of FIG. 3 are generally FPGA internal signals and signals illustratively shown on the right of portion 300 of FIG. 3 are generally FPGA external signals.

Figure 4:
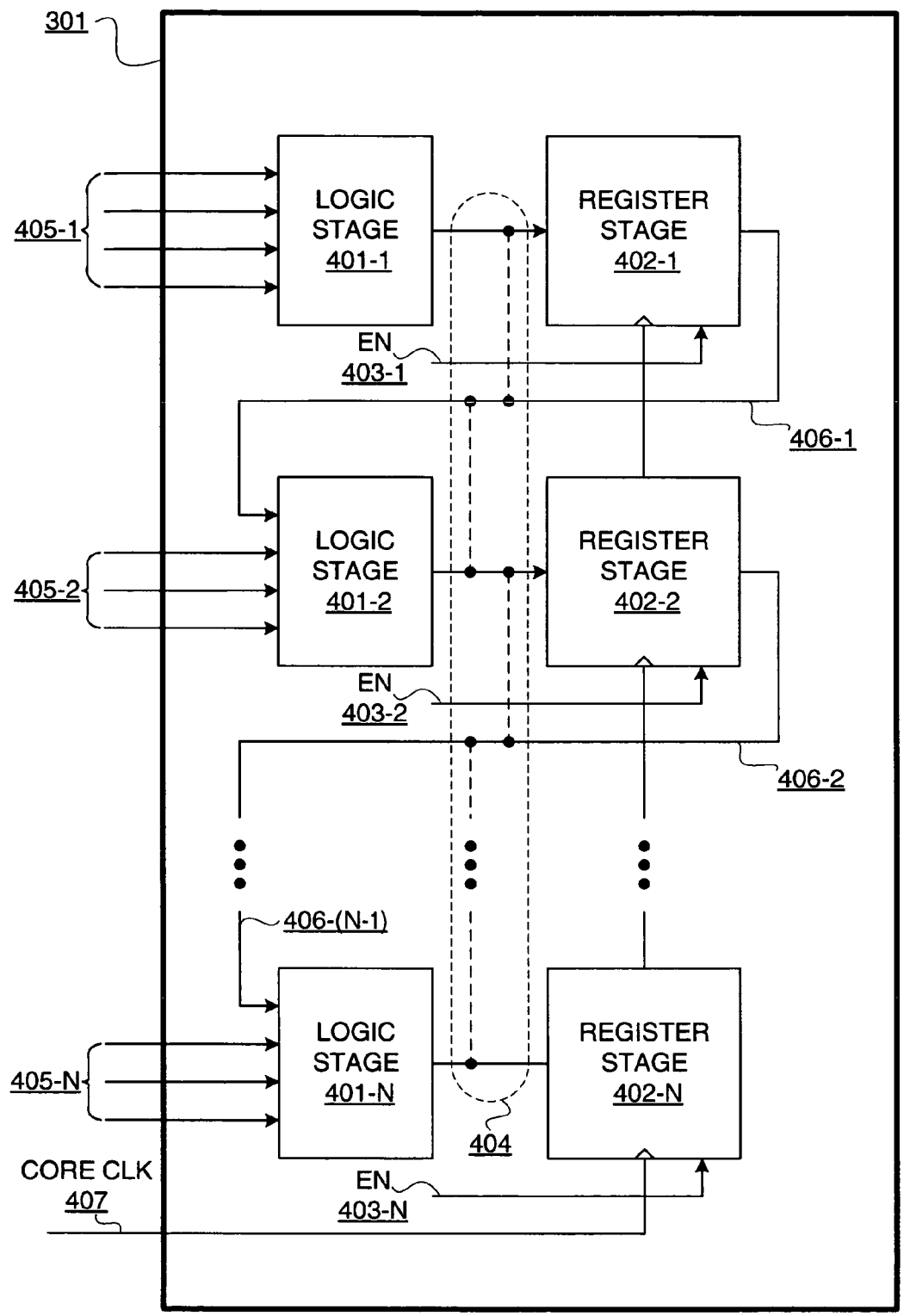
FIG. 4 is block diagram depicting an exemplary embodiment of a core logic block.

FIG. 4 is block diagram depicting an exemplary embodiment of a core logic block 301, such as a core logic block of core logic blocks 301-1 through 301-n of FIG. 3. One or more inputs 405-1 through 405-N may be respectively provided to logic stages 401-1 through 401-N, where N is an integer greater than one. Output of each logic stage 401-1 through 401-N may be respectively provided as input to register stages 402-1 through 402-N. Output 406-1 of register stage 402-1 may be provided as an input to logic stage 401-2. Output 406-2 of register stage 402-2 may be provided as an input to a next logic stage after logic stage 401-2, and so on, such that an output 406-(N−1) is provided to logic stage 401-N.

Each register stage 402-1 through 402-N may be respectively provided with an enable signal 403-1 through 403-N. Notably, enable signals 403-1 through 403-N may be same or different signals. Furthermore, one enable signal may be a delayed version of another enable signal for one or more of enable signals 403-1 through 403-N. Moreover, it should be understood that each logic stage 401 or associated register stage 402 is optional, as such logic or register stages may be bypassed as generally indicated by optional bypass connections 404 between outputs of logic stages 401 and associated register stages 402. Each register stage 402-1 through 402-N may be clocked responsive to a core clock signal 407. Notably, core clock signal 407 may be a core clock signal as described with reference to FIG. 3. Although rising-edge-triggered register stages are indicated, it should be appreciated that either falling- or rising-edge triggering may be done for register stages 402.

Figure 5:
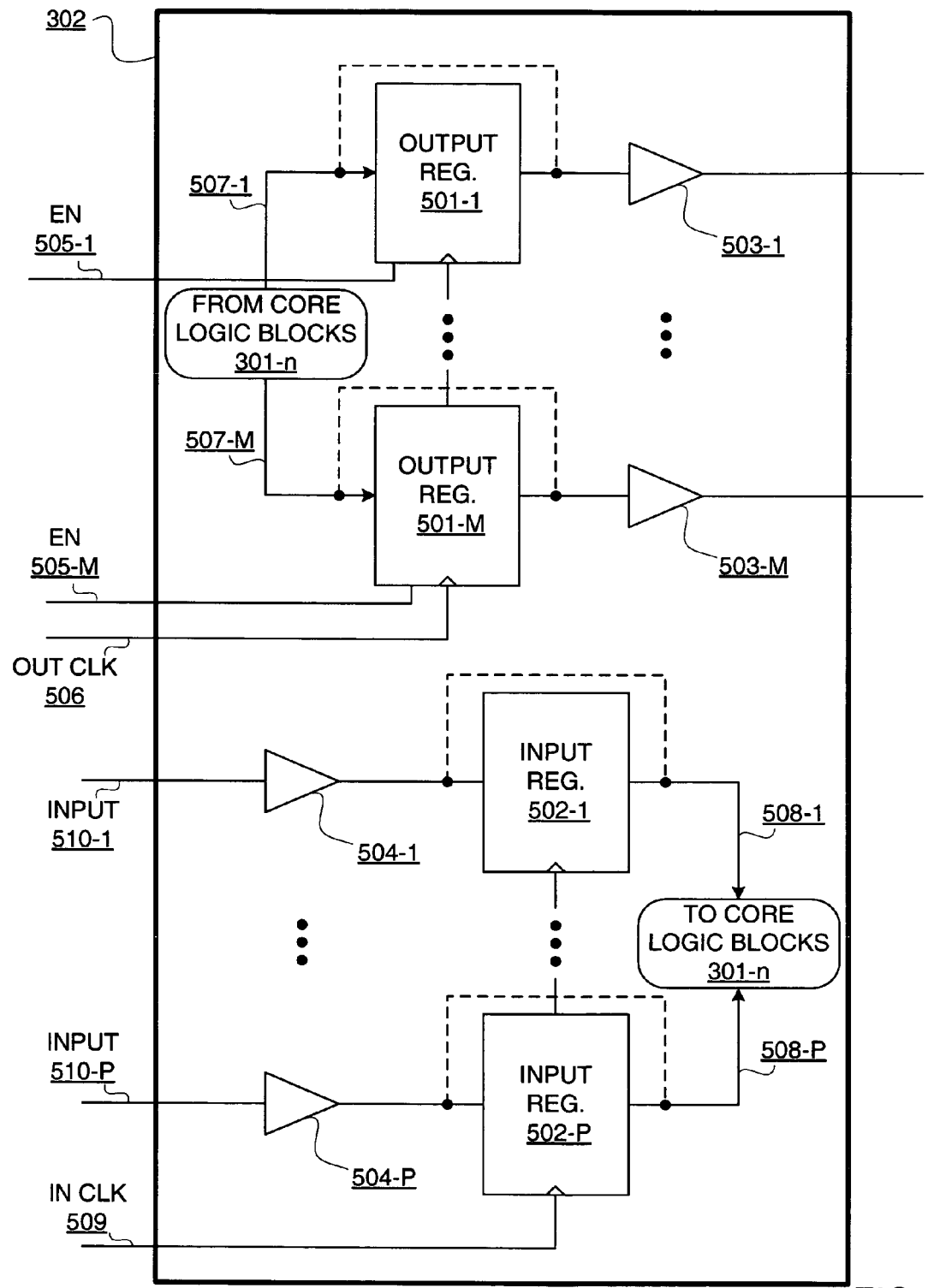
FIG. 5 is a block diagram depicting an exemplary embodiment of an input/output ("I/O") block.

FIG. 5 is a block diagram depicting an exemplary embodiment of an I/O block 302. I/O block 302 may be an I/O block of I/O blocks 302-1 through 302-m of FIG. 3. Data signaling, which may be obtained from core logic blocks 301 of FIG. 3, may be provided to output registers 501-1 through 501-M of I/O block 302, which signaling is generally indicated as input signals 507-1 through 507-M, where M is an integer greater than one. Notably, one or more of output registers 501-1 through 501-M may optionally be bypassed to respectively provide bypassed output to one or more output buffers 503-1 through 503-M. Output of output registers 501-1 through 501-M is respectively coupled to provide input to output buffers 503-1 through 503-M. Enable signals, such as clock enable signals 505-1 through 505-M, may be respectively provided to output registers 501-1 through 501-M. Notably, enable signals 505-1 through 505-M may be same or different signals. An output clock signal 506 is provided to output registers 501-1 through 501-M. Output clock signal 506 may be an output clock signal of as output clock signals 1 through m as described with reference to FIG. 3.

On an input side of I/O block 302, input signaling 510-1 through 510-P may be respectively provided to input buffers 504-1 through 504-P, for P an integer greater than one. Output of input buffers 504-1 through 504-P may be respectively provided to input registers 502-1 through 502-P. Notably, one or more of input registers 502-1 through 502-P may optionally be bypassed such that output of one or more of input buffers 504-1 through 504-P is provided to core logic blocks 301-1 through 301-n as generally indicated by output signals 508-1 through 508-P provided thereto. Output of input registers 502-1 through 502-P may be provided as respective output signals 508-1 through 508-P to core logic blocks 301-1 through 301-n. Again, clock enable signals, though not illustratively shown, may be provided to input registers 502-1 through 502-P as generally input registers may be held in a clock-enabled state, and input registers 502-1 through 502-P may be clocked responsive to input clock signal 509. Input clock signal 509 may be an input clock signal of input clock signals 1 through m as described with reference to FIG. 3.

With reference to FIGS. 3 through 5, it should be appreciated that jitter may be caused by Simultaneous Switching of Outputs ("SSO") or Simultaneous Switching of Inputs ("SSI"), or any combination thereof. Thus, core logic blocks, which may be provided by CLBs in an FPGA implementation, may cause jitter responsive to switching by one or more register stages in response to one or more core clock signals. Moreover, I/O blocks may cause jitter owing to switching by one or more output registers or one or more input registers, or any combination thereof, respectively responsive to one or more output clock signals or one or more input clock signals. Furthermore, pass-through signals in proximity to either or both one or more core logic blocks or one or more I/O blocks may have jitter coupled to such signals passing through output buffers, and thus themselves may have jitter when used to drive devices external to an integrated circuit, which in this particular example is an FPGA. Again with reference to FIG. 3, it should be appreciated that reference clock signals on the right of portion 300 are provided off-chip with respect to an integrated circuit die, and clock signals and pass-through signals, which may be clock signals in this example, on the left of portion 300 of FIG. 3 are internal integrated circuit die signals.

With respect to a design instantiated in programmable logic or an ASIC, or any combination thereof, it may be that power distribution system ("PDS") response is a reasonably accurate predictor of jitter. In other words, PDS response may be used to predict jitter when viewing such PDS response with respect to system elements. Thus, for example, PDS response of a PCB, a die and package in combination, and decoupling capacitors associated therewith, as illustratively shown in FIG. 2A, may be used for predicting jitter. Furthermore, if a backplane is added to this configuration, PDS response of such backplane and any associated decoupling capacitance may be included in predicting jitter.

The amount of logic, as well as the frequency of switching of such logic, may be factors in predicting jitter. PDS response may change for changes in reference clock frequency versus core clock frequency or for changes in I/O clock frequency versus reference clock frequency. Accordingly, by changing clock frequencies of one or more of these clocks, different jitter may result. Thus, modeling may be used where frequency of one or more of these clock frequencies is changed in order to provide noise management with respect to jitter. Other factors which may affect jitter include temperature and supply of voltage, which may be thought of as scaling factors with respect to jitter. Furthermore, the amount of ground bounce, as well as semiconductor process variation, may affect jitter.

Figure 6:
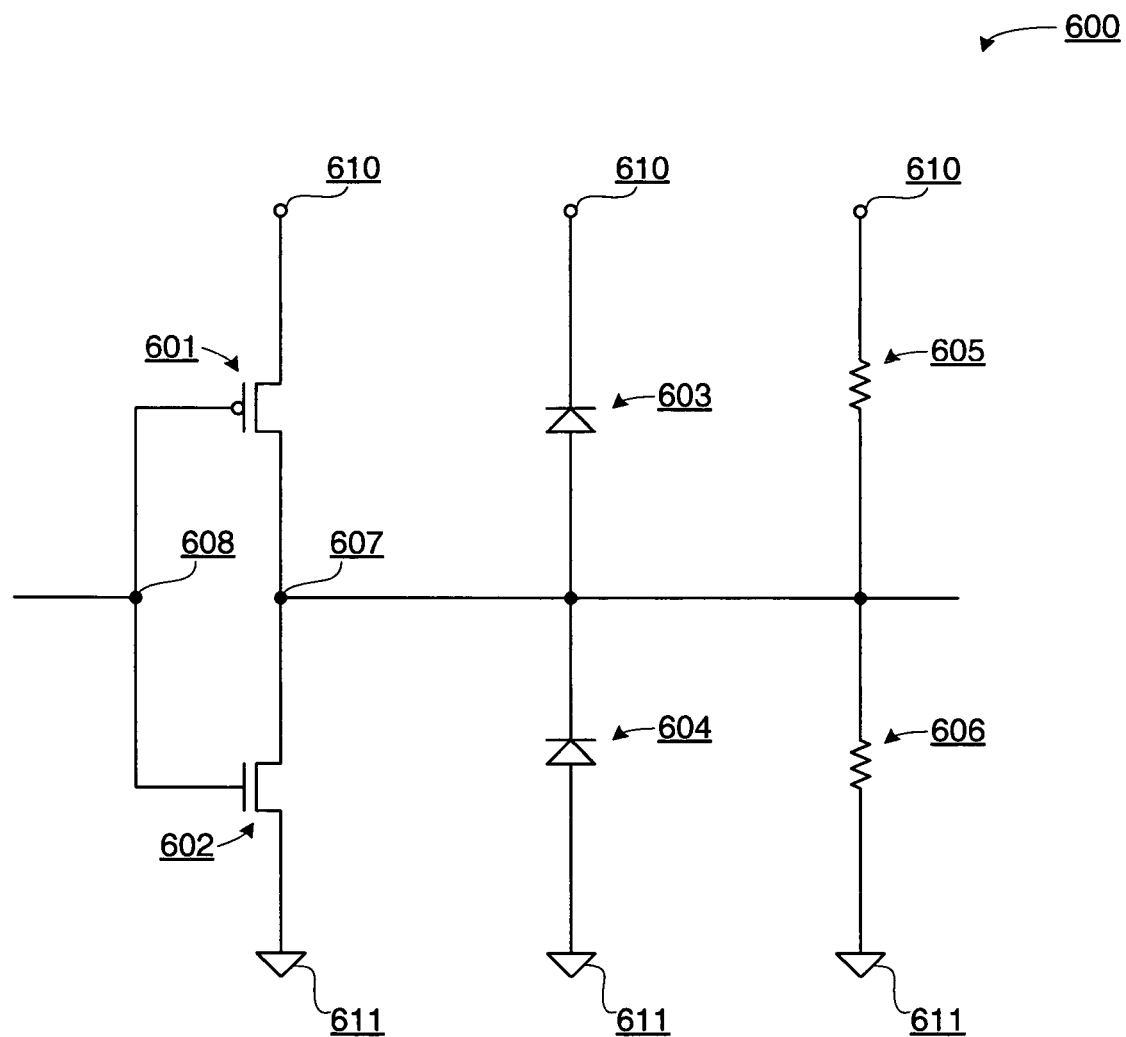
FIG. 6 is a schematic diagram depicting an exemplary embodiment of an output driver circuit.

FIG. 6 is a schematic diagram depicting an exemplary embodiment of an output driver circuit 600. Output driver circuit 600 includes an output driver formed of transistors 601 and 602 configured as an inverter. In other words, a gating voltage is applied via input node 608 to transistors 601 and 602, where a source region of PMOS transistor 601 is coupled to a supply voltage level, such as Vcc 610, and a source region of NMOS transistor 602 is coupled to ground, such as ground 611. Drain regions of transistors 601 and 602 are commonly coupled at an output node 607. Output node 607 is coupled to diodes 603 and 604, as well as resistors 605 and 606. More particularly, an input side of diode 603 is coupled to output node 607, and an output side of diode 603 is coupled to supply voltage 610. An input side of diode 604 is coupled to ground 611, and an output side of diode 604 is coupled to output node 607. Resistor 605 is coupled between supply voltage 610 and output node 607, and resistor 606 is coupled between ground 611 and output node 607.

Notably, for different output standards or protocols, drive strength and slew rate may vary. This variation may produce different levels of current, including crossbar current from an input node 608, commonly coupled to gates of transistors 601 and 602, to ground 611, for example, as a gate-to-source current through transistor 602. Another type of current level affected by changes in drive strength and slew rate is a diode-clamping current, such as from node 607 to ground 611, for example, in a reverse bias direction through diode 604. Lastly, another type of current affected by variation in drive strength and slew rate is a termination current, such as from node 607 to ground 611 via resistor 606.

Generally, resistors such as resistors 605 and 606 are of a substantially low resistance level; accordingly, termination current may be significantly high. However, generally crossbar current, such as from VCC 610 to ground 611 via transistors 601 and 602 for example, has to overcome a high impedance and thus generally may not be as large as termination current. Crossbar current may be more significant when voltage at node 608 changes logic state causing both of transistors 601 and 602 to generally simultaneously turn on (i.e., substantially conductive). Otherwise, gate-to-source current flow through transistor 602 when in a substantially non-conductive state is negligible. Moreover, a different voltage level or different duration of output undershoot/overshoot, or any combination thereof, may produce a different level of these three types of currents. Notably, crossbar current, diode-clamping current, and termination current all may be considered forms of currents which engender noise.

Figure 7:
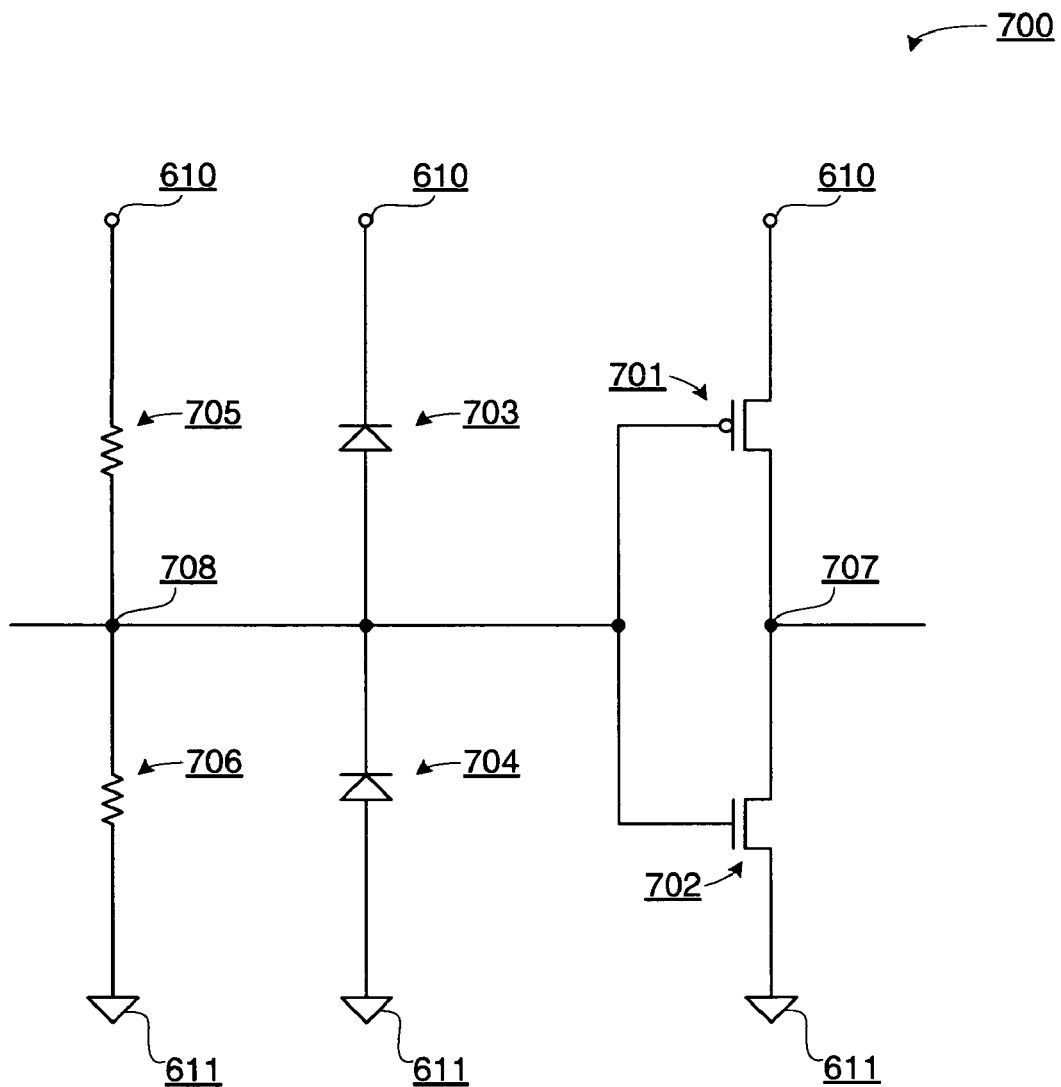
FIG. 7 is a schematic diagram depicting an exemplary embodiment of an input receiver circuit.

FIG. 7 is a schematic diagram depicting an exemplary embodiment of an input receiver circuit 700. Input receiver circuit 700 includes PMOS transistor 701 and NMOS transistor 702 coupled to provide an inverter. More particularly, input node 708 is coupled to gates of transistors 701 and 702, as well as to terminals of diodes 703 and 704 and to resistors 705 and 706. Resistor 705 is coupled between a supply voltage, such as supply voltage 610, and input node 708, and resistor 706 is coupled between input node 708 and ground, such as ground 611. An input side of diode 703 is coupled to input node 708 and an output side of diode 703 is coupled to a supply voltage, such as supply voltage 610. An input side of diode 704 is coupled to ground, such as ground 611, and an output side of diode 704 is coupled to input node 708. PMOS transistor 701 is sourced from a supply voltage, such as supply voltage 610, and has a drain region coupled to output node 707. NMOS transistor 702 has a source region coupled to ground 611 and a drain region coupled to output node 707. Again, it should be appreciated that termination current, diode-clamping current, and crossbar current may be associated with input receiver circuit 700. In particular, for example, termination current may be from input node 708 to ground 611 via resistor 706. As termination resistors, such as resistors 705 and 706, tend to have low resistances, such termination current may be significantly high. Diode-clamping current, such as from input node 708 through diode 704 as a reverse bias current to ground 611, is an example of diode-clamping current. Lastly, current from VCC 610 through transistors 701 and 702 to ground 611 is a form of crossbar current, which may result in a more significant amount when both of transistors 701 and 702 turn on due to a change in logic state at node 708

Termination current, diode-clamping current, and crossbar current may vary for different input protocols or standards, as these different protocols or standards may have different current levels. Moreover, a different voltage level for duration of input undershoot/overshoot may produce different levels of termination, diode-clamping, or crossbar current, or any combination of these currents. As termination current, diode-clamping current, and crossbar current are potential candidates for noise, noise management may take into account one or more of these currents.

Figure 8A:
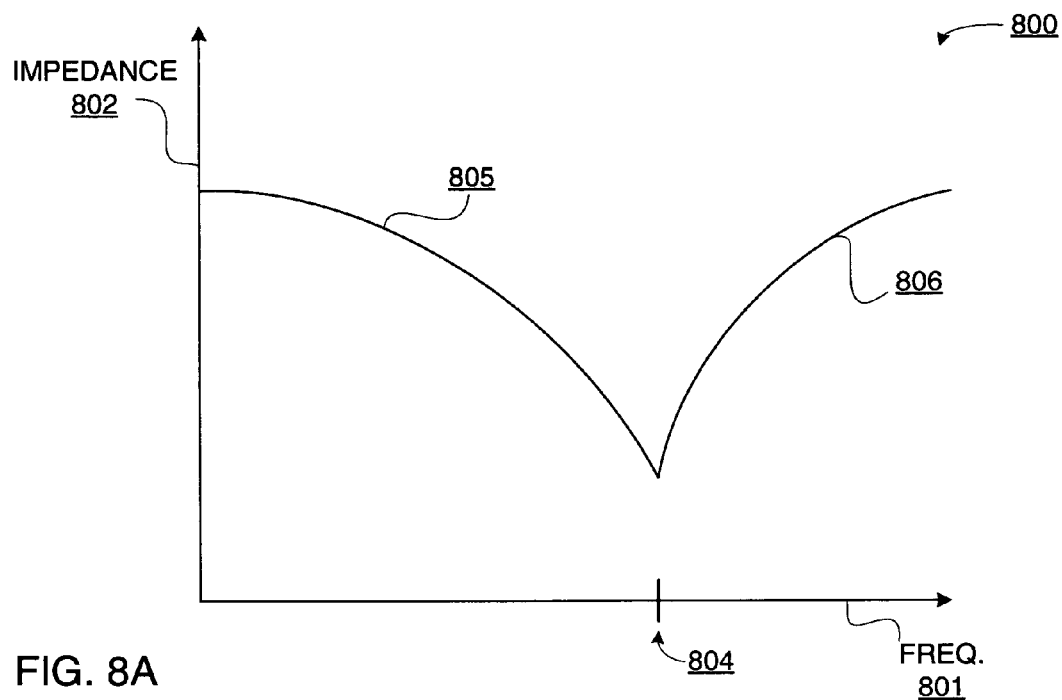
FIG. 8A is a graphical diagram depicting an exemplary embodiment of a characteristic capacitor curve.

FIG. 8A is a graphical diagram depicting an exemplary embodiment of a characteristic capacitor curve 800. Characteristic capacitor curve 800 is a frequency 801 versus impedance 802 graph. As generally indicated, on a left portion 805 of curve 800, a capacitor has a decrease in impedance as frequency approaches a resonant frequency 804. As is known, a capacitor operating in frequencies less than a resonant frequency 804 is generally more capacitive than inductive. However, at frequencies above resonant frequency 804, curve 800 has an upward or increasing slope, namely portion 806. In the region of operation for frequencies in excess of a resonant frequency 804, a capacitor is more inductive than capacitive.

Curve 800 may be generally provided for discrete capacitors. However, when a capacitor is mounted to a backplane or a PCB, impedance of such capacitor as part of such a mounted configuration may change. Thus, curve 800 may be shifted either horizontally or vertically, and slope of portions 805 and 806 may also change. Furthermore, even though a decoupling capacitor may be attached to a die, PCB, or backplane, there is another capacitance associated with the die, namely a "buried capacitance." This buried capacitance may accordingly be affected by the frequency of operation of the die. Moreover, the frequency of operation may be dependent upon whether a double data rate ("DDR") or a single data rate ("SDR"), or a combination thereof, is used.

Figure 8B:
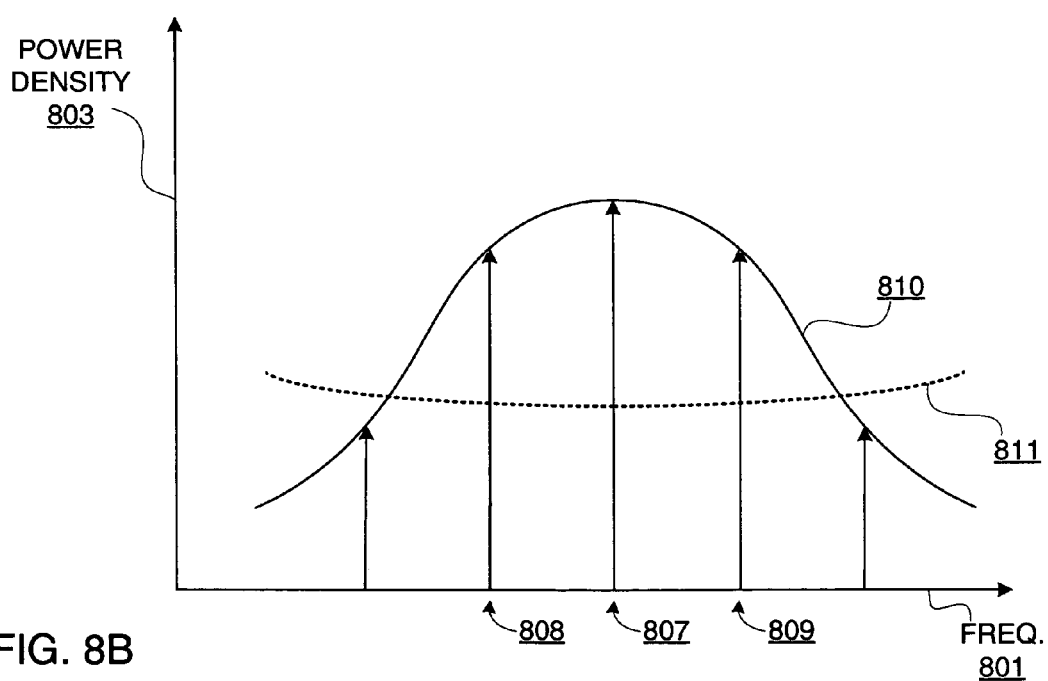
FIG. 8B is a graphical diagram depicting an exemplary embodiment of a power density curve.

FIG. 8B is a graphical diagram depicting an exemplary embodiment of a power density curve 810. Power density curve 810 may be associated with a Gaussian, trapezoidal, or some other known distribution. Power density curve 810 is a frequency 801 versus power density 803 graph. In particular, power density curve 810 is for noise. In order to reduce noise, a power density curve 811 may be developed for combination with power density curve 810, where power density curve 810 indicates a non-capacitive compensated system. Thus, power density curve 811 is where capacitors, such as discrete capacitors, have been added to reduce the noise profile of power density curve 810. For example, frequency 807 may be a frequency of operation of a die, and coincidentally may be the highest point of power density curve 810. Notably, power density may be located in discrete locations, such as a primary harmonic, such as frequency of operation 807, as well as other harmonics, such as secondary harmonics 808 and 809. Discrete capacitors may be selected to reduce power density of noise for particular harmonics, including the primary harmonic, which is generally the frequency of operation 807. These capacitors may be stacked as is known to provide a capacitor stack.

With reference to the curves of FIGS. 8A and 8B, parasitic capacitance associated with mounting capacitors to a PCB, backplane, or die may be taken into account. For example, via geometries, as well as network inductance, which may have an effect on characteristic capacitor curve 800, may be taken into account. Thus, as a goal, capacitance may be added or subtracted to shift a resonant frequency of an overall system capacitance to or at least in near proximity to the frequency of operation of a die in order to have a minimal impedance at or near the primary harmonic 807 of power density curve 810. Thus, power density curve 810 may be flattened to reduce the effect of noise on a system, namely to reduce the power density of such noise, within or at frequencies of interest. Moreover, noise associated with jitter, ground bounce, switching transients, power supply bounce, or electromagnetic interference ("EMI"), or any combination thereof, may be addressed, as described below with reference to modeling of parasitic capacitance for particular frequencies of interest.

Figure 8C:
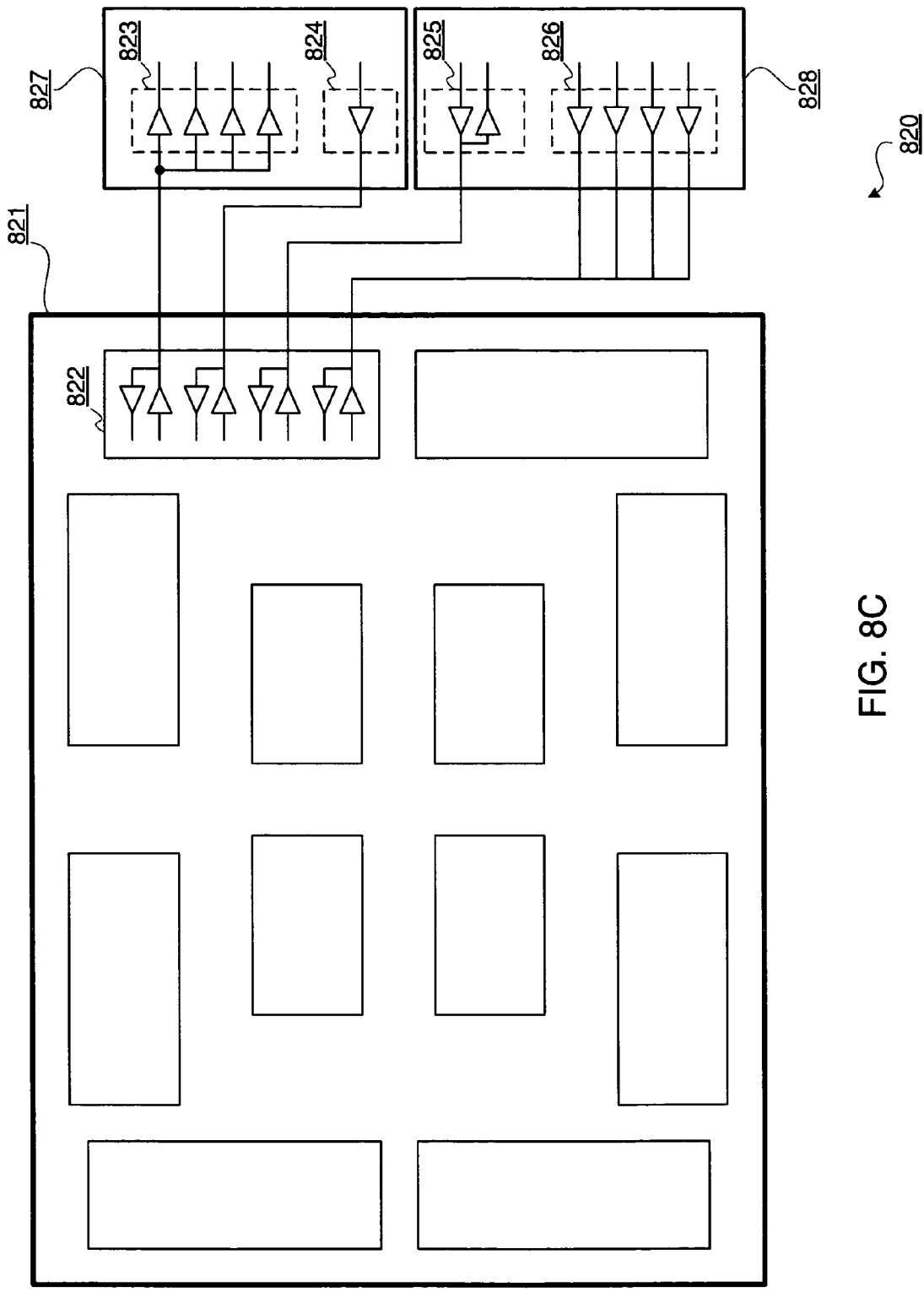
FIG. 8C is a block diagram depicting an exemplary embodiment of a system of integrated circuits.

FIG. 8C is a block diagram depicting an exemplary embodiment of a system of integrated circuits ("system") 820. System 820 may include ICs 821, 827, and 828. ICs 827 and 828 may be respectively coupled to IC 821 via I/O circuits 822. For example, an I/O circuit of I/O circuits 822 may be coupled to input buffers 823 of IC 827. Alternatively, input to input buffers 823 may be input to four separate ICs. Moreover, an I/O circuit of I/O circuits 822 may be coupled to an output buffer 824 of IC 827. Furthermore, an I/O circuit of I/O circuits 822 may be coupled to an I/O circuit 825 of IC 828. Notably, more than one bidirectional I/O circuit 825 may be coupled to the same line from/to IC 821. Additionally, an I/O circuit of I/O circuits 822 may be coupled to tri-state output, such as tri-stated output buffers 826 of IC 828. Alternatively, output from output buffers 826 may be output from four separate ICs. Thus, it should be appreciated that when ICs 821, 827, and 828 are coupled to one another, layout planning may be done responsive to noise management. This layout planning may take into account modeling noise for each of ICs 821, 827, and 828 located on a same PCB, and then from such modeling one may determine where to place ICs to reduce noise. Moreover, factors in addressing a reduction in noise may include which I/O circuits, such as of I/O circuits 822, to use and, more particularly, which banks of pins to use.

Figure 9:
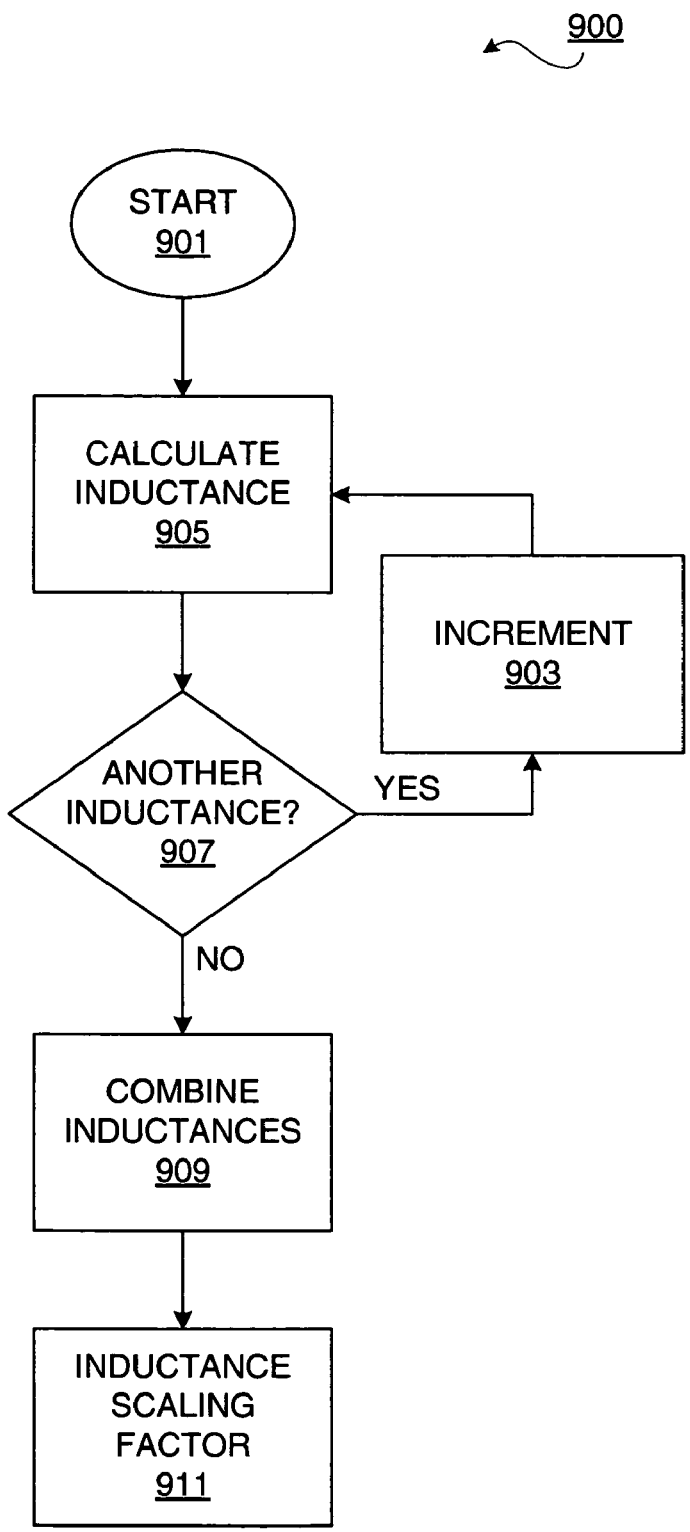
FIG. 9 is a flow diagram depicting an exemplary embodiment of an inductance scaling factor flow.

FIG. 9 is a flow diagram depicting an exemplary embodiment of an inductance scaling factor flow 900. Inductance scaling factor flow 900 is to calculate different types of inductances for combination thereof. Moreover, inductance scaling factor flow 900 may be done for each bank of pins of an IC. Inductance scaling factor flow 900 is initiated at 901. This initiation may include obtaining a first inductance to be calculated. Although ground bounce is fundamentally determined by the equation for voltage induced by inductance as current changes over time, namely V=Ldi/dt in its simplest form, there are many factors and parameters that affect L and di/dt. Many of these parameters are accounted for in the calculation and prediction of ground bounce and supply voltage bounce. Notably, additional details regarding WASSO may be found in a co-pending patent application entitled "Method for Calculating Weighted Average Ground Bounce Noise Generated By Simultaneous Switching Outputs in a Digital System," by Anthony T. Duong, assigned application Ser. No. 10/691,151, filed on Oct. 21, 2003, which is incorporated by reference herein in its entirety.

At 905, a first inductance is calculated. At 907, it is determined whether another inductance is to be calculated. If another inductance is to be calculated, then at 903, an inductance set number value is incremented, and at 905, the next or incremented inductance is calculated. Accordingly, each inductance of a set of inductances may be calculated. Inductance scaling factor flow 900 repeats this cycle until all inductances have been calculated. If no other inductance is to be calculated as determined at 907, then at 909 inductances calculated at 905 are combined. Notably, this combination may add or subtract inductances from one another. Types of inductances which add generally tend to be self-inductances. Types of inductances which tend to be subtracted generally tend to be mutual inductances. Combined inductance as determined at 909 may be used as a divisor to a manufacturer's specified inductance. Inductance as specified by a manufacturer may be obtained for a PCB, a backplane, and one or more discrete capacitors from the respective manufacturer. Accordingly, an inductance scaling factor may be determined at 911, where the manufacturer's specified inductance is divided by the combined inductance obtained at 909 to produce such an inductance scaling factor. Thus, an inductance scaling factor may be determined for each bank on a bank-by-bank basis.

Figure 10:
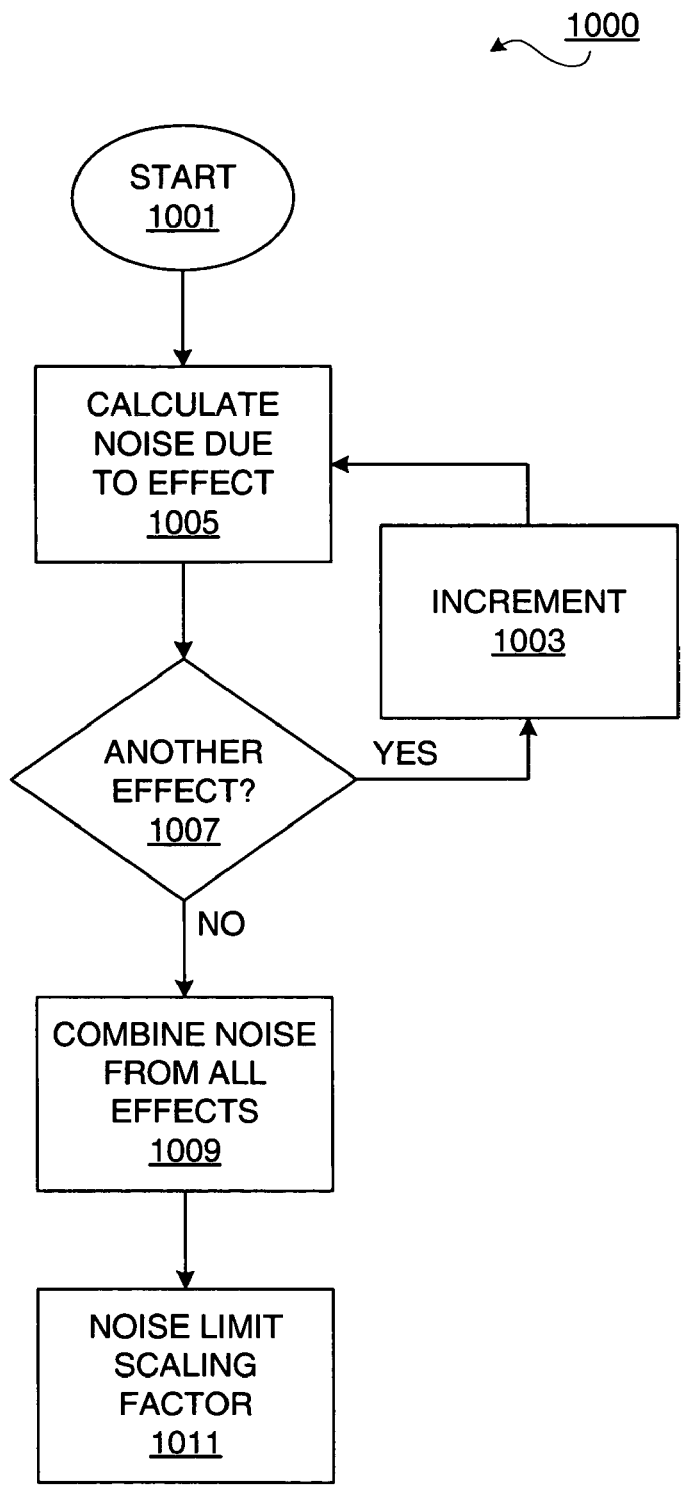
FIG. 10 is a flow diagram depicting an exemplary embodiment of a noise limit scaling factor flow.

FIG. 10 is a flow diagram depicting an exemplary embodiment of a noise limit scaling factor flow 1000. Noise limit scaling factor flow 1000 is to calculate different types of noise, other than noise due to voltage bounce, for combination thereof to determine a noise limit scaling factor. Generally, noise limit scaling factor flow 1000 is for determining actual noise caused by input/output undershoot/overshoot, phase shifting input/output, and virtual power/ground pins, among other causes, or any combination thereof, excluding noise associated with SSI and SSO. Moreover, noise limit scaling factor flow 1000 may be done for each bank of pins of an IC. Noise limit scaling factor flow 1000 is initiated at 1001. At 1001, an initial set number value for an effect on noise to be calculated may be initialized. At 1005, noise due to an initial effect may be calculated. At 1007, it may be determined whether noise due to another effect is to be calculated. If noise due to another effect is to be calculated, then at 1003, the set number value for a set of effects is incremented and consequently, at 1005, noise due to the additional effect is calculated. Noise limit scaling factor flow 1000 repeats this cycle until all noise due to each effect has been calculated. Once it is determined at 1007 that no additional effects exist such that additional amounts of noise are to be calculated, at 1009 all noise may be combined from calculations performed at 1005. Notably, some noise associated with input switching will add to other noises. These additive noises generally make ground bounce and supply bounce worse. Some effects, such as virtual power and virtual ground, will subtract from other noises, and these effects help reduce supply bounce and ground bounce. Combined noise from all calculations performed at 1005 is output from 1009 for providing a noise limit scaling factor at 1011. This noise limit scaling factor may be determined at 1011. The combined noise obtained at 1009 may first be subtracted from a user's input worst case noise limit. The difference between the worst case noise limit as defined by a user and the combined noise obtained at 1009 may then be divided by the manufacturer's assumed noise limit to provide a noise limit scaling factor at 1011. The manufacturer's assumed noise limit may come from a design, simulation, or characterization of an actual IC, or a combination of one or more of these. A user's defined noise limit may come from an input device, such as being driven by an FPGA, specification for logic threshold levels. Thus, a noise limit scaling factor may be determined for each bank on a bank-by-bank basis.

Figure 11:
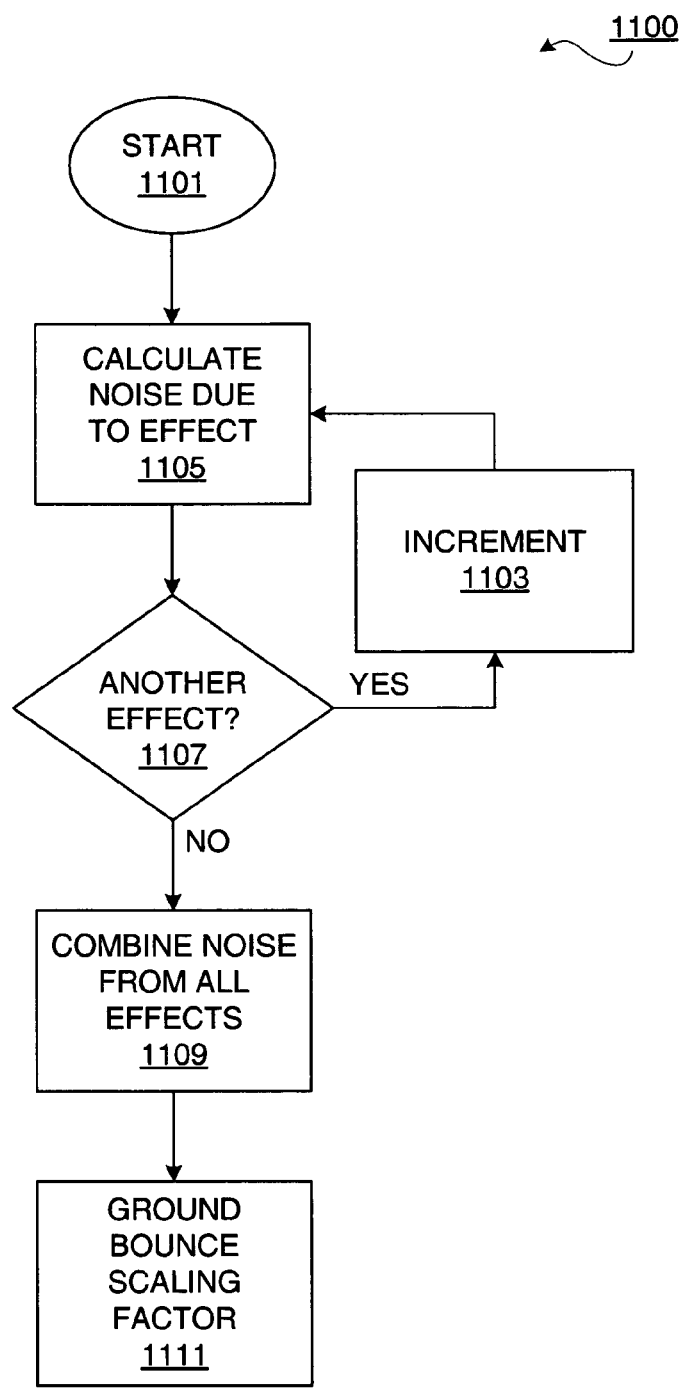
FIG. 11 is a flow diagram depicting an exemplary embodiment of a ground bounce scaling factor flow.

FIG. 11 is a flow diagram depicting an exemplary embodiment of a ground bounce scaling factor flow 1100. Ground bounce scaling factor flow 1100 is to calculate different types of voltage bounce for combination thereof. Thus, supply bounce may be part of determining a ground bounce scaling factor. Moreover, ground bounce scaling factor flow 1000 may be done for each bank of pins of an IC. Ground bounce scaling factor flow 1100 is initiated at 1101, where an initial set number for an effect on noise associated with ground bounce may be initialized. At 1105, noise due to this initial effect is calculated. At 1107, it is determined whether there is another effect on noise with respect to ground bounce. If there is another such ground bounce effect on noise, the set number value for a set of effects is incremented at 1103, and noise due to a next ground bounce effect is calculated at 1105. Ground bounce scaling factor flow 1100 repeats this cycle until all noise due to each effect is calculated. Once it is determined at 1107 that there are no additional effects due to ground bounce, then at 1109, noise from all such effects as calculated at 1105 is combined. Notably, some noise effects will add and some noise effects will subtract. Noise effects associated with ground bounce that are additive generally are caused by output capacitive loading, and noise effects associated with ground bounce that are subtractive generally are due to output phase shifting. Notably, noise effects as calculated at 1105 for ground bounce may not be the same set of noise effects calculated at 1005 of FIG. 10 for a noise limit scaling factor. However, when a same set of noise effects for ground bounce and noise effects for noise scaling are used, output from 1009 of FIG. 10 may be used as input to ground bounce scaling factor determination 1111 of FIG. 11 to reduce the amount of steps for determining both noise and ground bounce scaling factors.

At 1111, a manufacturer's expected ground bounce, generally indicated as a voltage or bounce voltage, is divided by the quantity of the manufacturer's expected ground bounce plus additional ground bounce due to noise from all effects as calculated at 1105 and combined at 1109. The result of this ratio is a ground bounce scaling factor at 1111. Thus, a ground bounce scaling factor may be determined for each bank on a bank-by-bank basis.

Figure 12:
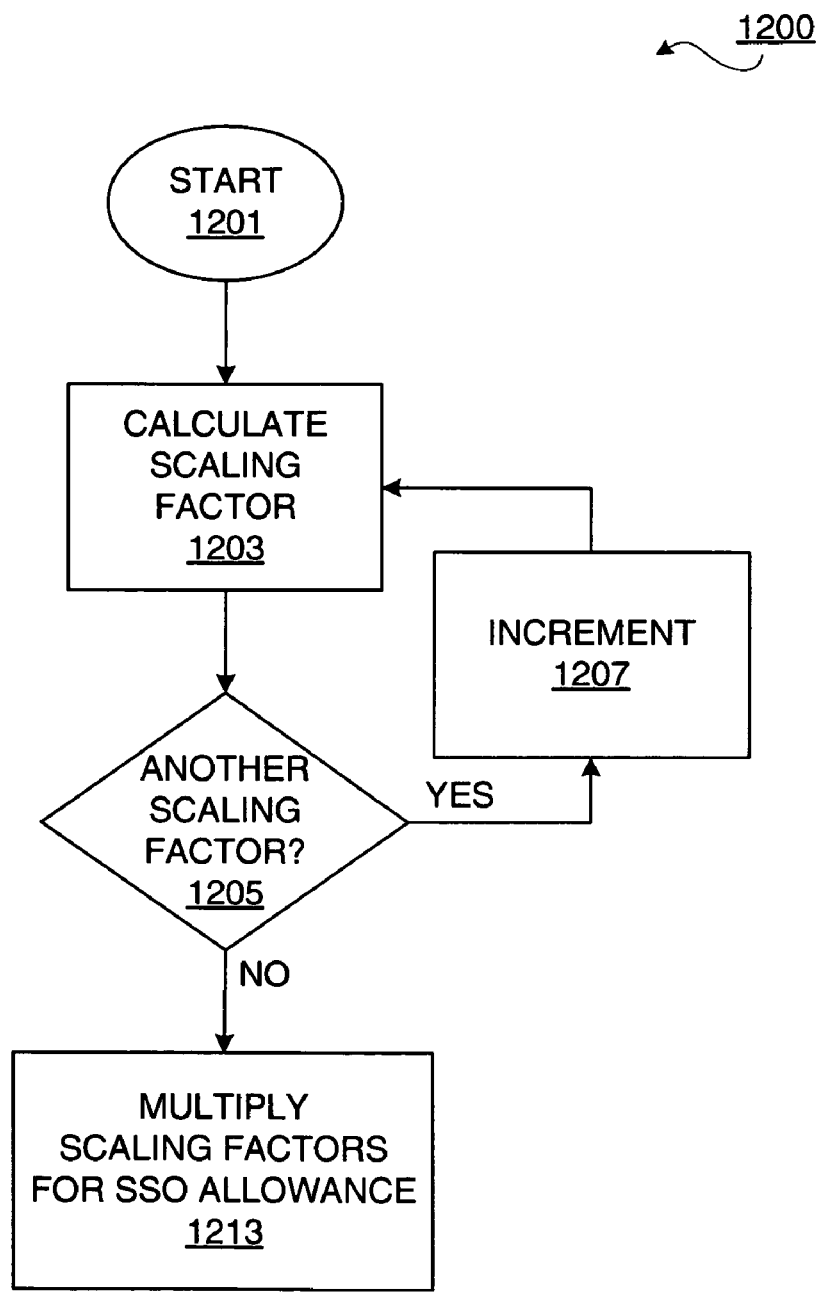
FIG. 12 is a flow chart depicting an exemplary embodiment of a Simultaneous Switching of Outputs ("SSO") Allowance calculation flow.

FIG. 12 is a flow chart depicting an exemplary embodiment of an SSO Allowance calculation flow 1200. The SSO Allowance is used either to obtain a scaled SSO guideline by multiplying the SSO guideline by the SSO Allowance or to evaluate a weighted average SSO ("WASSO") for adjacent I/O banks of a digital switching device. A set number value for a first scaling factor, as well as other parameters, may be initialized at 1201 for SSO Allowance calculation flow 1200. A first scaling factor is calculated at 1203 from an assumed parameter value used to generate an SSO guideline and an expected parameter value of a digital system. The first scaling factor accounts for one or more effects of board parasitics, IC socket parasitics, load capacitance, output fan-out, or other design-related effect(s) not accounted for in the SSO guideline. For example, the first scaling factor may be calculated by dividing an assumed printed wire board ("PWB") inductance by an expected PWB inductance.

At 1205, it is determined whether there is another scaling factor to be used to calculate the SSO Allowance. If only a single scaling factor is used, that scaling factor is the SSO Allowance. If another scaling factor is used to calculate the SSO Allowance as determined at 1205, then the set number value for scaling factors is incremented at 1207. A next scaling factor is then calculated at 1203 from a next assumed parameter value used to generate the SSO guideline and a next expected parameter value of the digital system. For example, the next scaling factor is calculated by dividing the lesser of an expected input undershoot voltage and an input logic low threshold by the ground bounce voltage assumed to generate the SSO guideline. An example of another scaling factor may be calculated by dividing the assumed maximum ground bounce voltage for an assumed load capacitance by the expected voltage generated by an expected load capacitance. SSO Allowance calculation flow 1200 repeats this cycle until all scaling factors have been calculated. After all scaling factors have been calculated at 1203 as determined at 1205, then at 1213 SSO Allowance is calculated by multiplying the scaling factors together. The order in which the scaling factors are calculated does not matter. Notably, the SSO Allowance determined at 1213 for a WASSO value is for one bank ("1-Bank") SSO value as distinguishable from an SSO Allowance for a combination of banks, such as a two bank ("2-Bank") SSO value. Calculation of three scaling factors that may be used for SSO Allowance calculation flow 1200 were described with reference to FIGS. 9 through 11, though a subset of all three of these scaling factors may be used. Thus, SSO Allowance is done for each bank on a bank-by-bank basis.

Figure 13:
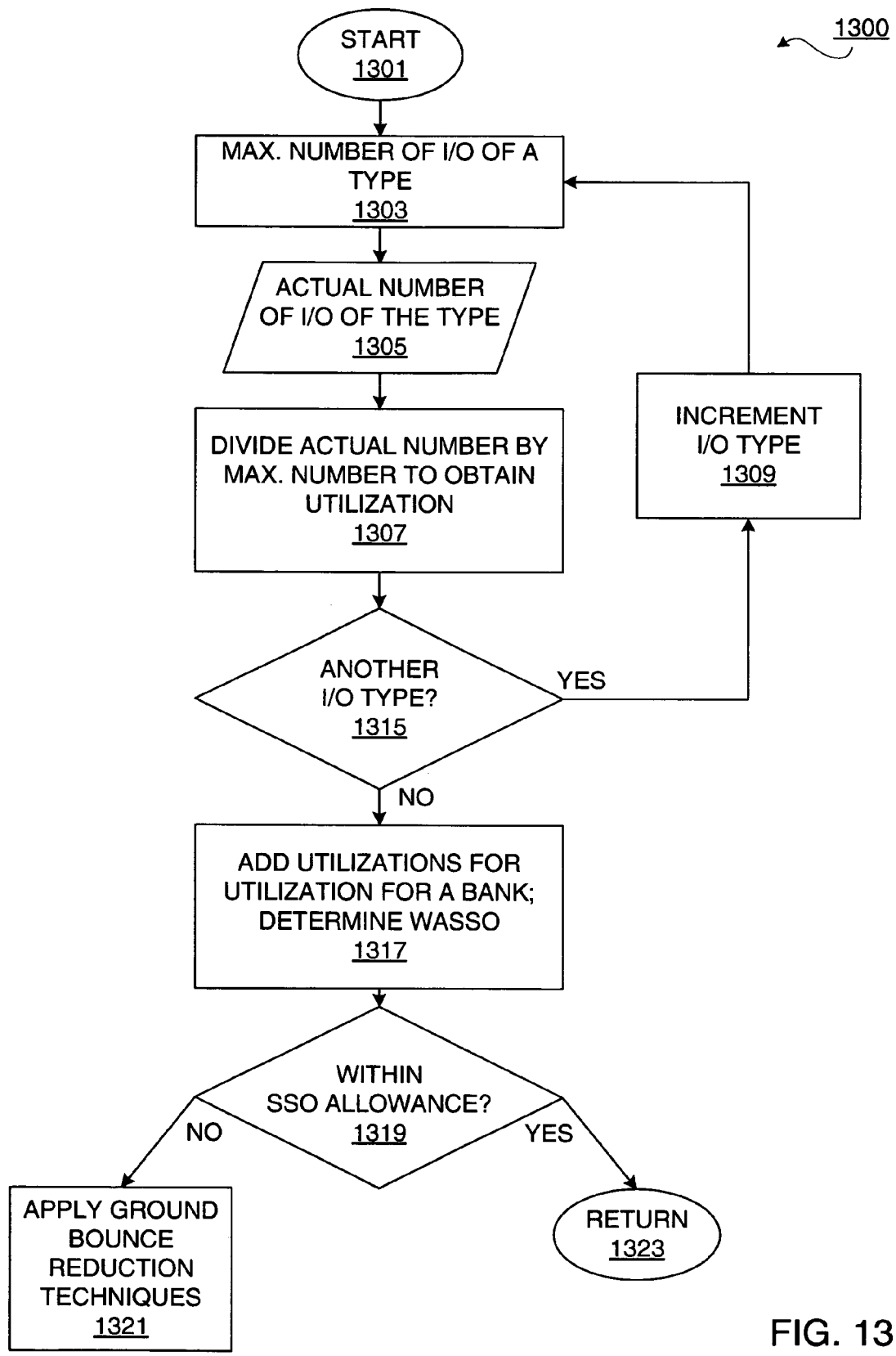
FIG. 13 is a flow diagram depicting an exemplary embodiment of a Weighted Average Simultaneous Switching of Outputs ("WASSO") calculation flow.

FIG. 13 is a flow diagram depicting an exemplary embodiment of a WASSO calculation flow 1300. Notably, WASSO calculation flow 1300 is for one bank of banks of an IC, and thus may be repeated for each bank of an IC to obtain an I/O utilization for each bank of pins of an IC. However, within a grouping or block of I/Os of a bank, there may be different types of interfaces, such as HSTL and SSTL, among others, implemented. At 1301, a maximum number for a type of I/O is initialized. An actual number of the I/O type used 1305 for a proposed implementation is divided at 1307 by the maximum number obtained at 1305 to provide a utilization for that I/O type. Notably, it should be appreciated that utilization of an I/O type may be used to provide a WASSO for a bank.

If at 1315 it is determined that another type of I/O of the bank is to be processed, then at 1309 I/O type is incremented and 1303 through 1307 are repeated for another I/O type. This is done until all types of I/Os have been processed as determined at 1315. If no more I/Os for a bank are to be processed as determined at 1315, the utilizations for each I/O type as determined at 1307 are added at 1317.

The total utilization determined at 1317 may be used as a WASSO value for a bank. At 1319 it is determined whether an SSO Allowance for the bank, such as determined at 1213 of FIG. 12, has been exceeded. If the WASSO value exceeds the SSO Allowance for the bank, then at 1321 ground bounce reduction techniques may be applied. Notably, the SSO Allowance value may be scaled, and thus 100% or more or less than 100% of the determined SSO Allowance of 1213 of FIG. 12 may be used as the threshold SSO Allowance value for 1319. An example of a ground bounce reduction technique may be to reduce the number of I/O drivers used.

Determining a WASSO for I/Os of a bank to be used allows a circuit designer to evaluate ground bounce performance of a bank by homogenizing the various loads driven by the I/Os of bank. Notably, for purposes of clarity, WASSO has been described with reference to FIG. 13. However, a weighted average SSI ("WASSI") equally applies with respect to use of I/Os of a bank used for input of information to an IC die. Thus, WASSO calculation flow 1300 may include WASSI with respect to determining utilization of I/O devices of a bank, and whether I/O simultaneous switching exceeds a threshold amount of simultaneous switching.

Figure 14:
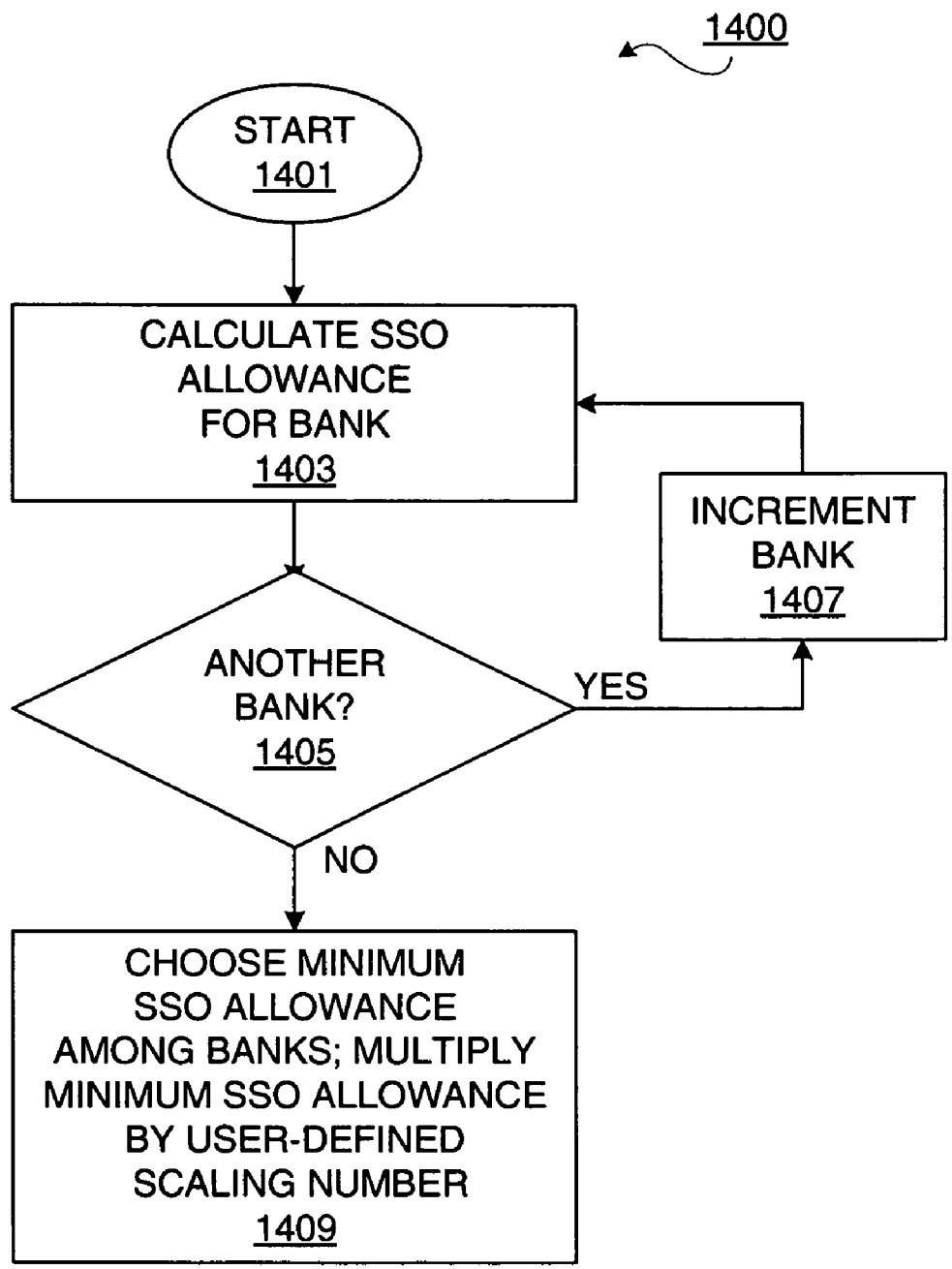
FIG. 14 is a flow diagram depicting an exemplary embodiment of a 2-Bank SSO Allowance flow.

FIG. 14 is a flow diagram depicting an exemplary embodiment of a 2-Bank SSO Allowance flow 1400. SSO Allowance flow 1400 is initiated at 1401, where an initial bank is obtained. At 1403, the SSO Allowance for an initial bank is calculated. Notably, this SSO Allowance is a 1-Bank SSO Allowance, as was determined at 1213 of FIG. 12. At 1405, it is determined if another bank is to have its SSO Allowance calculated. If there is another bank for which to calculate the SSO Allowance, then at 1407 bank is incremented, and at 1403, the SSO Allowance for the next or incremented bank is calculated. If no other bank is to have its SSO Allowance calculated as determined at 1405, then at 1409 a minimum SSO Allowance among all SSO Allowances calculated for each of the banks is selected. This minimum SSO Allowance is then multiplied by an SSO scaling number, which may be a user-defined SSO scaling number at 1409. Optionally, the bank need not be a single bank, but may be a combination of more than one bank, such as a middle-top or middle-bottom combination of banks for an FPGA implementation. The result of 1409 is a 2-Bank SSO Allowance.

Notably, SSO utilization may vary depending on the pin assignment configuration. There are different power and ground ratios for signal pins depending on the type of pin-out package. One example of a pin-out package available for Xilinx FPGAs is known as a "Sparse Chevron" package. This type of package has less bank-to-bank or bank-to-more than one bank noise distribution owing to SSO for example. Thus, for example, in a non-Sparse Chevron package, noise may travel in a significant quantity horizontally, vertically, or diagonally from one end of the die to an opposing end. In contrast, a Sparse Chevron package may only experience significant noise dispersion with respect to adjacent banks and, more particularly, only to vertically or horizontally adjacent banks. For purposes of clarity, it shall be assumed that a Sparse Chevron FPGA package is used, although it will be apparent from the following description that other pin-out packages may be implemented.

For a Sparse Chevron pin-out, mutual inductance between power and ground pins is calculated and subtracted out from self-inductance. Reduction in ground bounce due to mutual inductance may result from this configuration, and thus the effect of mutual inductance may be taken into account as described below.

Figure 15A:
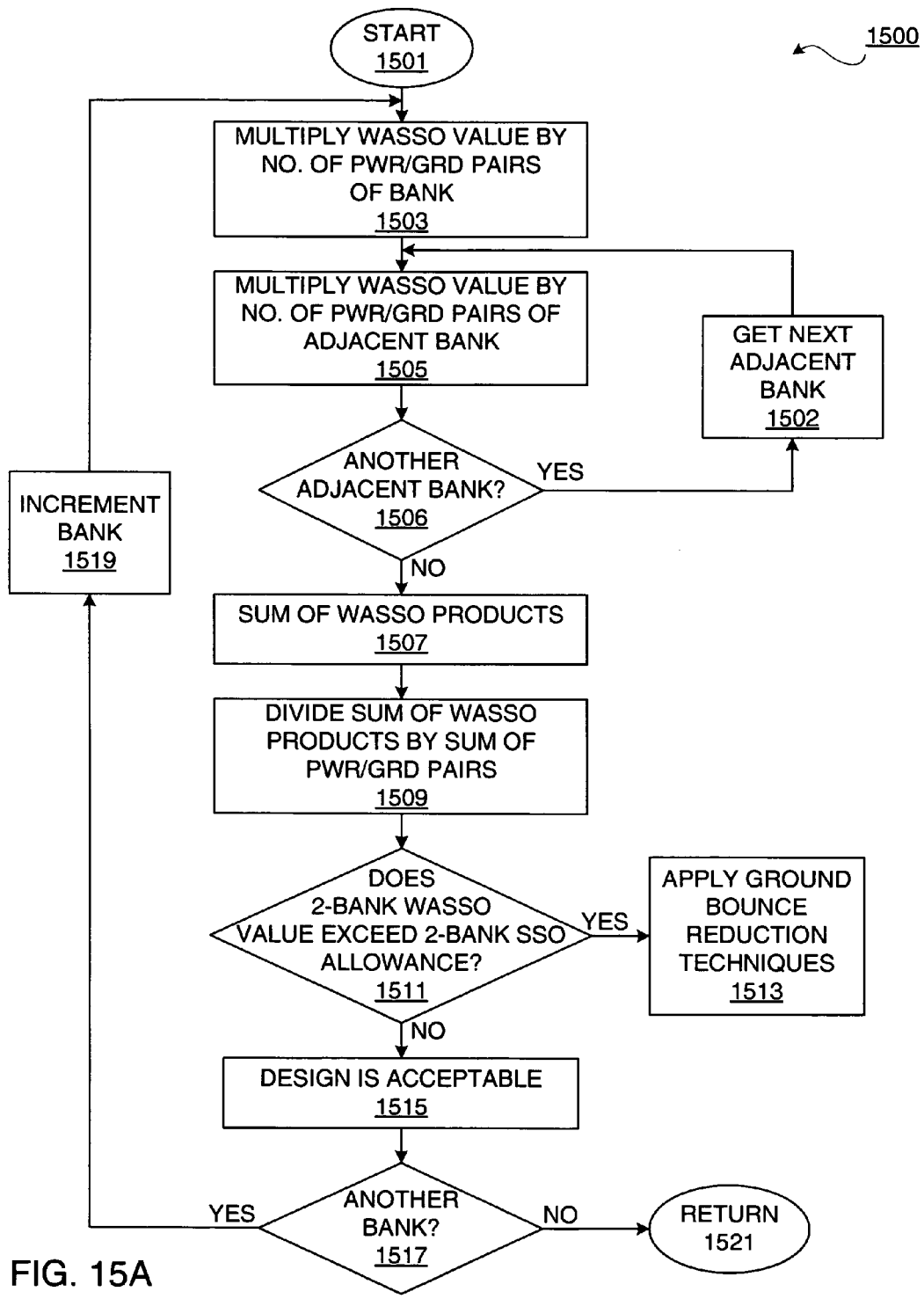
FIG. 15A is a flow diagram depicting an exemplary embodiment of a 2-Bank WASSO utilization flow for evaluating ground bounce voltage for adjacent banks.

FIG. 15A is a flow diagram depicting an exemplary embodiment of a 2-Bank WASSO utilization flow 1500 for evaluating ground bounce voltage for adjacent banks. Notably, by adjacent banks, it is meant horizontally or vertically adjacent along an edge of the banks of an IC die. WASSO utilization flow 1500 is initiated at 1501 where an initial bank may be set; the initial bank having I/O, or at least output drivers, as associated with SSO. At 1503, a previously determined WASSO value for the bank, as described above, is obtained and multiplied by the number of power/ground pairs of the bank. At 1505, the WASSO value used at 1503 may be multiplied by the number of power/ground pairs of an adjacent bank to the bank, where the adjacent bank has I/O devices as associate with SSO. At 1506, it may be determined whether there is another adjacent bank to the initial bank obtained at 1503. If there is another adjacent bank having I/O devices associated with SSO as determined at 1506, then the next adjacent bank is obtained at 1502. Accordingly, and the WASSO value used at 1503 is multiplied by the number of power/ground pairs in the next adjacent bank at 1505. This loop may repeat until each adjacent bank to the initial bank is processed. Once no other adjacent bank is to be processed as determined at 1506, then at 1507 WASSO products of the bank and of adjacent banks thereto as determined at 1503 and 1505, respectively, are summed. At 1509, the sum obtained at 1507 is divided by the sum of all power/ground pairs in each of the adjacent banks obtained. The result of 1509 is a 2-Bank WASSO value.

With simultaneous reference to FIGS. 14 and 15A, at 1511, it is determined whether the 2-bank WASSO value exceeds the 2-bank SSO Allowance. Recall that the 2-Bank SSO Allowance may be determined as described with reference to 1409. Notably, no user-defined scaling factor need be input, and a default scaling value of one may be used. If the result of 1509 exceeds the 2-Bank SSO Allowance as determined at 1409, then at 1513, one or more ground bounce reduction techniques may be applied. After application of these one or more ground bounce reduction techniques at 1513, WASSO utilization flow 1500 may be reinitiated at 1501 for the same bank. If, however, at 1511 it is determined that the 2-Bank WASSO value does not exceed the 2-Bank SSO Allowance as determined at 1409, then an indication that the design is acceptable for that bank may be produced at 1515.

At 1517, it may be determined whether another 2-Bank WASSO value is to be determined for another bank to determine whether the WASSO value exceeds the SSO Allowance for such other bank. If another bank is to be processed as determined at 1517, then at 1519 the bank may be incremented and WASSO utilization flow 1500 may proceed again at 1503 but for the other bank. Accordingly, WASSO utilization flow 1500 may be repeated for each bank, and once it is determined that there are no other banks to process as determined at 1517, then WASSO utilization flow 1500 may return at 1521.

It should be appreciated that because a pin-out package, such as a Sparse Chevron package or other noise reduction package, may have bank-localized SSO noise, SSO Allowance may be determined on a bank-by-bank basis rather than an overall package SSO Allowance. This adds degrees of freedom with respect to having different SSO Allowances for different banks. Thus, for certain types of packages, as long as the respective SSO Allowance is met for each bank, an overall package SSO Allowance need not be determined. This individual bank SSO Allowance may thus take into account parasitic SSO noise owing to one or more adjacent banks, as described with reference to WASSO utilization flow 1500 of FIG. 15A. However, one may determine an overall package WASSO utilization for any type of package.

Figure 15B:
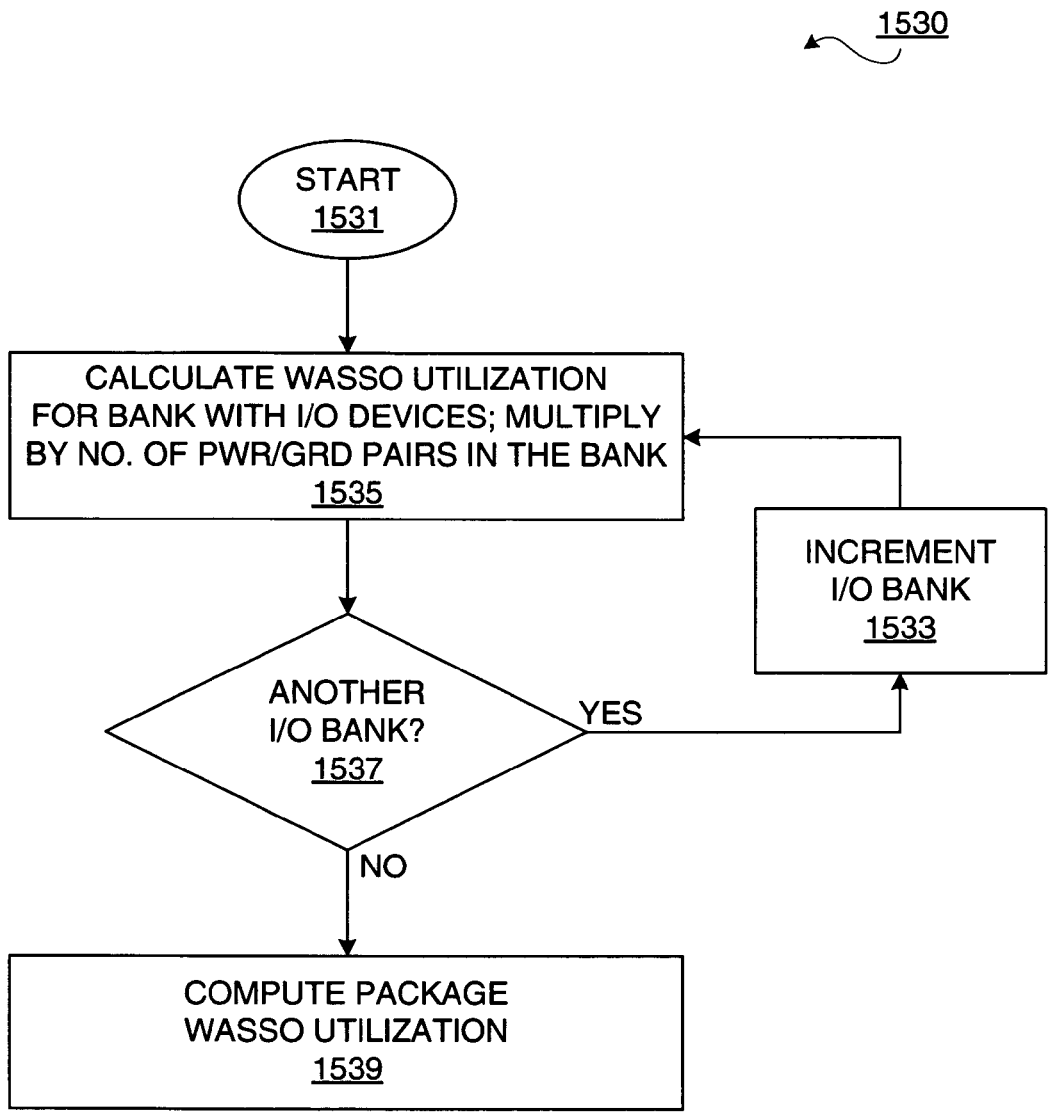
FIG. 15B is a flow diagram depicting an exemplary embodiment of a package WASSO utilization flow.

FIG. 15B is a flow diagram depicting an exemplary embodiment of a package WASSO utilization flow 1530. Package WASSO utilization flow 1530 is initiated at 1531 by obtaining an initial bank having I/O devices associated with SSO. At 1535, WASSO utilization for the initial bank may be calculated. This WASSO utilization may be calculated as described with reference to FIG. 15A. The WASSO utilization may be multiplied by the number of power/ground pairs in the initial bank as part of 1535. At 1537, it may be determined whether there is another bank to process. If there is another bank to process, at 1533 the bank is incremented and a next or incremented bank is processed at 1535. Once all banks have had a WASSO utilization calculated therefor, a package WASSO utilization may be computed at 1539. Package WASSO utilization may be determined by taking the sum of each WASSO utilization multiplied by the power/ground pairs of a bank, namely the sum of all results of 1535, and dividing it by the total number of power/ground pairs for each of the banks processed using package WASSO utilization flow 1530. This determination of package WASSO utilization is illustratively shown in Equation 1:

$$\frac{\sum [(WASSO\ UTIL.)(NO.PWR/GRD\ PAIRS)]}{\sum (NO.PWR/GRD\ PAIRS)} \quad (1)$$

Figure 16A:
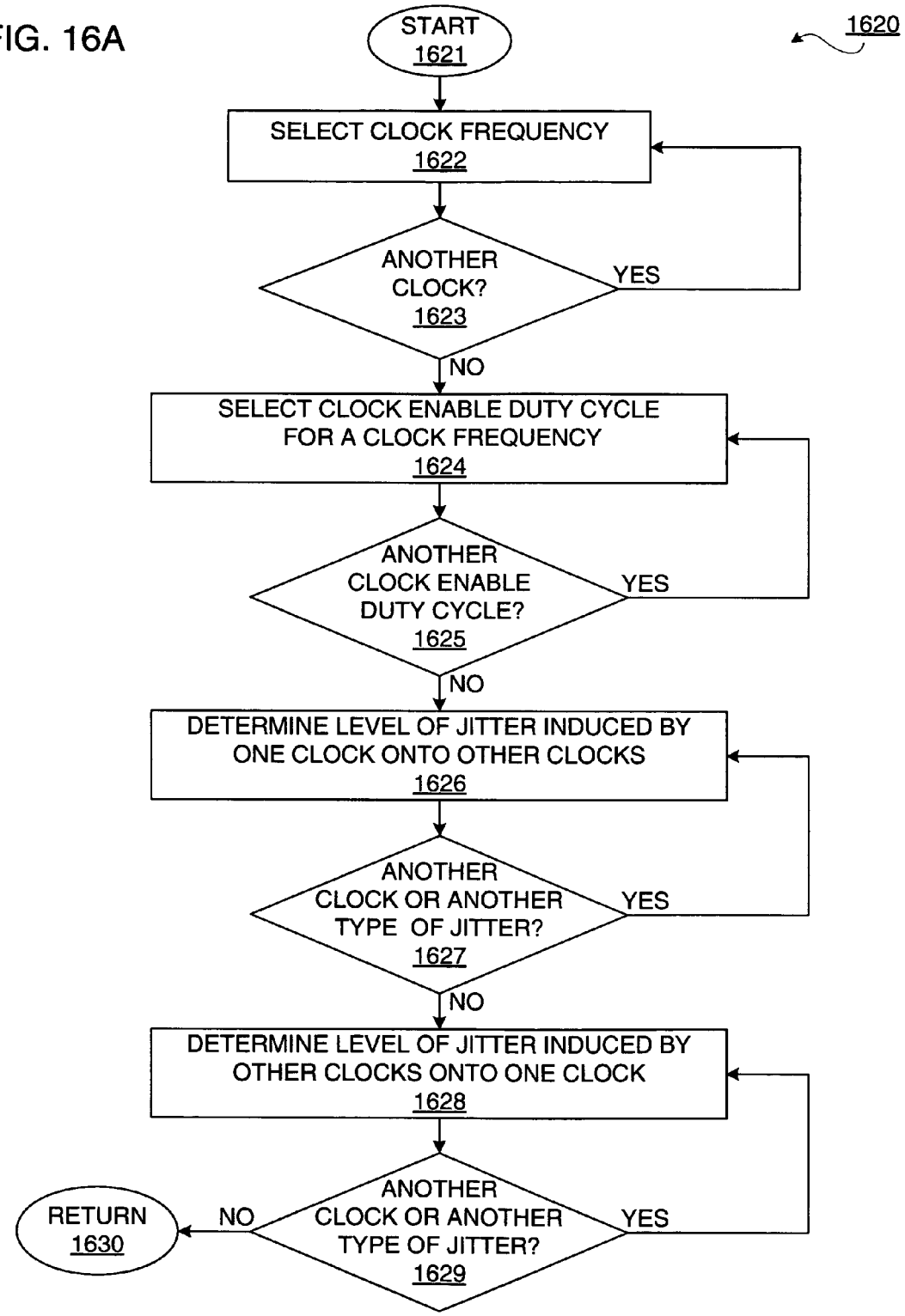
FIG. 16A is a flow diagram depicting an exemplary embodiment of a clock planner flow.

FIG. 16A is a flow diagram depicting an exemplary embodiment of a clock planner flow 1620. Clock planner flow 1620 is initialized at 1621. At 1622, a clock frequency of operation is selected. At 1623, it is determined whether there is another clock signal ("clock") to be selected. If there is another clock signal to be selected, a frequency for such other clock signal is selected at 1622, and this loop repeats until each clock signal to be implemented has a frequency selected therefor. After all clock signal frequencies have been selected, from 1623 clock planner flow 1620 moves to 1624.

At 1624, a clock enable duty cycle for an operating clock signal is selected. At 1625, it is determined whether another clock enable duty cycle is to be selected. If another clock enable duty cycle is to be selected, clock planner flow 1620 returns to 1624. Accordingly, this loop repeats for each clock signal selected above. Once all clock enable duty cycles for each operating clock signal have been selected, clock planner flow 1620 proceeds from 1625 to 1626. Notably, one, instead of two, loops may be implemented for each clock signal.

At 1626, the level of jitter induced by circuits operating under one clock signal onto another clock signal or signals is determined. At 1627, it is determined whether there is another clock signal or another type of jitter to be processed. If there is another clock signal, for example, to be processed, then at 1626 the level of jitter induced by that other clock signal is determined with respect to each of the other clock signals selected above. Thus, each type of jitter induced by each clock signal onto each one or more of the other clock signals may be determined by this loop.

Once all induced jitter has been determined at 1626 for each of the clock signals and for each type of jitter involved, then at 1628 the level of jitter induced by other clock signals onto the one clock signal is determined. At 1629, it is determined whether there is another clock or another type of jitter to be processed. If there is another clock or another type of jitter to be processed, 1628 is repeated for either the other clock or the other type of jitter, or both. Accordingly, this loop repeats until the level of jitter induced by each other clock onto each clock of the set of clocks selected above is determined for each type of jitter involved. Once there are no other clocks or other types of jitter as determined at 1629, clock planner flow 1620 may return at 1630.

Figures 1, 16B:
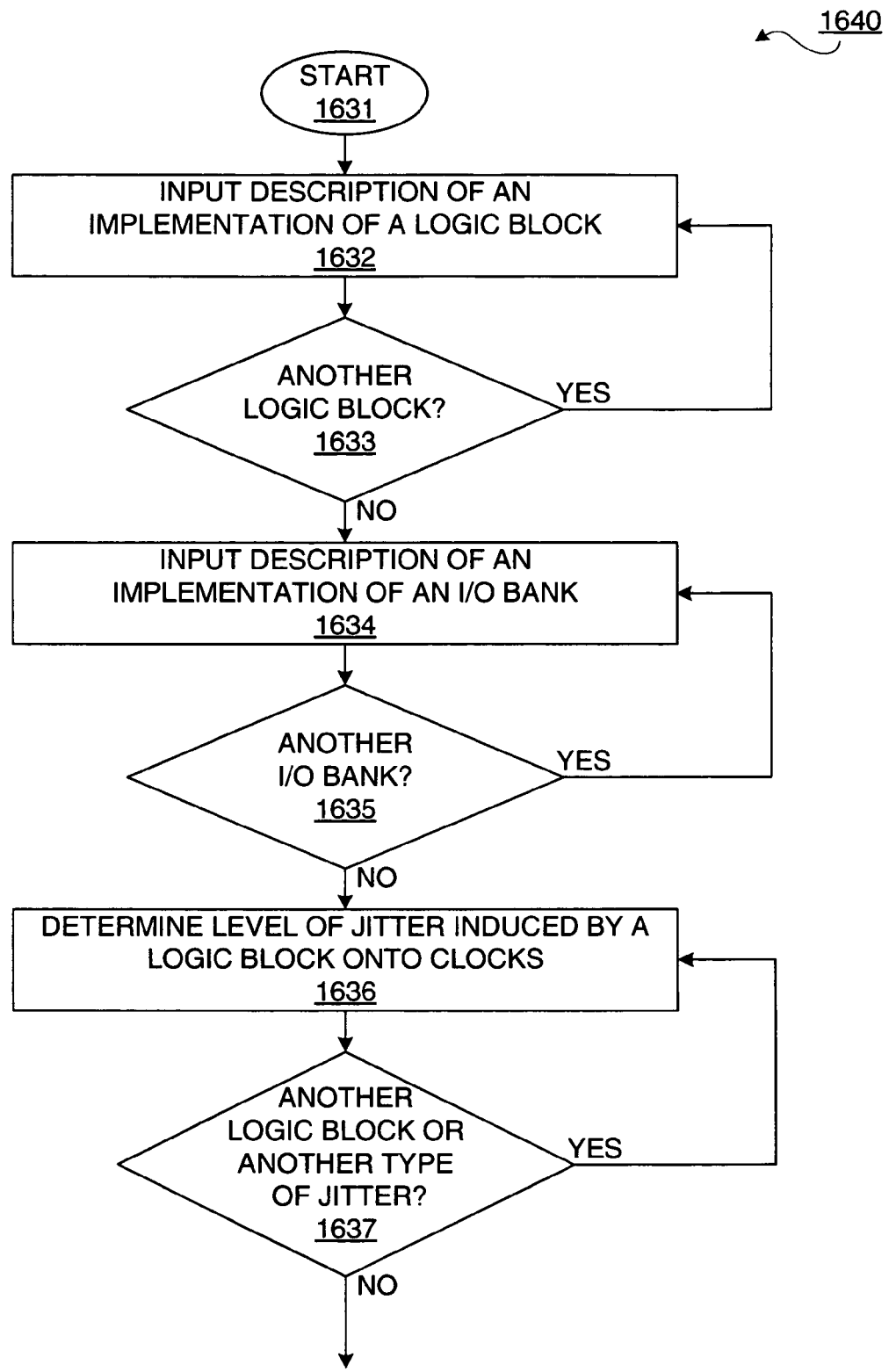
FIG. 16B, collectively
Figures 2, 16B:
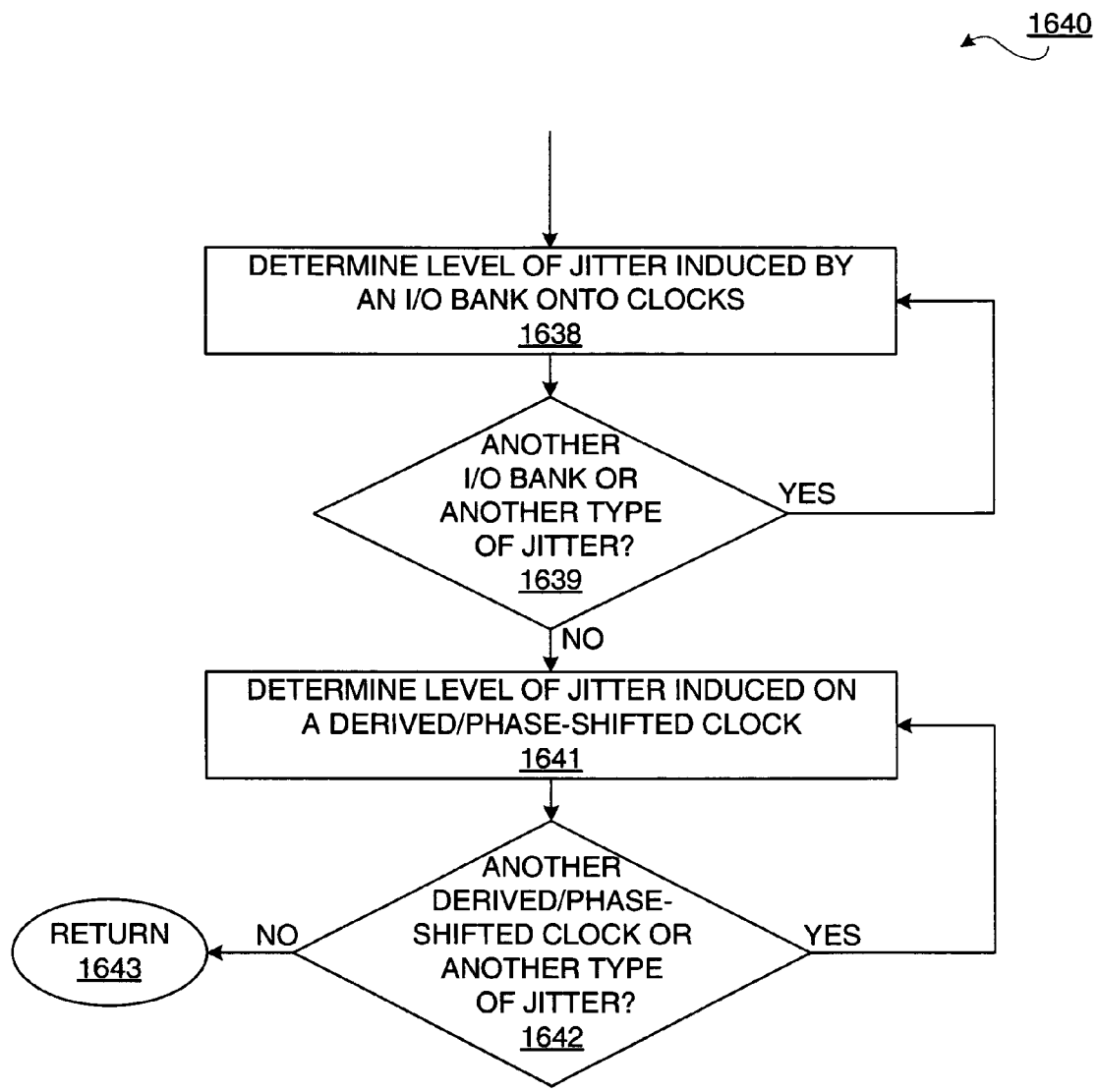

FIG. 16B, collectively FIGS. 16B-1 through 16B-2, is a flow diagram depicting an exemplary embodiment of a system jitter predictor ("SJP") flow 1640. SJP flow 1640 is initialized at 1631. At 1632, a description of an implementation of a logic block is input. Examples of details for describing a logic block may include one or more of minimum and maximum clock frequency, clock enable duty cycle, active clock edge rising or falling, number of flip-flops, jitter reduction scaling factor, or jitter reduction quality of implementation, among other details described herein. At 1633, it is determined whether there is another logic block to have its description input. If there is another logic block to have its description input, such description is input at 1632. This loop repeats until all logic blocks have had their descriptions input. Once all logic blocks have had their descriptions input as determined at 1633, SJP flow 1640 may proceed to 1634. Examples of logic blocks of an FPGA include CLBs, DSPs, BRAMs, embedded processors, among other known logic blocks.

At 1634, a description of an implementation of a grouping of I/O devices ("I/O bank") is input. Examples of details that may be input for such a description may include one or more of minimum and maximum clock frequency, clock enable duty cycle, the type of flip-flop of the last output stage (such as "D" flip-flop or DDR flip-flop, among other known types of flip-flops), driver output type and slew rate, input receiver type and slew rate, output undershoot and overshoot, input undershoot and overshoot, output phase drift, output ground bounce limit, or output voltage tolerance, among other types of descriptor details described elsewhere herein. At 1635, it is determined whether another I/O bank is to have its description input. If another I/O bank is to have its description input as determined at 1635, such description is input for such other I/O bank at 1634. This loop repeats until all I/O banks have their description input. Once all I/O banks have their description input as determined at 1635, SJP flow 1640 may proceed to 1636.

At 1636, the level of jitter induced by one logic block onto clock signals external to such logic block is determined, which may include a clock signal provided to the logic block. At 1637, it is determined whether there is another logic block or another type of jitter to be processed. Once each type of jitter induced by each logic block onto clocks external to such logic block have been processed for all logic blocks and all types of jitter involved, SJP flow 1640 may proceed to 1638.

At 1638, the level of jitter induced by an I/O bank onto clock signals external to such I/O bank is determined, which may include a clock signal provided to the I/O bank. At 1639, it is determined whether there is another I/O bank or another type of jitter to be processed. If there is another I/O bank or another type of induced jitter to be processed, 1638 is repeated for each such other I/O bank or other type of jitter. Examples of types of jitter include peak-to-peak jitter, cycle-to-cycle jitter, total jitter, random jitter, deterministic jitter, period jitter, data dependent jitter, duty cycle distortion jitter, high-pulse jitter, low-pulse jitter, and timing interval error jitter, among other known types of jitter. Accordingly, each I/O bank or banks for each type of jitter is processed to determine the amount of jitter induced onto one or more clock signals external to such I/O bank or banks.

Once it is determined at 1639 that each I/O bank and each type of jitter has been processed, at 1641 the level of jitter induced on a derived/phase-shifted clock signal is determined. At 1642, it is determined whether there is another derived/phase-shifted clock signal or another type of jitter to be considered as induced on such a signal. If it is determined that there is another derived/phase-shifted clock signal or another to type of jitter to be considered as induced on a derived/phase-shifted clock signal, 1641 is repeated for such derived/phase-shifted clock signal or other type of jitter. Once all derived/phase-shifted clock signals have been processed for each type of jitter induced upon them, as determined at 1642, SJP flow 1640 may return at 1643.

Figures 1, 16C:
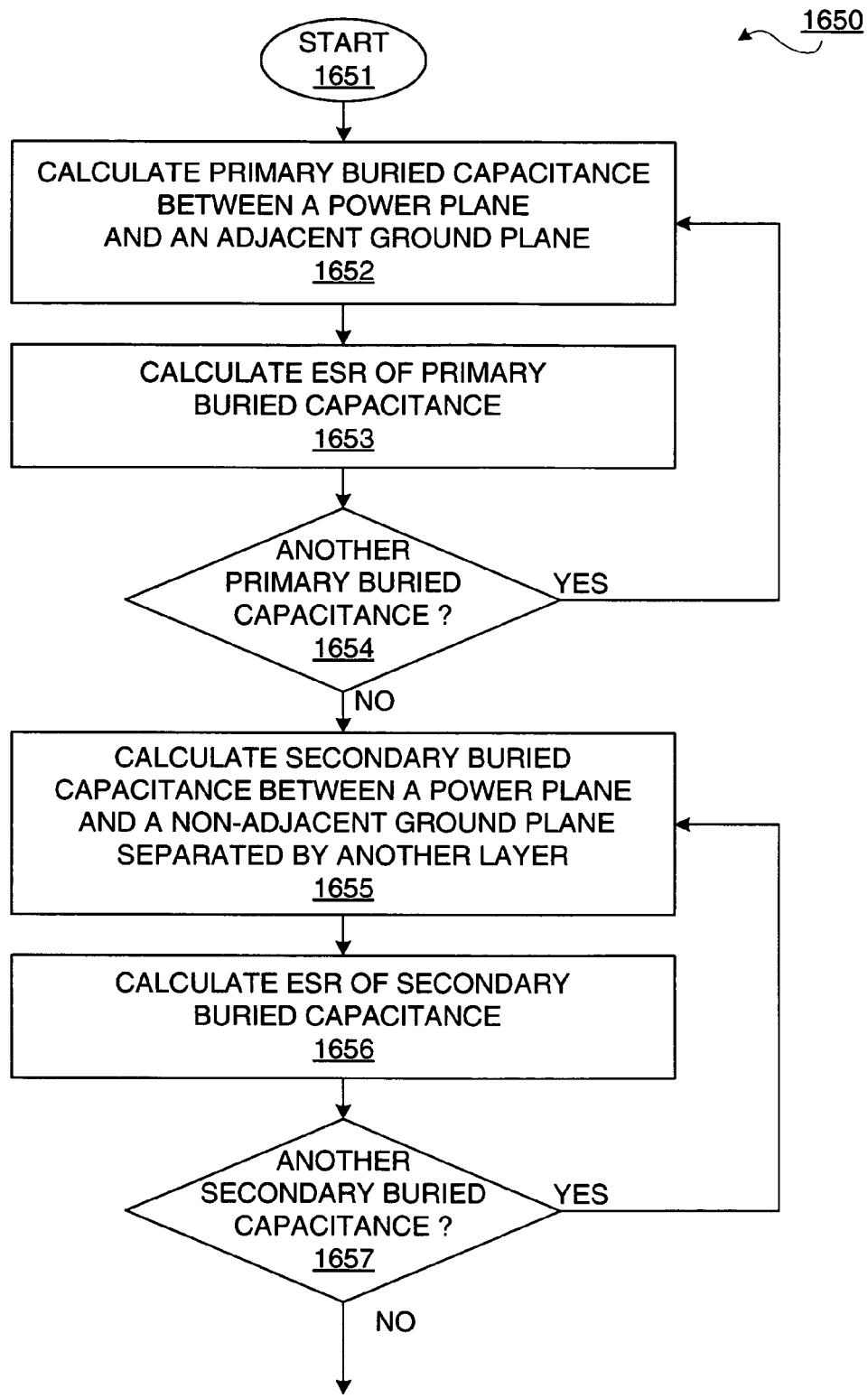
FIG. 16C, collectively
Figures 2, 16C:
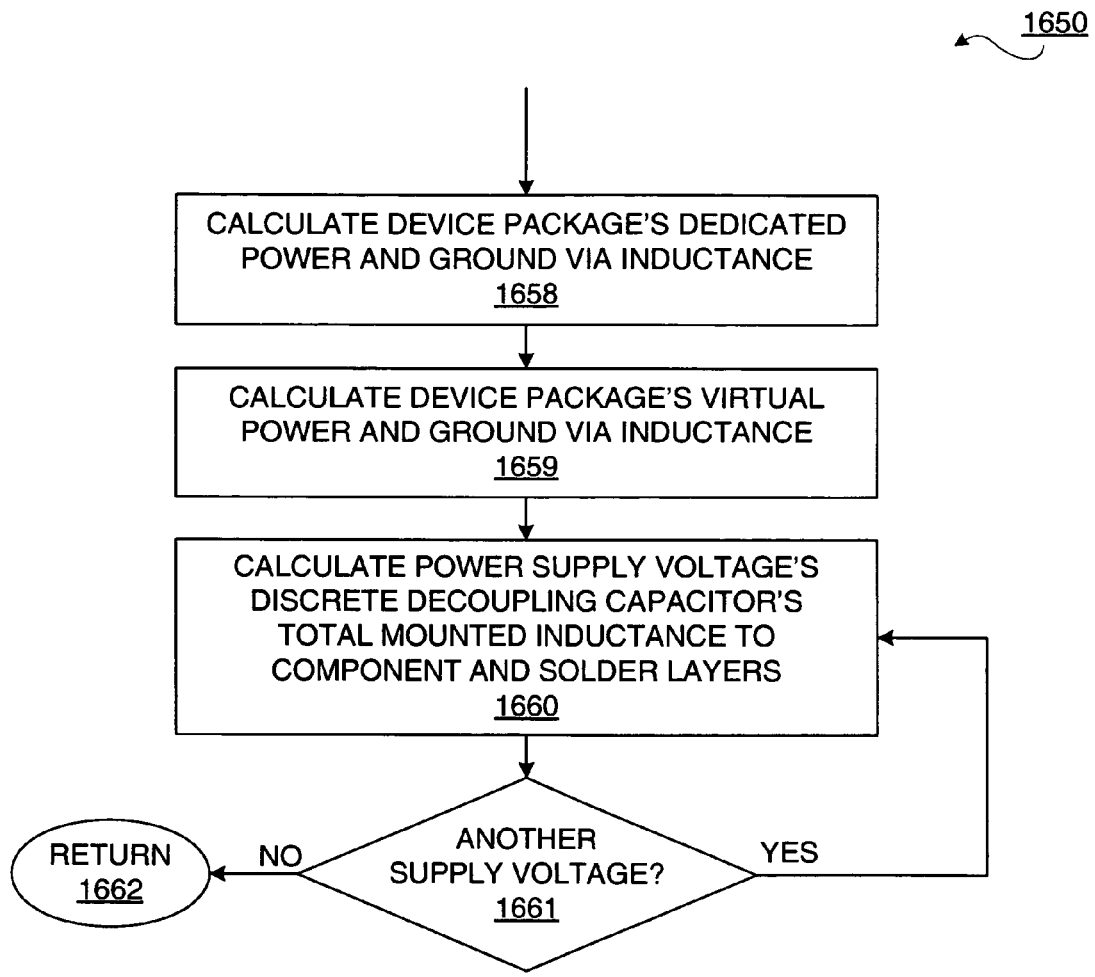

FIG. 16C, collectively FIGS. 16C-1 through 16C-2, is a flow diagram depicting an exemplary embodiment of a Printed Circuit Board ("PCB") analysis flow 1650. PCB analysis flow 1650 is initialized at 1651. At 1652, a primary buried capacitance between a power plane and an adjacent ground plane is calculated. At 1653, the effective series resistance ("ESR") of the primary buried capacitance determined at 1652 is calculated. Notably, this primary buried capacitance in effect may be considered a parasitic capacitor. There may be more than one primary buried capacitance, and accordingly at 1654 it may be determined if there is another primary buried capacitance. If there is another primary buried capacitance as determined at 1654, the calculations at 1652 and 1653 are repeated for such other primary buried capacitance. Accordingly, this loop may be performed for each primary buried capacitance. Once it is determined at 1654 that no more primary buried capacitances need to be processed, PCB analysis flow 1650 may proceed to 1655.

At 1655, a secondary buried capacitance between a power plane and a ground plane that is not adjacent to the power plane, and is separated by at least one signal layer from the power plane, is calculated. At 1656, the ESR of the second buried capacitance calculated at 1655 is calculated. Again, the secondary buried capacitance may be considered a secondary buried capacitor formed by a parasitic capacitance. Accordingly, there may be more than one secondary buried capacitance. At 1657, it is determined where there is another secondary buried capacitance to process. If there is another such secondary buried capacitance to process, the calculations done at 1655 and 1656 are repeated for such other secondary buried capacitance. Once all secondary buried capacitances have been processed as determined at 1657, PCB analysis flow 1650 may proceed to 1658.

At 1658, a device package's dedicated power and ground via inductance is calculated. This calculation may be done for an FPGA package; however, it should be appreciated that other integrated circuits may be used. At 1659, the device package's virtual power and ground via inductance is calculated. At 1660, a power supply voltage's discrete decoupling capacitor's total mounted inductance to component ("top") and solder ("bottom") layers is calculated. Notably, a top layer refers to a top surface of a PCB, and a bottom layer refers to a bottom surface of a PCB. At 1661, it is determined whether another supply voltage is to be processed. If another supply voltage is to be processed, the total mounted inductance of a discrete decoupling capacitor for such other supply voltage is determined for both the component and solder layers. Once each supply voltage has been processed as determined at 1661, PCB analysis flow 1650 may return at 1662.

Figures 1, 16D:
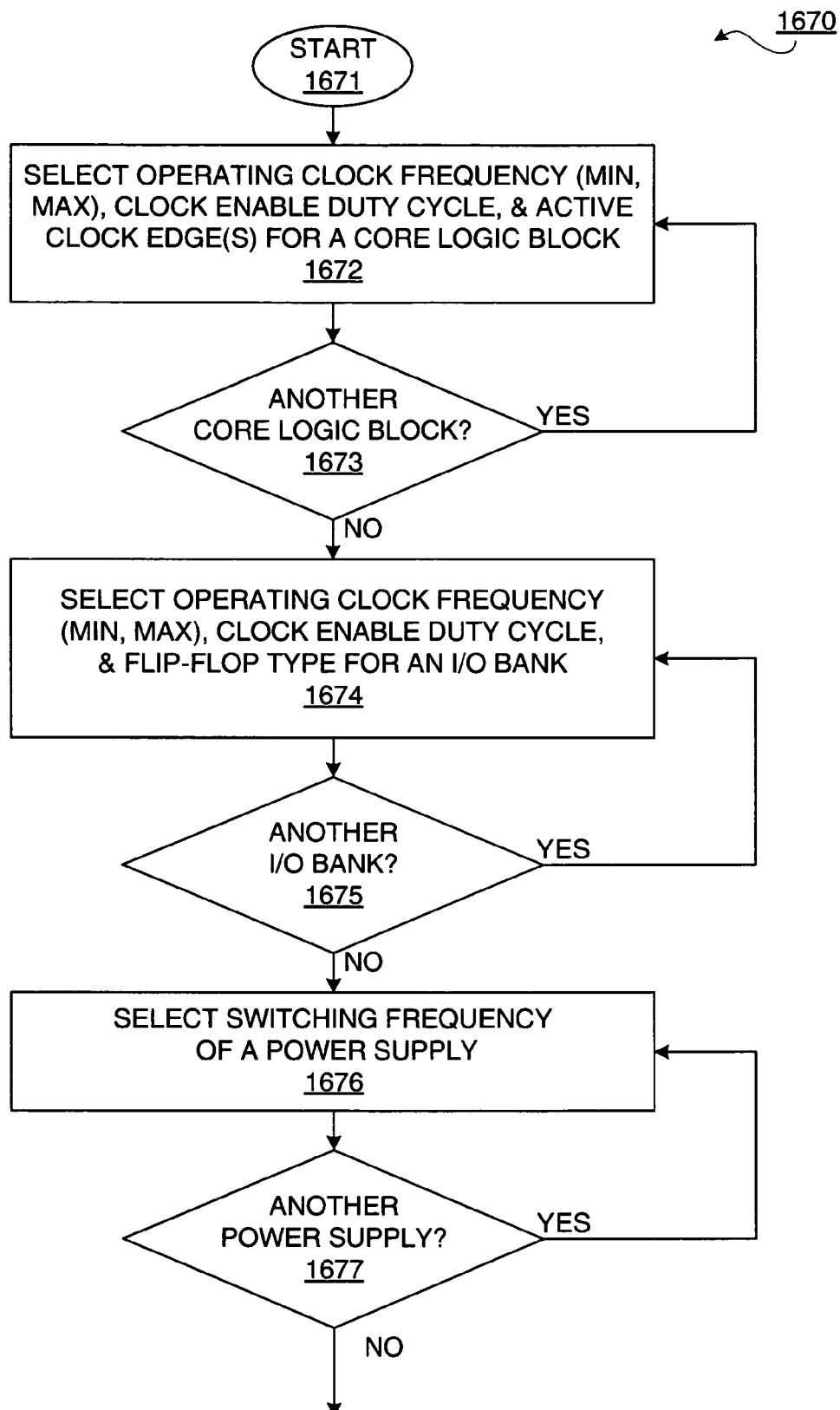
FIG. 16D, collectively
Figures 2, 16D:
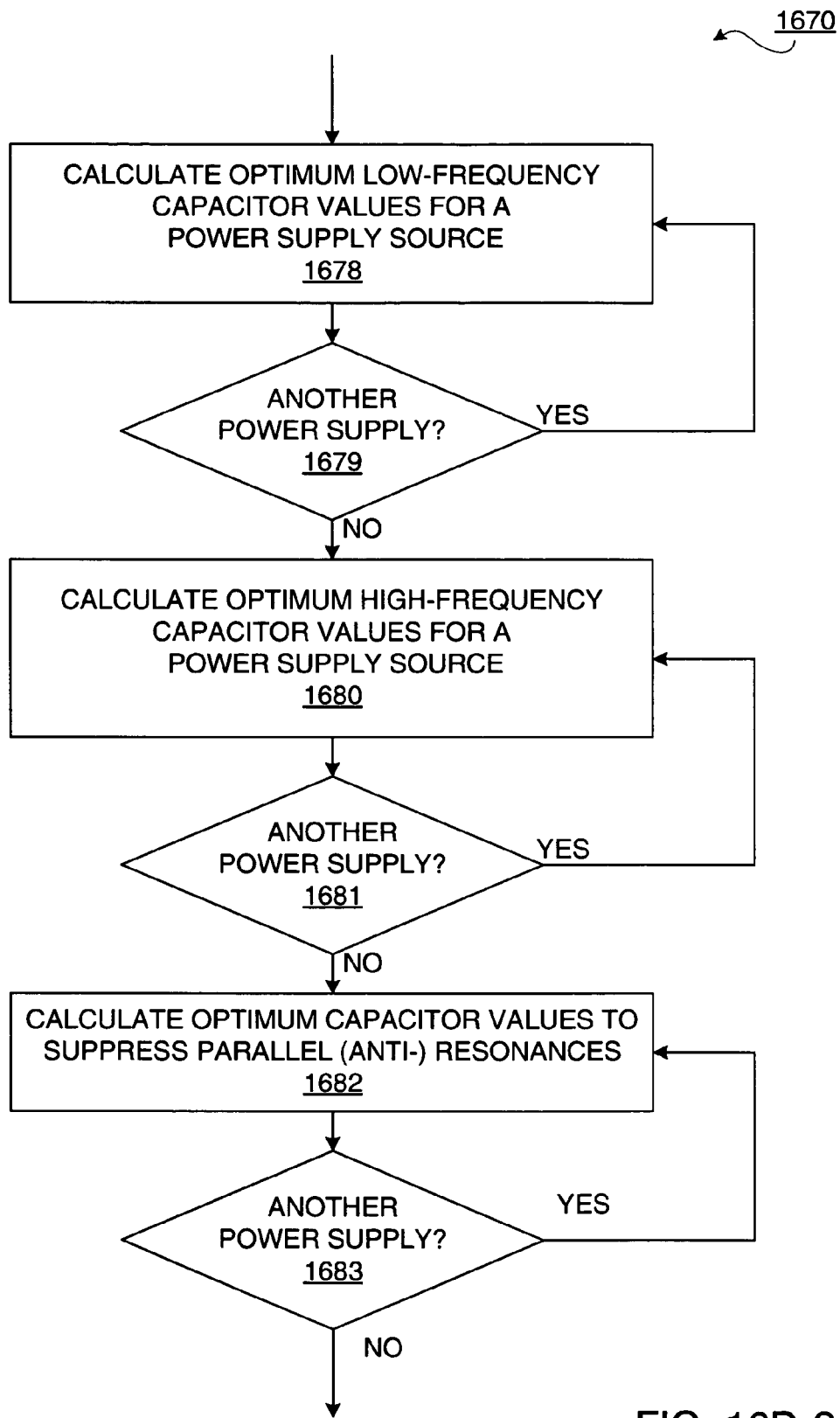
Figures 3, 16D:
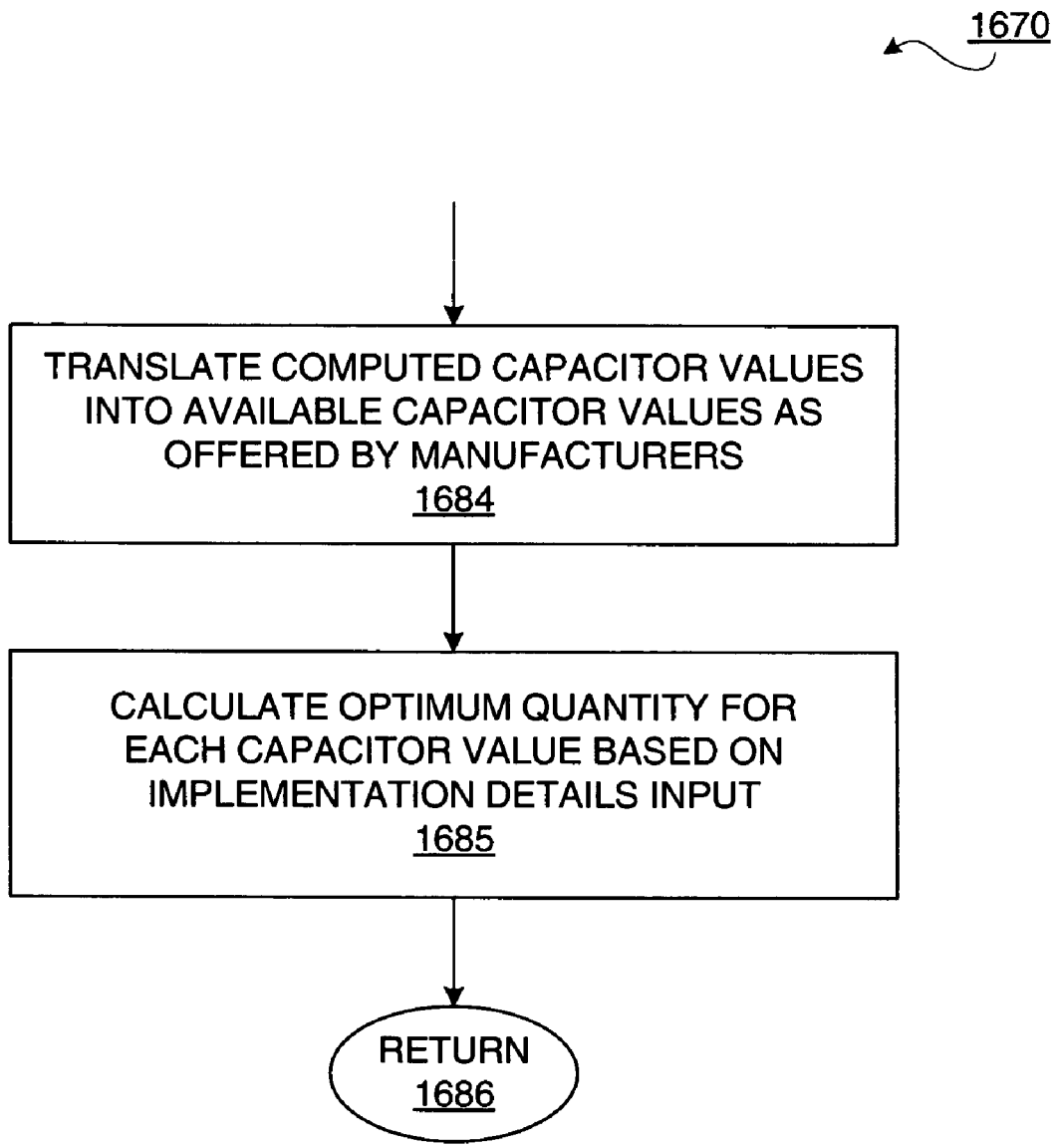

FIG. 16D, collectively FIGS. 16D-1 through 16D-3, is a flow diagram depicting an exemplary embodiment of an Application Specific Noise Suppression ("ASNS") flow

1670. ASNS flow 1670 is initialized at 1671. At 1672, an operating clock frequency minimum and maximum, clock enable duty cycle, and active clock edge or edges for a core logic block are selected. At 1673, it is determined whether there is another core logic block to process. If it is determined at 1673 that there is another core logic block to be processed, 1672 is repeated for such other core logic block. Once all core logic blocks have been processed by this loop as determined at 1673, ASNS flow 1670 may proceed to 1674.

At 1674, an operating clock frequency minimum and maximum, clock enable duty cycle, and flip-flop type for an I/O bank are selected. At 1675, it is determined whether there is another I/O bank to process. If there is another I/O bank to process, then 1674 is repeated for such other I/O bank. Once all I/O banks have been processed as determined at 1675, ASNS flow 1670 may proceed to 1676.

At 1676, a switching frequency of a power supply is selected. At 1677, it is determined whether there is another power supply to be processed. If there is another power supply to be processed as determined at 1677, 1676 is repeated for such other power supply. Once all power supplies have been processed as determined 1677, ASNS flow 1670 may proceed to 1678.

At 1678, an optimum low-frequency capacitor value or values for a power supply source is calculated. Notably, the optimum low-frequency capacitor values may be calculated for both top and bottom mounting of capacitors, such as to a PCB or backplane, or combination thereof. Furthermore, by a power supply source, it is meant to include a voltage regulator. At 1679, it is determined whether another power supply source is to be processed. If such other power supply source is to be processed, 1678 is repeated for such other power supply. Once all power supplies have been processed as determined at 1679, ASNS flow 1670 may proceed to 1680.

At 1680, optimum high-frequency capacitor values for a power supply source are calculated. Optimum high-frequency capacitor values may be calculated for both top and bottom mounting of a capacitor to a PCB or backplane, or any combination thereof. At 1681, it is determined whether there is another power supply to be processed. If there is another power supply to be processed, 1680 is repeated for such other power supply. Once all power supplies have been processed as determined at 1681, ASNS flow 1670 may proceed to 1682.

At 1682, optimum capacitor values for a power supply to suppress parallel resonances are calculated. Such optimum capacitor values may be calculated for both top and bottom mounting of capacitors to a PCB or backplane, or combination thereof. Notably, by parallel resonances, it is meant to include anti-resonance waveforms. At 1683, it is determined whether another power supply is to be processed. If it is determined at 1683 that another power supply is to be processed, 1682 is repeated for such other power supply. Once all power supplies have been processed as determined at 1683, ASNS flow 1670 may proceed to 1684.

At 1684, computed capacitor values as described above with respect to operations 1678, 1680, and 1682 are translated into capacitor values offered by manufacturers. It should be appreciated that calculated capacitor values may not be discrete, although capacitor values offered by manufacturers generally tend to be discrete capacitor values. Accordingly, such translation may involve some rounding off of values. Thus, although optimum values are targeted, it is not necessary to have an optimal result as suboptimal decoupling capacitance may be sufficient in some user designs.

At 1685, an optimum quantity for each capacitor value is calculated based on implementation details input. Examples of such implementation details input include the amount of logic and flip-flops used, bit rates, a capacitor's ESR, a PCB's buried capacitances, amount of ground bounce, amount of supply bounce, active clock edge or edges, or clock enable duty cycles, among other implementation details described elsewhere herein. At 1686, ASNS flow 1670 may return.

PCB Interface

Figures 1, 17A:
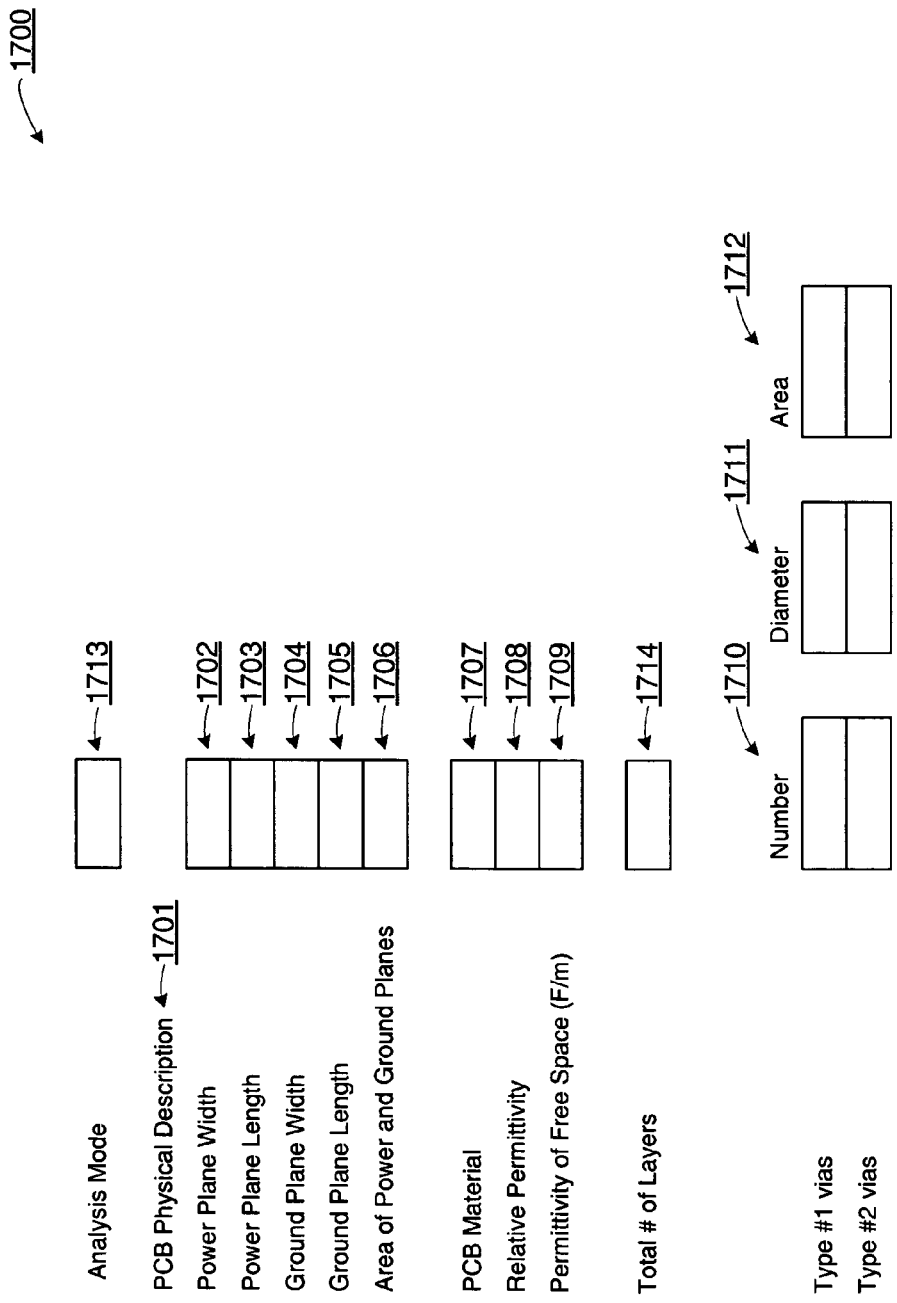
FIG. 17A, collectively
Figures 2, 17A:
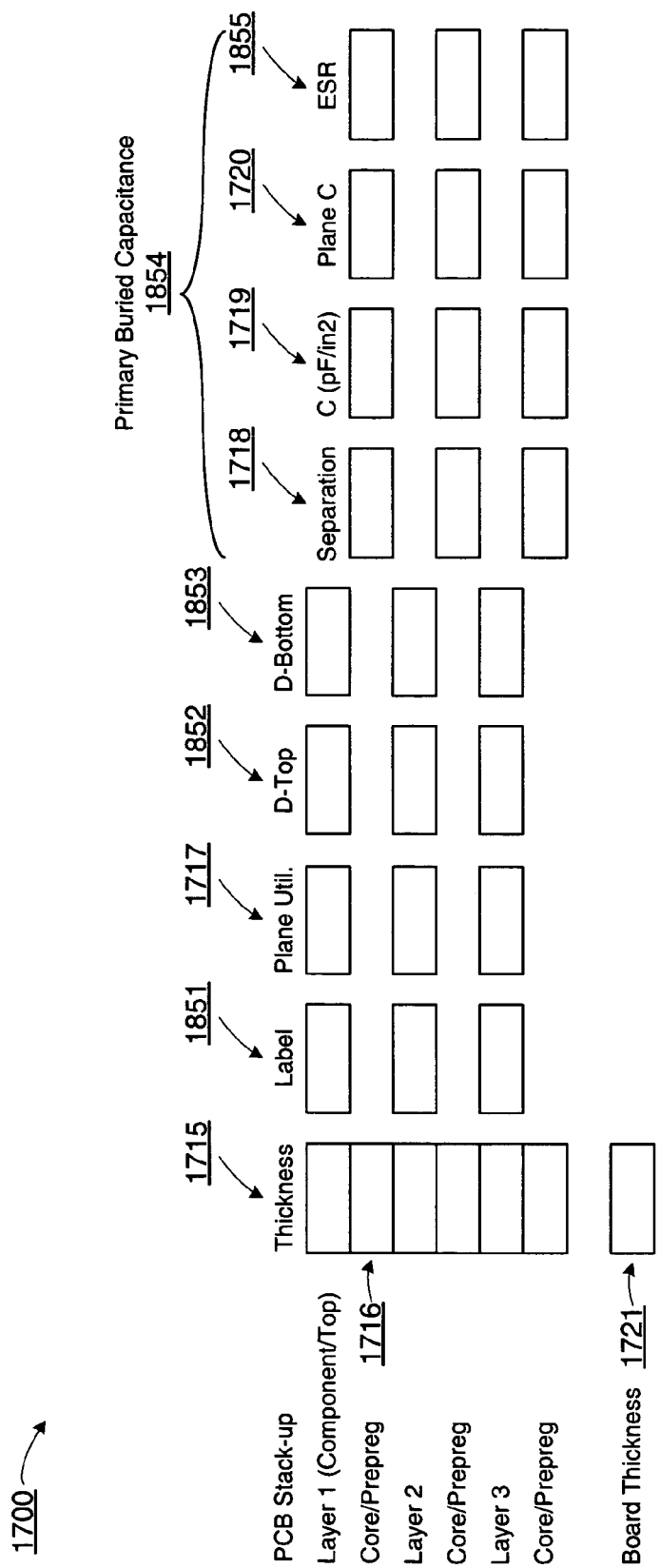
Figures 3, 17A:
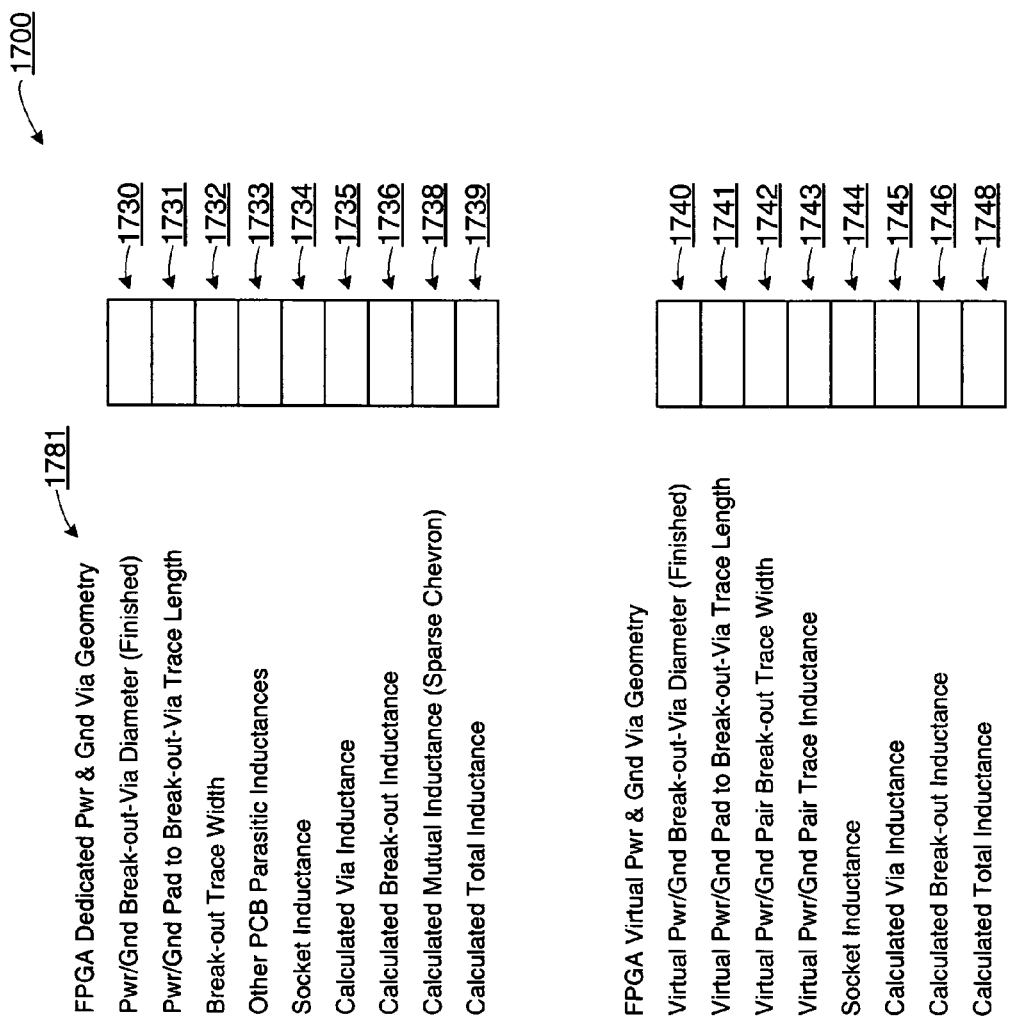
Figures 4, 17A:
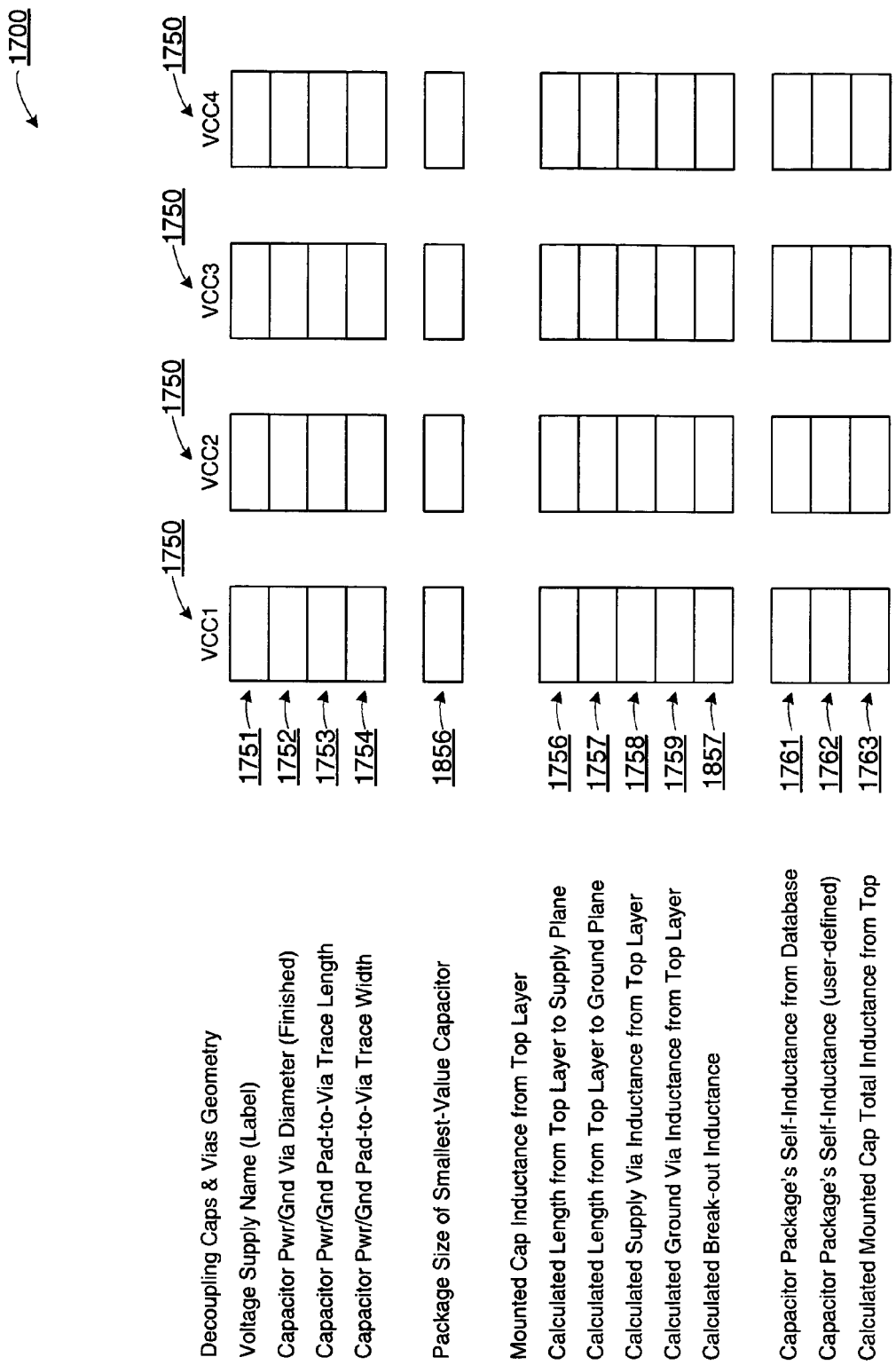
Figures 5, 17A:
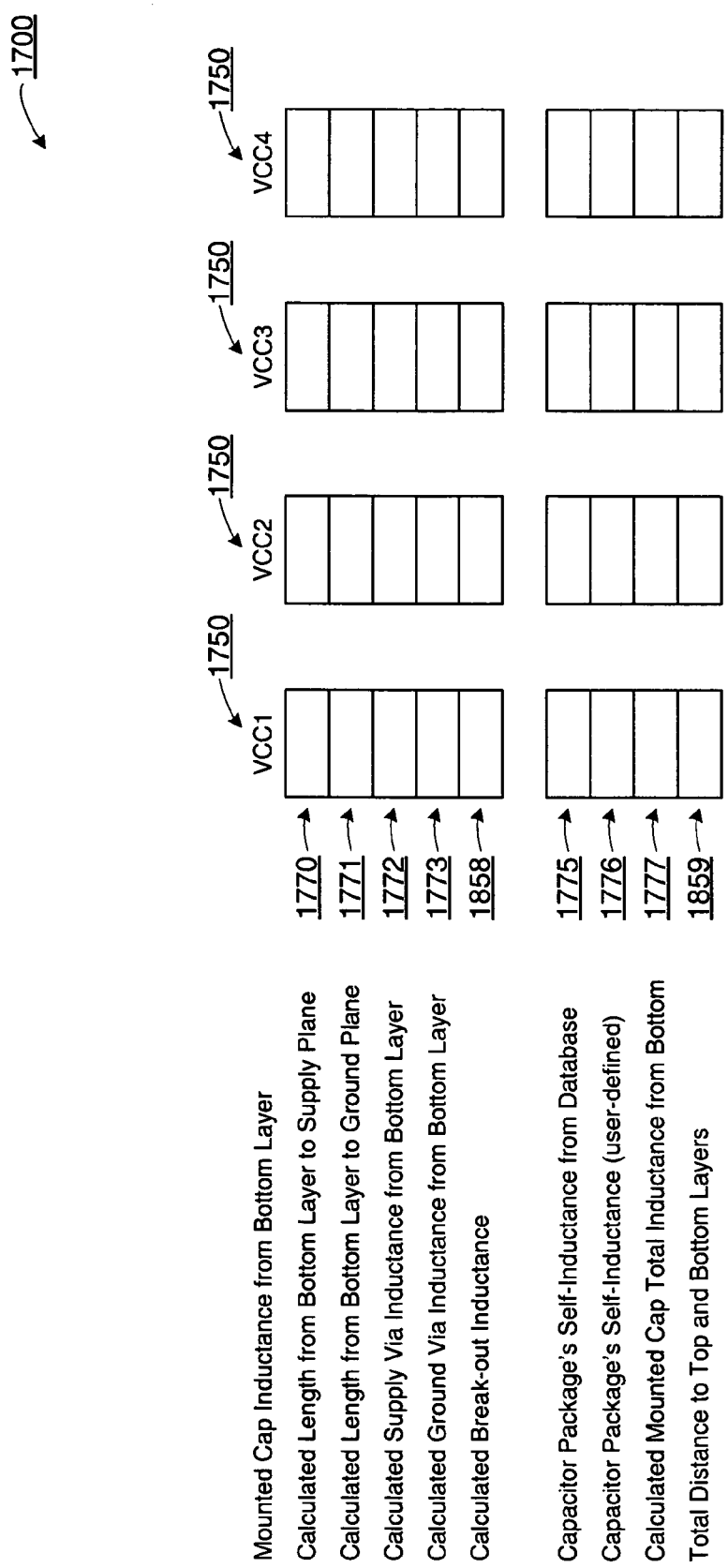

FIG. 17A, collectively FIGS. 17A-1 through 17A-4, is a spreadsheet diagram depicting an exemplary embodiment of a PCB analysis portion 1700 of a user interface. Portion 1700 may be part of user interface 250 of FIG. 2B. Notably, although a spreadsheet user interface is illustratively depicted in FIGS. 17A through 17D, it should be understood that other types of interfaces may be used, including other types of graphical user interfaces. However, for purposes of clarity in order to track the values and calculations derived from those values, an example of a spreadsheet is used.

Portion 1700 is for user interface portion of a PCB analysis module, such as PCB analysis module 272 of FIG. 2C. However, this PCB analysis module may be included as part of an Application Specific Noise Suppression ("ASNS") analysis module 274 of FIG. 2C since most of the analysis done in this PCB module is intended to be used within the ASNS analysis module described below with reference to user interface portion 2000 of FIG. 17D. Generally, the PCB module is to analyze the stack-up, thickness, separation, material, via size, and other physical parameters of a selected PCB in order to determine the parasitic parameters associated with such PCB. Parasitics include via self-inductance, via mutual inductance, via break-out inductance, buried capacitance, and buried capacitor's Effective Series Resistance ("ESR") and Effective Series Inductance ("ESL"). Models that may be used include a one-dimensional "lumped" model, a two-dimensional finite element model, or a three-dimensional field solver model.

With renewed reference to FIG. 2C, detailed information about the construction of the PCB may be received from SNMS Engine 271, which receives such information via an interface to a PCB router 281. Outputs that may be obtained from information of PCB analysis module 272, and thus portion 1700, include: inductance of dedicated power and ground vias to a WASSO module, such as to analyze ground bounce; inductance of virtual power and ground vias to a WASSO module to analyze ground bounce optimization; mounted inductance of discrete capacitors to for an ASNS module, such as to calculate discrete capacitance values; and buried capacitances and buried capacitors' ESR for ASNS module, such as to analyze combined power distribution system ("PDS") response between discrete and buried capacitances. Optionally, a switch that chooses between "What-If" and "Actual" modes may be used. A What-If mode allows the user to analyze the effect of PCB construction on parasitic inductances, capacitances, and ESR before committing to a particular PCB design. A What-If mode may be used by a user to optimize one or more parameters of a design. An Actual mode extracts implementation details from a PCB router database, and performs calculations for parasitics based on actual values. Thus, multiple calculations may be made for determining PDS response. Furthermore, mounting and via inductance of discrete capacitors to be mounted on a PCB may be accounted for, and response of the buried capacitors that are built into the PCB stack-up itself may be accounted for.

Examples of fields used for the above-described implementation details in a user interface for a PCB module are illustratively shown in PCB analysis portion 1700 of FIG. 17A. An analysis mode, such as either a What-If mode or an Actual mode, may be selected by a user in mode field 1713. A PCB physical description section 1701 includes fields for entering PCB parameters. Section 1701 may include one or more sets of power plane width field 1702, power plane length field 1703, ground plane width field 1704, and ground plane length field 1705. From input parameters associated with fields 1702 through 1705, area of one or more power and ground planes may be calculated for population in one or more fields 1706. Another parameter that may be entered is the type of PCB material in field 1707. A database of PCB materials may be provided for selecting a relative permittivity responsive to the PCB material input. Thus, relative permittivity field 1708 may be populated by access to a database. Additionally, permittivity of free space field 1709 may be populated with a known value.

There may be multiple types of vias. In this particular example, only two types are illustratively shown but there may be more than two types, for example, ten types of vias. A user may indicate how many of each type, namely the number of vias of a type, in fields 1710 respectively associated with a type, and a user may indicate the diameter for each associated via type in fields 1711. Notably, via information for fields 1710 and 1711 may be provided by a PCB manufacturer. Accordingly, area field 1712 may be populated to indicate the total area of all vias of each particular via type. Additionally, a total number of layers field 1714 may be added for the number of layers connected to the same power supply. This added field may be used for the equivalent number of capacitors in calculating a PDS response.

Effective area of a power and ground planes of a PCB may be used for determining the effective plane capacitances. Thus, each effective plane capacitance may be calculated for each of the types of vias, as respectively associated with via types 1 and 2. Inductance may be calculated based on the distance from each plane back up to an uppermost surface and again back down to a bottommost surface of a PCB. The distance from a plane to a nearest ground may be calculated as well. Notably, any calculated information need not be displayed as part of a user interface.

As is known, a PCB often is made up of multiple layers and one or more cores between layers. Thus, for example, a thickness of each respective layer may be input by a user in fields 1715. Additionally, a core, or prepreg, thickness may be input by a user in field 1716. A user may also indicate in plane utilization fields 1717 what the layer is used for, such as signals, ground, supply voltage, internal supply voltage, auxiliary supply voltage, or other type of voltage. A user may enter a label for the signal type in label fields 1851, such as a particular supply voltage, signal, ground, or other label. A distance to a top layer or a distance to a bottom layer relative to an integrated circuit die coupled to a PCB may be calculated and used to populate affected fields 1852 and 1853, respectively. Separation between layers may be calculated and populated in fields 1718; capacitance per square inch of the layer may be calculated and populated in field 1719. Additionally, overall plane capacitance may be calculated and populated in field 1720. Moreover, by summing the thicknesses input by a user, a total board thickness may be calculated and put in field 1721. An ESR value may be calculated for ESR field 1855. Fields 1718, 1719, 1720, and 1855 may be for a primary buried capacitance 1854. Additionally, another set of these buried capacitance fields may be generated for a secondary buried capacitance (not shown). Notably, some values for fields of this PCB module may be provided by a PCB manufacturer.

As is known, a PCB may have dedicated power and ground via geometries. Continuing the example of an FPGA, such geometries are described in section 1781. Power/ground break-out via diameters for a finished via may be input by a user in field 1730. Power/ground pad to break-out via trace length may be input by a user in field 1731. Break-out trace width may be input by a user in field 1732. The examples of user inputs described with respect to PCB analysis portion 1700 heretofore may all have been input based on design parameters created by a circuit designer or loaded in from a PCB database such as may be provided by a PCB manufacturer. However, other PCB parasitic inductances and socket inductance, as may be input in fields 1733 and 1734 respectively, are design parameters which a user would enter but which would not be obtainable from such a PCB database. From at least above described input to fields 1730 through 1732, via inductance may be calculated and populated in field 1735; break-out inductance may be calculated and populated in field 1736; mutual inductance may be calculated and populated in field 1738; and total inductance may be calculated and populated in field 1739. Notably, for this example, mutual inductance for field 1738 is for a Sparse Chevron package.

Notably, Grover's formulas and tables for calculating inductance may be used. Calculation for via inductance in field 1735 may be done according to:

$$L = 5.08 \times (\text{Board Thickness}) \times \left( \text{Ln}\left( \frac{4 \times (\text{Board Thickness})}{(\text{Via Diameter})} \right) - 0.75 \right) \quad (2)$$

Calculation for break-out via inductance in field 1736 may be done according to:

$$L = 5.08 \times (Brkout \text{ Length}) \times \left( \text{Ln}\left( \frac{4 \times (Brkout \text{ Length})}{(Brkout \text{ Width})} \right) - 0.75 \right) \quad (3)$$

Calculation for mutual inductance in field 1738 may be done according to:

$$L = 5.08 \times (\text{Board Thickness}) \times \quad (4)$$
$$\text{Ln}\left( \frac{\frac{(\text{Distance from Signal Pin to Ground Pin})(\text{Distance from Ground Pin to } VCCO \text{ Pin})}{(\text{Distance from Signal Pin to } VCCO \text{ Pin})}}{(\text{Radius of Ground Pin})} \right)$$

Total via inductance in field 1739 may be done by calculating the sum of the results populated in fields 1735 through 1737 minus the result populated in field 1738.

In addition to dedicated power and ground via geometry, an FPGA, as well as other types of integrated circuits, may have virtual power and ground via geometries. Accordingly, a user may input virtual power/ground break-out-via diameter for a finished via in field 1740, and may enter virtual power/ground pad to break-out-via trace length in field 1741. A user may further enter virtual power/ground pair break-out trace width in field 1742. With respect to fields 1740 through 1742, these values may be user-designed values or may be obtained from a PCB database as provided by a PCB manufacturer, for example. Additionally, user-designed parameters generally not available in a PCB database provided by a manufacturer may be entered, including virtual power/ground pair trace inductance field 1743 and socket inductance field 1744. From these virtual power and ground via geometries input at least to fields 1740 through 1742, via inductance may be calculated and populated in field 1745; break-out inductance may be calculated and populated in field 1746; and total inductance may be calculated and populated in field 1748.

With respect to dedicated power and ground via geometries, as mentioned above, a Sparse Chevron pattern may be used in an FPGA package, for example, as well as other types of integrated circuit die. If such a pattern is selected, then mutual inductance may be subtracted out.

For decoupling capacitors and associated via geometries, there may be more than one supply voltage for an integrated circuit. Alternatively, there may be only one supply voltage for an integrated circuit. However, assuming there are multiple supply voltages, then there may be multiple supply voltage sets of fields, such as the example of sets of fields 1750. Although an example four sets of fields 1750 are used here, it should be appreciated that fewer or more sets of supply voltage field sets 1750 may be present. A supply voltage name label may be entered in fields 1751. Examples of such names may be VCC Internal, VCC Auxiliary, 3.3V, 1.8V, among other known types of supply voltage levels. Capacitor power/ground via diameter for a finished via may be input to fields 1752, and capacitor power/ground pad-to-via trace length as well as capacitor power/ground pad-to-via trace width may be respectively input by a user in fields 1753 and 1754. In fields 1856, a user may input the package size of the smallest-value capacitor, or in other words of the capacitor having the least capacitance, that may be used for each supply voltage These values may be same for each set of supply voltage fields, although they need not be; they may be different values depending on the supply voltage. From the values input either directly by a user or obtained from a PCB database for fields 1751 through 1754, mounted capacitance inductance from a top layer and mounted capacitance inductance from a bottom layer may be calculated as described below.

Mounted capacitance inductance from a top layer may include a calculation of a length from a top layer to a supply plane which value may be populated in fields 1756. Length from a top layer to one or more ground planes may be calculated and populated in fields 1757. Supply via inductance from a top layer may be calculated and populated in fields 1758. Ground via inductance from a top layer may be calculated and populated in fields 1759. Calculated break-out inductance for a top-mounted capacitor may be used to populate fields 1857. A capacitor package's self-inductance may be obtained from a database and populated in fields 1761. The capacitor package's self-inductance as defined by a user may be populated in fields 1762. Mounted capacitance total inductance from a top layer may be calculated and populated in fields 1763. Notably, a capacitor package's self-inductance may be obtained from a database having values from different manufacturers in order to select a capacitor meeting the target value. Accordingly, inductances may be calculated for each supply voltage set of data.

For mounted capacitor inductance from a bottom layer, length from a bottom layer to a supply plane may be calculated and populated in fields 1770. Additionally, length from a bottom layer to one or more ground planes may be calculated and populated in fields 1771. Supply via inductance from a bottom layer may be calculated and populated in fields 1772. Ground via inductance from a bottom layer may be calculated and populated in fields 1773. Calculated break-out inductance for a bottom-mounted capacitor may be used to populate fields 1858. A capacitor package's self-inductance may be obtained from a database from one or more manufacturers as previously described and populated in fields 1775. The capacitor package's self-inductance as defined by a user may be calculated and populated in fields 1776. Mounted capacitor total inductance from a bottom layer may be calculated and populated in fields 1777. Optionally, a total distance to top and bottom layers may be calculated as a check value and populated in fields 1859.

Accordingly, it should be appreciated from the above-described PCB analysis portion 1700 that depending on where a decoupling capacitor is mounted, there may be a different conductance or inductance, such as mounting on a top layer versus mounting on a bottom layer. Additionally, it should be appreciated that landing or mounting pads of a PCB which conventionally have brake-out vias have an impact on inductance. These brake-out vias may extend to a plane such as a power plane or a ground plane of the PCB, or may extend to a brake-out trace for coupling to another mounting pad via another brake-out via of the PCB. Moreover, as is known, CAD interface tools may be used to select particular parts, and thus associated databases provided by manufacturers for those parts may be imported into a user interface as described herein via such CAD interface tool.

WASSO Interface

Figures 1, 17B:
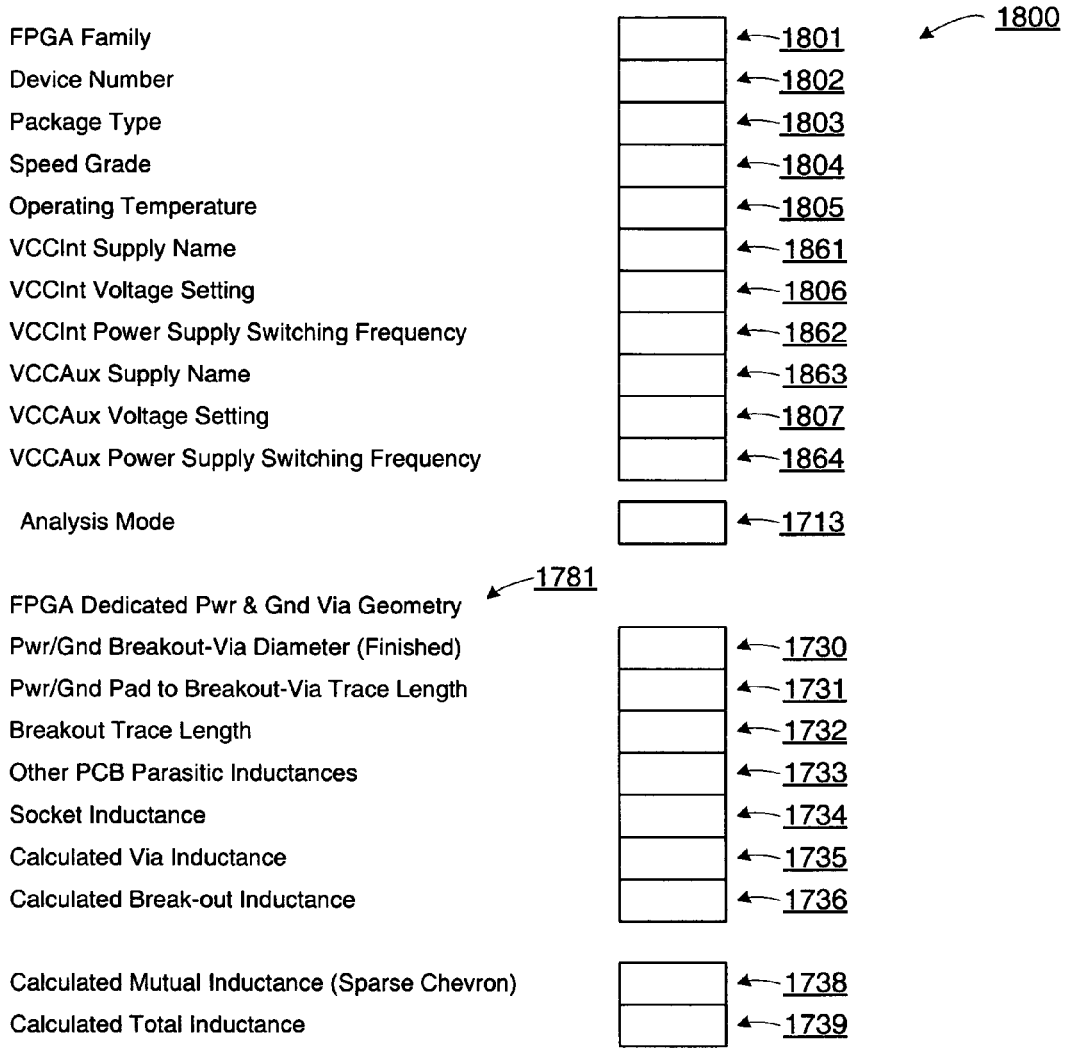
FIG. 17B, collectively
Figures 2, 17B:
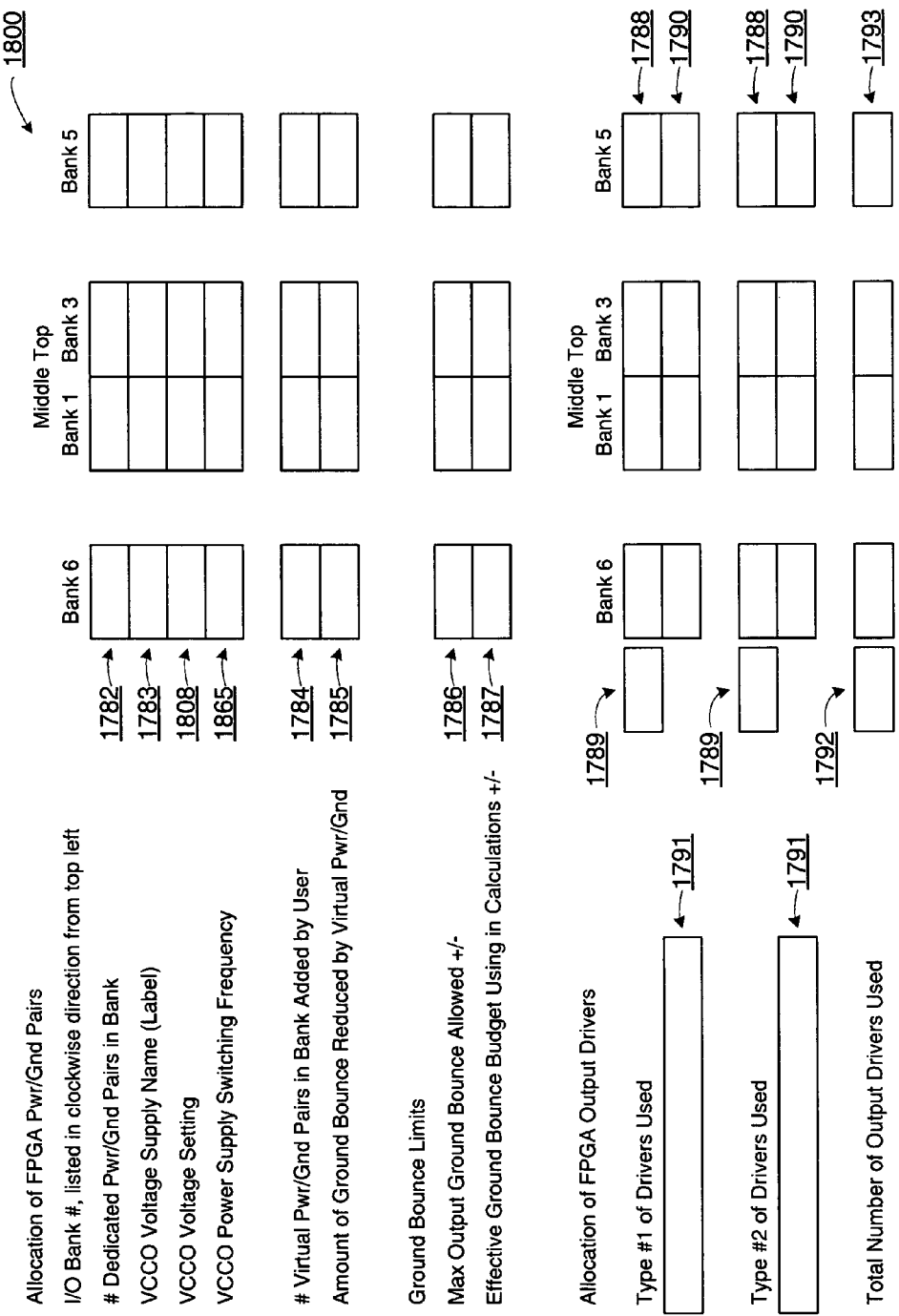
Figures 3, 17B:
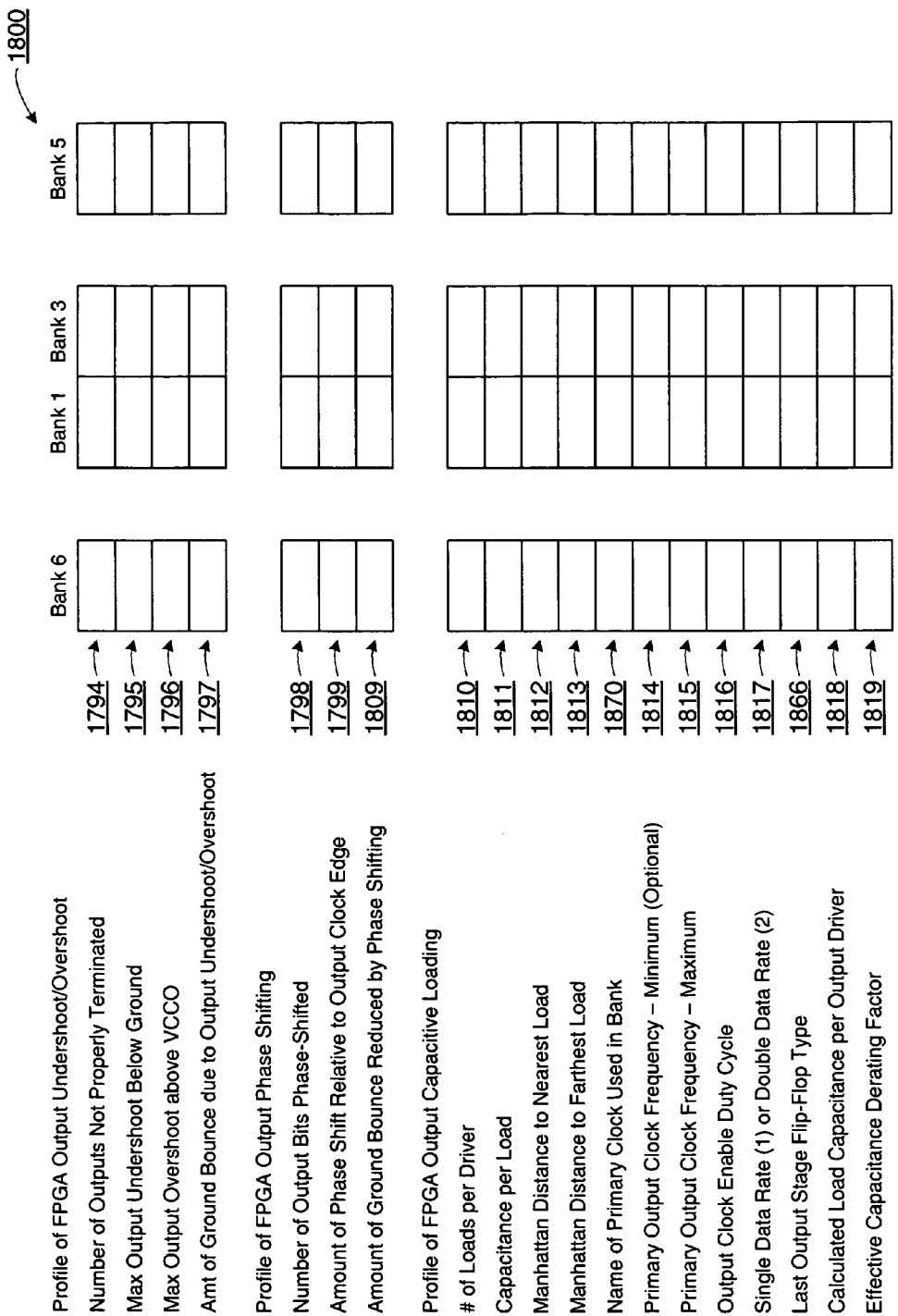
Figures 4, 17B:
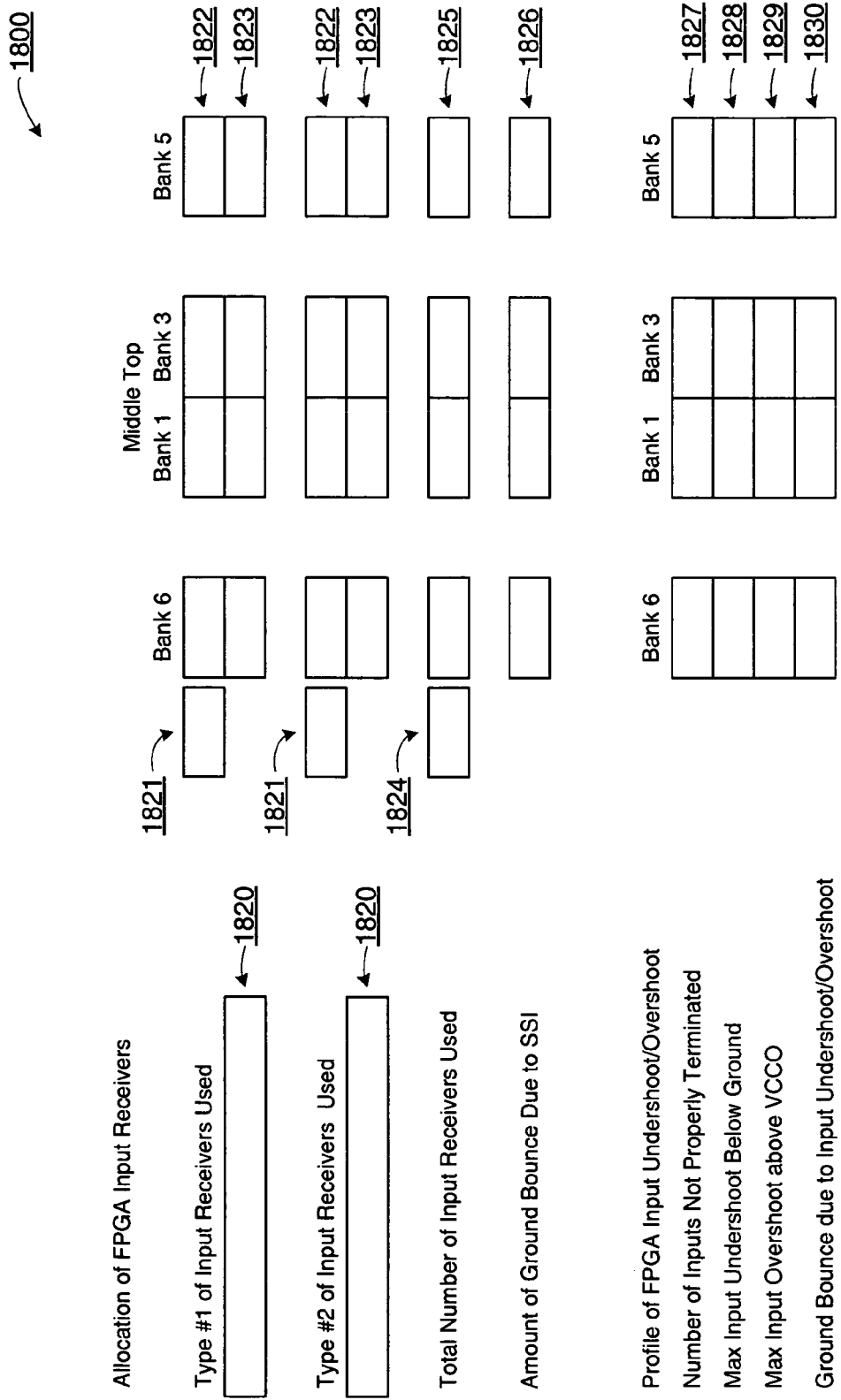

FIG. 17B, collectively FIGS. 17B-1 through 17B-5, is a spread sheet diagram depicting an exemplary embodiment of a WASSO analysis portion 1800 of a user interface, such as may be used as part of user interface 250 of FIG. 2B. Portion 1800 is for a user interface portion of WASSO analysis module, such as WASSO analysis module 273 of FIG. 2C. A device family, which in this example is an FPGA family, may be specified in field 1801. Notably, once this device is specified by a user, it may be propagated in other locations of a user interface. This is also true with respect to a user specifying a device number in field 1802, a package type in field 1803, a speed grade in field 1804, and an operating temperature in field 1805. Notably, integrated circuit configuration information as may be obtained from a manufacture of such a part may be used as described herein. Speed grade input in field 1804 may be used to account for slight variation in ground bounce due to speed grade, such as a result of semiconductor process variation for example, based on manufacturer's characterization data. Alternatively or in addition to speed grade, slight variations in semiconductor processing may be determined through other means such as curves, graphs, formulas, simulations, parasitic extractions, calculations, or the like.

Operating temperature and voltage for each of supply voltage level ("rail") may be used to account for slight variation in ground bounce based on manufacturer's characterization data. Differences in temperature may be accounted for in scaling factor percent variation or mV of ground bounce per degree Celsius ("C"). Differences in supply voltages may be accounted for in scaling factor percent variation or mV of ground bounce per mV of supply voltage variation. Moreover, differences caused by variation of temperature or supply voltage may be as determined by manufacturer's characterization data or through other means such as curves, graphs, formulas, simulations, parasitic extractions, calculations, or the like.

Voltage parameters which may be entered by a user include Vcc internal supply name, voltage setting, and power supply switching ("ripple") frequency for entry in fields 1861, 1806, and 1862, respectively. Other voltage parameters that may be entered by a user include Vcc auxiliary supply name, voltage setting, and power supply switching frequency for entry in fields 1863, 1807, and 1864, respectively. WASSO analysis portion 1800 may include an analysis mode field 1713. As described above, the What-If mode allows a user to do I/O pinout assignment before committing to a hardware implementation of a design. Implementation details may be extracted from PCB routing database and an Integrated Software Environment ("ISE") database respectively associated with PCB router 281 and FPGA design and router tool 282 of FIG. 2C, and SSO calculations may be performed based on the values of the implementation details extracted.

FPGA dedicated power and ground via geometry section 1781 was previously described with reference to PCB analysis portion 1700 of FIG. 17A, and thus its description is not repeated here. Again, as values are input in one location, they may be propagated throughout a user interface into different modules of a user interface. These values may appear in more than one module for purposes of reference for a user in case the user wishes to address one or more of those values while in a module other than the module in which the value was originally input or calculated. Calculated values may additionally be replicated in various modules of a user interface. Notably, inductance of the package itself may be taken into account for the calculation for total inductance for field 1739.

As is known, an FPGA has banks of pins. The number of banks may vary from FPGA to FPGA. Allocation of FPGA power/ground pairs is described below with reference to four exemplary banks, namely banks 1, 3, 5, and 6; other banks may be included but are excluded here for purposes of clarity as they would just be repetitive. Additionally, it should be appreciated that a middle top is specified for the combination of banks 1 and 3. A middle bottom of two other banks may be used. Notably, I/O bank number in this example is listed in a clockwise direction from the top left of an FPGA.

The number of dedicated power and ground pairs in a bank may be displayed in fields 1782, and these values may be obtained based on the FPGA family and device specified as well as the package type. Use device family, part number, and package number may be obtained from an ISE database, such as associated with FPGA design and router tool 282, to automatically look up the number of dedicated power/ground pairs per bank for fields 1782.

VCCO supply name label, voltage setting, and power supply switching frequency may be provided by a user in fields 1783, 1808, and 1865, respectively. Examples of names of supply voltage levels for fields 1783 may be 5V, 3V, 8V or other known supply voltage designation. This facilitates associating a bank with a power supply plane in the PCB stack-up, which may be used to determine the buried capacitance of such plane. Additionally, this association may be used to determine interaction with a discrete capacitor network mounted on a PCB for determining an overall PDS response.

The number of virtual power and ground pairs in a bank added by a user may be specified by a user in fields 1784 for each affected bank. The amount of ground bounce reduced by a virtual power/ground pair may be calculated and populated in fields 1785 for each affected bank. Fields 1785 report the amount of ground bounce reduced by virtual power/ground pins that are implemented by tying I/O pins directly to either ground or VCCO on a PCB. These pins may be configured as strong/fast output drivers by an FPGA configuration bitstream. The amount may be determined from manufacturer's characterization data or through other means such as curves, graphs, formulas, simulations, parasitic extractions, calculations, or the like.

Ground bounce limits may be specified as well as calculated. For example, a maximum output ground bounce allowed may be specified by a user in fields 1786 for each bank. The effective ground bounce budget used in calculations may be determined and populated in fields 1787. Notably, the allocation of FPGA power and ground pairs is used to determine 1-Bank WASSO Utilization.

Allocation of FPGA output drivers may be specified by a user or loaded from an ISE database such as may be available from an FPGA vendor for example and associated with FPGA design and router tool 282 of FIG. 2C. There may be a number of output driver standards supported and any or some subset of such output drivers standards supported may be used. In this particular example, two types of output drivers are specified though fewer or more than two types of output drivers may be specified by either a user or loaded in from an ISE database. The number of drivers in each bank that are used may be indicated in fields 1788, and the total number of a type of driver for all banks may be specified in fields 1789. The type of output drivers used in a bank may be chosen depending on the type of interface input by a user or obtained from an ISE database as indicated in fields 1791; the number of those drivers allowed per power/ground pair is indicated in fields 1790. The total number of output drivers may be calculated for all banks as well as for each bank and placed in fields 1792 and 1793 respectively. Content of each field 1790 may be obtained by looking up an SSO number associated with the output standard type selected. Otherwise, a user may enter an SSO number directly into each field 1790.

Profile of FPGA output undershoots/overshoots is described in the next section of WASSO analysis portion 1800. Again, the example banks 1, 3, 5, and 6 as described above are used, though other banks may be used. The number of outputs not properly terminated for each affected bank may be a user design parameter specified in fields 1794, and the maximum output undershoot below ground may be specified by a user in fields 1795 for each affected bank. The maximum output overshoot above VCCO may be specified in fields 1796 for each affected bank. The amount of ground bounce due to output undershoot/overshoot is calculated and populated in fields 1797 for each affected bank. Notably, a visual indicator flag may be used if a number is excessive. The amounts populated in fields 1797 may be determined by manufacturer's characterization data based on parameters in fields 1794 through 1796. Alternatively, the amount of ground bounce induced by output undershoot/overshoot may be determined through other means such as curves, graphs, formulas, simulations, parasitic extractions, calculations, or the like.

A profile of FPGA output phase shifting may be input by a user for calculating the amount of ground bounce reduced by phase shifting. Accordingly, a user may input a number of output bits phase shifted in fields 1798 for each affected bank and may input the amount of phase shift relative to an output clock edge in fields 1799 for each affected bank. The amount of ground bounce reduced by phase shifting may be used to populate fields 1809 for each affected bank. The amounts shown in fields 1809 may be determined by manufacturer's characterization data based at least in part on the amount of phase shift and the output standard type. Alternatively, the amount of ground bounce reduced by phase shifting may be determined through other means such as curves, graphs, formulas, simulations, parasitic extractions, calculations, or the like.

A profile of FPGA output capacitive loading may be determined next. The number of loads per driver may be entered for each bank by a user in fields 1810 for each affected bank. In fields 1811, capacitance per load for each affected bank may be entered by a user. Generally a user will use the largest value for populating fields 1810 and 1811. A user may enter a Manhattan distance to a nearest load and a Manhattan distance to a farthest load in fields 1812 and 1813 respectively. A user may specify a name of a primary clock used in each bank in fields 1870. A minimum primary output clock frequency may optionally be specified by a user and placed in field 1814 for each affected bank. A maximum primary output clock frequency may be specified by a user or may be obtained from an ISE database and loaded into fields 1815 for each affected bank. A user may specify an output clock enable duty cycle in fields 1816 for each affected bank, and may specify whether a single or double data rate is used in fields 1817 for each affected bank. The type of flip-flop, such as a delay ("D"), DDR, or other known type of flip-flop, used for a last output stage may be input by a user or loaded from an ISE database to populate fields 1866. Load capacitance per output driver may be calculated and populated in fields 1818 for each affected bank. An effective capacitance derating factor may be calculated for each affected bank and placed in fields 1819.

The parameters shown in the fields for the above-described profile of FPGA output capacitive loading are used to determine the effect of capacitive loading on ground bounce on an mV/pF basis, as determined from the manufacturer's characterization data. Capacitive loading may be determined from manufacturer's characterization data, which results in a different derating amount that reflects the operating condition as determined by the parameters in allocation of FPGA input receivers fields described below. This derating factor can also be determined through other means such as curves, graphs, formulas, simulations, parasitic extractions, calculations, or the like. As part of determining the derating factor for capacitive loading, an output clock enable duty cycle of field 1816 accounts for whether the output switches at full clock speed or at sub-harmonic thereof. If a DDR register is used as may be indicated in field 1817, the clock frequency may be multiplied by two to account for the effective data rate. In addition, distance to the load(s), output clock frequency, and total load capacitance per driver may be taken into account to closely approximate the effect of loads on ground bounce.

Allocation of FPGA input receivers may be specified. Notably, there may be some number of input receiver standards supported. The type of input receivers used may be specified by a user or obtained from an ISE database and loaded in fields 1820 for each affected bank. The total number of each type of such receiver may be determined and placed in fields 1821. The number of each type of receiver, or input driver, as specified by a user or as obtained from an ISE database may be populated for each affected bank in fields 1822, and the number of each type of receiver used as calculated may be specified in fields 1823. Accordingly, although only one type of input receiver is shown in this example, it should be appreciated that fewer or more than one type may be implemented. The total number of input receivers used for all banks may be specified in field 1824 and the number of input receivers used for each affected bank may be specified in fields 1825.

In addition to summing up the number of input receivers used for fields 1824 and 1825, the amount of ground bounce due to SSI may be calculated for each affected bank and populated in fields 1826. The number of inputs and the input standard type may be used to determine the amount of ground bounce induced. The scaling factor for mV of ground bounce for each operating scenario may be determined by manufacturer's data or through other means such as curves, graphs, formulas, simulations, parasitic extractions, calculations, or the like. Alternatively, the effect of SSI may be calculated based on the number of SSI allowed per power/ground pair.

Above the profile of FPGA output undershoot/overshoot was described. Now the profile of FPGA input undershoot/overshoot is described. A user may specify the number of inputs not properly terminated for each bank in fields 1827. In fields 1828, a user may specify the maximum input undershoot below ground for each bank. The maximum input overshoot above VCCO may be specified for each bank in fields 1829. Consequently, the amount of ground bounce due to input undershoot/overshoot may be determined for each bank and placed in fields 1830.

Field 1830 shows the amount of ground bounce induced by input undershoot/overshoot. The number of pins with undershoot/overshoot, the voltage level and duration of undershoot/overshoot, and the input standard type may be used to determine the amount of ground bounce. The scaling factor for mV of ground bounce for each operating scenario may be determined by manufacturer's characterization data or through other means such as curves, graphs, formulas, simulations, parasitic extractions, calculations, or the like.

WASSO utilization and status is described next. Notably, an example of 1-Bank and 2-Bank WASSO utilization and status is described; however, fewer than 1-Bank or more than 2-Bank WASSO utilization and status may be implemented from the description herein. SSO Allowance for each 1-Bank may be calculated and placed in fields 1831, and 1-Bank WASSO utilization may be calculated for each bank and placed in fields 1832. Accordingly, these values may be indicated as a percentage indicating the change of an assumed value of a load capacitance. Thus, depending on whether the change exceeds a threshold percentage, the 1-Bank utilization WASSO status may be indicated such as pass or fail for each bank and populated in fields 1833. Notably, each bank may have its own 1-bank SSO Allowance number, as populated in fields 1831, which may be the product of three scaling factors as previously described.

The effect of SSI may be added to the effect of SSO in the calculation of 1-Bank WASSO utilization in field 1832. For some implementations, it may be possible to account for the SSI effect of one input standard using the mV approach and another input standard using the SSI per power/ground pair approach. Notably, 1-Bank WASSO utilization in field 1832 may account for SSI, if SSI limits are specified for the input standard used. Otherwise, the effect of SSI may be accounted for by subtracting the content of field 1826 from a ground bounce limit 1786.

For a 2-Bank SSO Allowance and WASSO utilization, banks are combined as indicated by the bank 10/6 combination, or the bank 6/MT combination, or the bank MT/5 combination. Notably, the "MT" indicates the middle top meaning the combination of banks 1 and 3 in the above example. Thus, a 2-Bank SSO Allowance or a 2-Bank WASSO utilization may actually effectively be for more than two banks. These values may be calculated and a status provided in a similar manner to that described above for the 1-Bank SSO Allowance and WASSO utilization and status. However, a 2-Bank SSO Allowance may be set as a fixed value of a lowest adjacent 1-Bank SSO Allowance for field 1867. An example as described in more detail below may be to set the 2-Bank SSO Allowance to approximately 115% of the lowest adjacent 1-Bank SSO Allowance; however, other percentages may be used depending on the application. Additionally, 2-Bank WASSO utilization and status may be respectively populated in fields 1868 and 1869 for each bank or banks. Accordingly, WASSO utilization for an entire package may be calculated and populated in field 1834. Another field (not shown) may be added to account for ground bounce due to switching events in CLBs of an FPGA. As described above, it should be appreciated that by using a Sparse Chevron or other noise-reducing pin-out package type, total package WASSO utilization, such as may be calculated for field 1834, may not be needed for particular types of packages. Accordingly, package WASSO utilization may be provided for information purposes only.

For purposes of clarity by way of example and not limitation, particular numerical examples are provided below, though other values may be used. The first scaling factor is obtained by dividing 1 nH by the total inductance as determined in field 1739. The mutual inductance number of field 1738 is used to reduce the total inductance value. Thus, the equation for the first scaling factor may be an assumed total inductance value divided by an actual calculated total inductance value. An example of an assumed total inductance value may be approximately 1 nH.

The numerator used in calculating the second scaling factor is adjusted down by subtracting the ground bounce effects due to SSI in field 1826, the ground bounce effects due to input undershoot/overshoot in field 1830, and the ground bounce effects due to output undershoot/overshoot in field 1797. However, the numerator used in calculating the second scaling factor is adjusted up with the addition of the effects of phase shifting of field 1809 and virtual ground of field 1785. The net effective ground bounce budget of field 1787 is then divided by the 600 mV number. The equation for the second scaling factor may be effective ground bounce budget, as adjusted for noise effects, divided by the expected ground bounce level. An example of an expected ground bounce level may be approximately 600 mV.

Using example values for purposes of clarity an not limitation, the third scaling factor may be equal to:

$$\frac{600 \text{ mV}}{\left((22 \text{ pF} - 15 \text{ pF}) \times (Y)\frac{\text{mV}}{\text{pF}}\right) + 600 \text{ mV}} \quad (5)$$

which may yield $$\frac{600 \text{ mV}}{663 \text{ mV}},$$

or 0.905. Notably, Y, which is the effective capacitance derating factor, is determined from manufacturer's characterization data, and is shown in field 1819. This derating factor may alternatively be determined through other means such as curves, graphs, formulas, simulations, parasitic extractions, calculations, or the like.

Field 1831, the 1-Bank SSO Allowance field, is the product of the three scaling factors, and the 1-Bank SSO utilization of field 1832 is the quantity of sum of the number of drivers used divided by the number of devices allowed per power and ground pair times the number of power and ground pairs in a bank for all driver types used and all input receiver types used. Field 1867 for the 2-Bank SSO Allowance is set at percentage of the lowest 1-Bank SSO Allowance number between two adjacent banks, which is three adjacent banks in the case of "Middle Top" or "Middle Bottom" banks. Field 1868, the 2-Bank SSO utilization, is the sum of 1-Bank SSO utilization times the number of power and ground pairs in a bank for all adjacent banks involved divided by the sum all power and ground pairs in all banks involved.

Accordingly, this WASSO module provides flexibility to manage large differences in ground bounce limit from bank to bank. Moreover, ground bounce limit for each individual bank may be specified as described with reference to field 1786. In other words, a different ground bounce limit for each bank may be set instead of having a single limit applied to the entire package.

Notably, 1-Bank and 2-Bank parameters provide the ability to have distinctly different ground bounce limits, with differences as much as approximately 10 times as between two non-adjacent banks, namely two banks which are separated by at least one other bank. If the difference in limit is not large, such as approximately 2 times where the two banks are immediately adjacent to each other. Accuracy for calculation of ground bounce is enhanced, and thus control for levels below approximately 200 mV is provided. Differences in ground bounce levels may be accounted for with an output driver used for monitoring ground bounce. A fast driver will register higher ground bounce voltage levels than a slow driver. A derating factor can be determined from manufacturer's characterization data, curves, graphs, formulas, simulations, parasitic extractions, calculations, or the like. An optimal WASSO utilization may be obtained when the bank with the smallest ground bounce limit is diagonally across from the bank with the largest ground bounce limit.

To account for the effect of internal CLB switching on ground bounce, manufacturer's IC data may be used for parameters such as clock frequency, number of CLBs, LUTs, or flip-flops used, and percent toggle rate, among other known types of integrated circuit data. The effect of internal CLB switching on ground bounce may be greater at the center of the package and less at the periphery of the package. Additionally, distance away from a VCC internal pin may be taken into account. Refinement of calculations may be performed to account for differences in voltage levels between positive and negative excursions of internal ground bounce relative to an external reference ground. Notably, although ground bounce has been described, it should be appreciated by those of ordinary skill in the art that the same description is applicable to supply bounce. However, refinement of calculations to account for the amount of ground bounce may be done differently from accounting for the amount of supply voltage bounce. Although an example of FPGA I/O devices is used, it should be appreciated that any integrated circuit that uses drivers with different strengths and slew rates may be used, such as for example microprocessors, signal processors, graphics/image processors, and the like. Thus, any ground bounce or Vcc bounce parameter associated with or caused by activity of any circuit or function that resides within any integrated circuit is included.

Having now described WASSO utilization and SSO with respect to WASSO analysis portion 1800 of FIG. 17B, as well as ground bounce due to SSI thereof, and having described PCB parameters with reference to PCB analysis portion 1700 of FIG. 17A for determining effect of decoupling capacitors as well as other inductance-generating geometries, attention is now turned to System jitter predictor ("SJP") and Application Specific Noise Suppression ("ASNS") modules of a system. Notably, clock frequencies, which may be generally associated with decoupling capacitors, are also described below in additional detail.

SJP Interface

Figures 1, 17C:
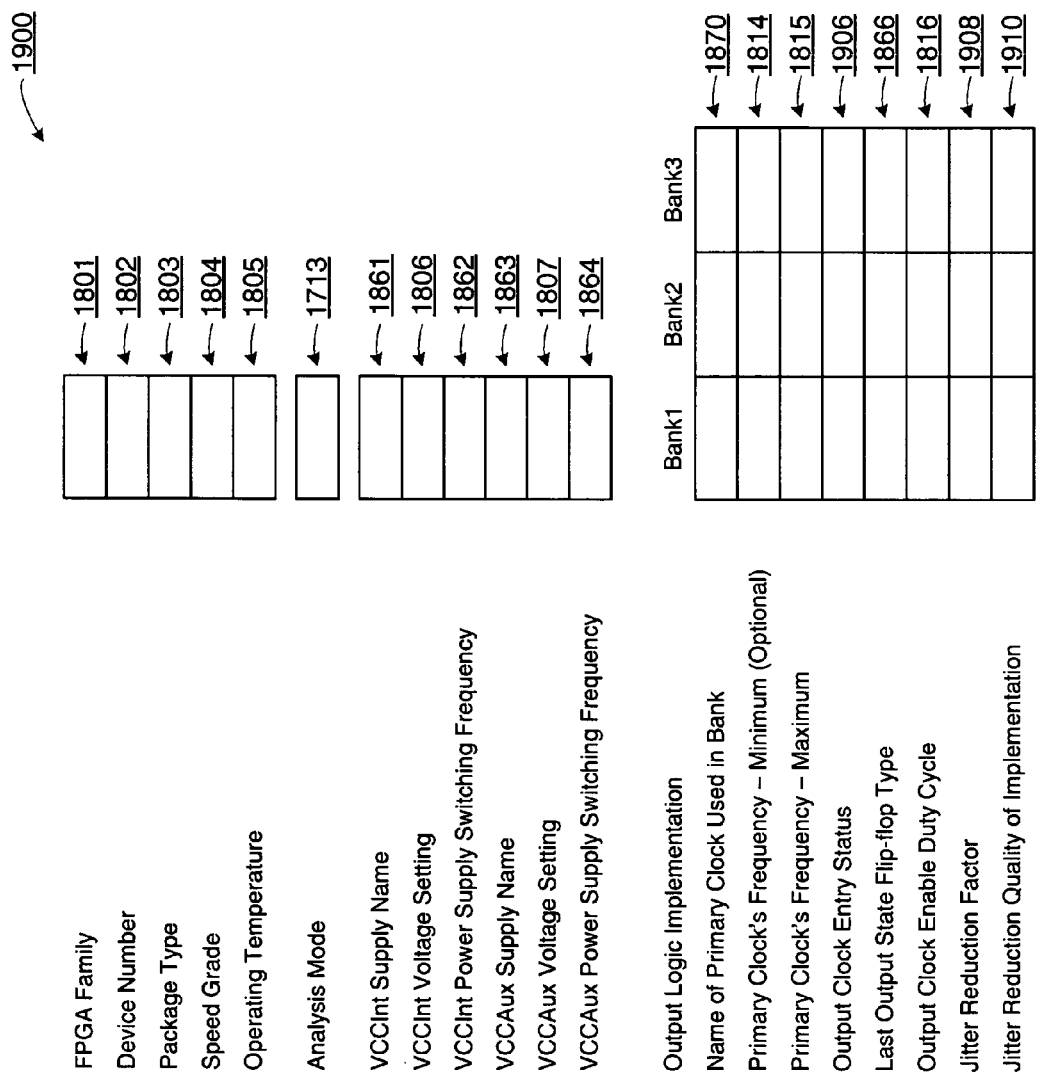
FIG. 17C, collectively
Figures 2, 17C:
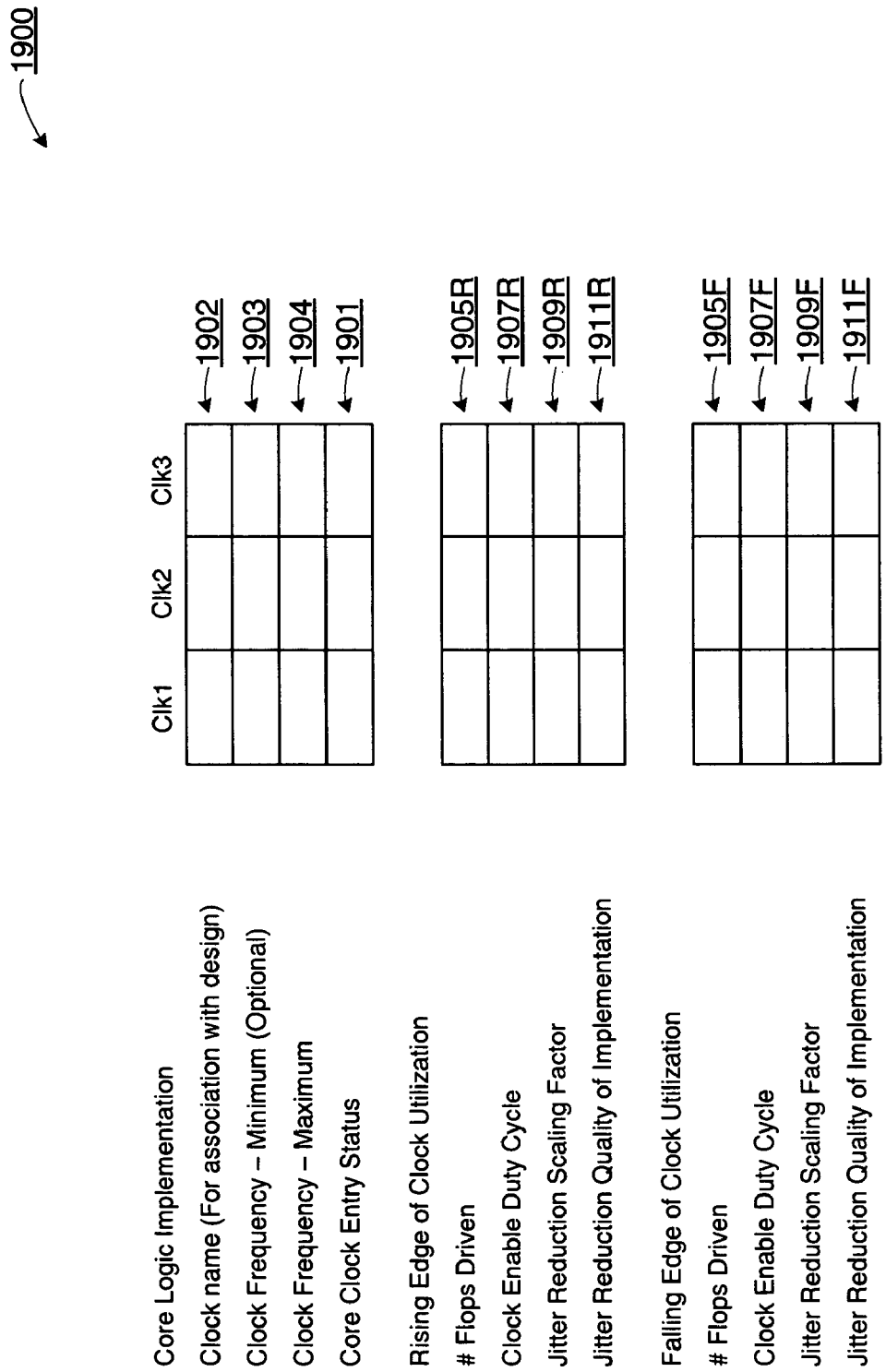
Figures 3, 17C:
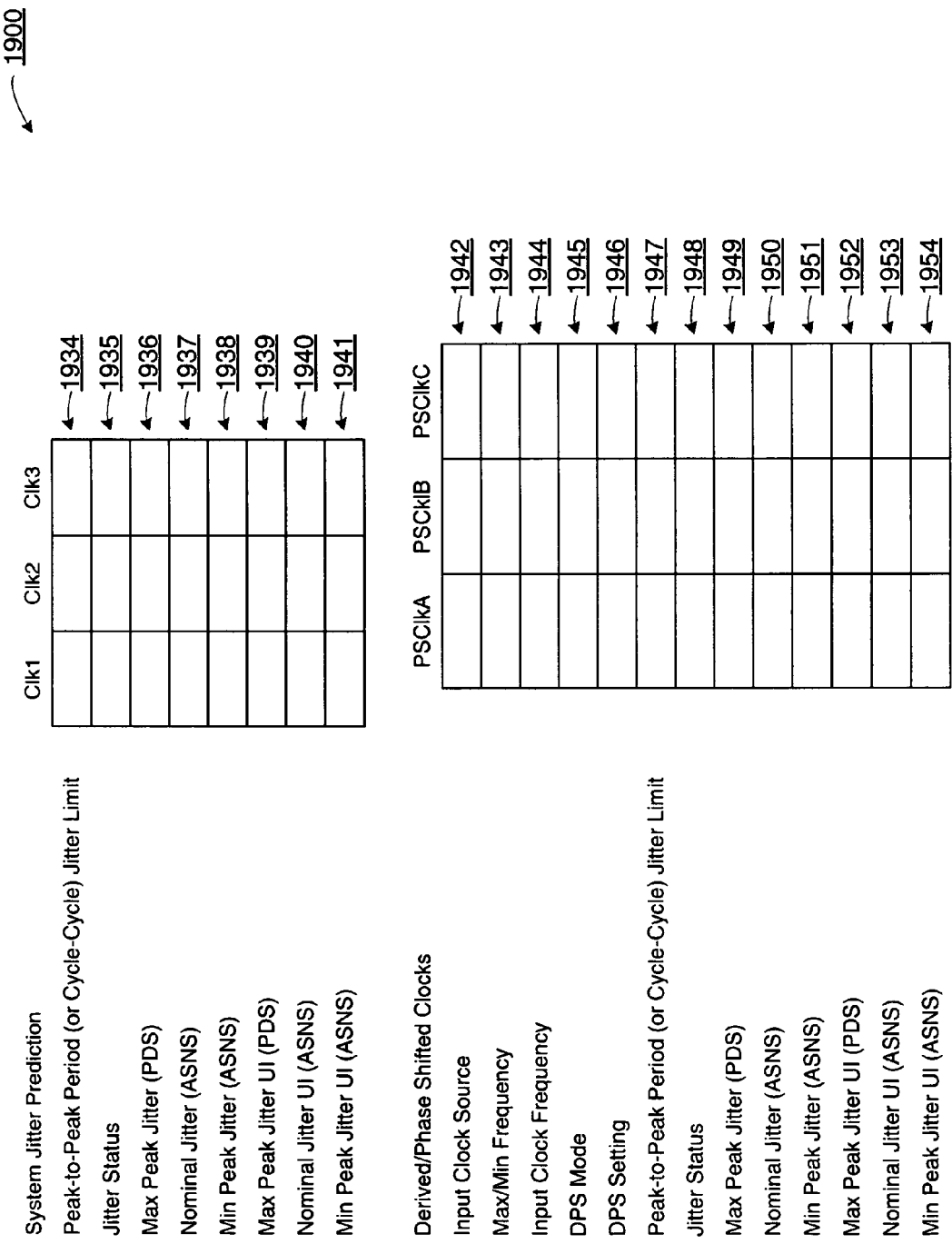
Figures 4, 17C:
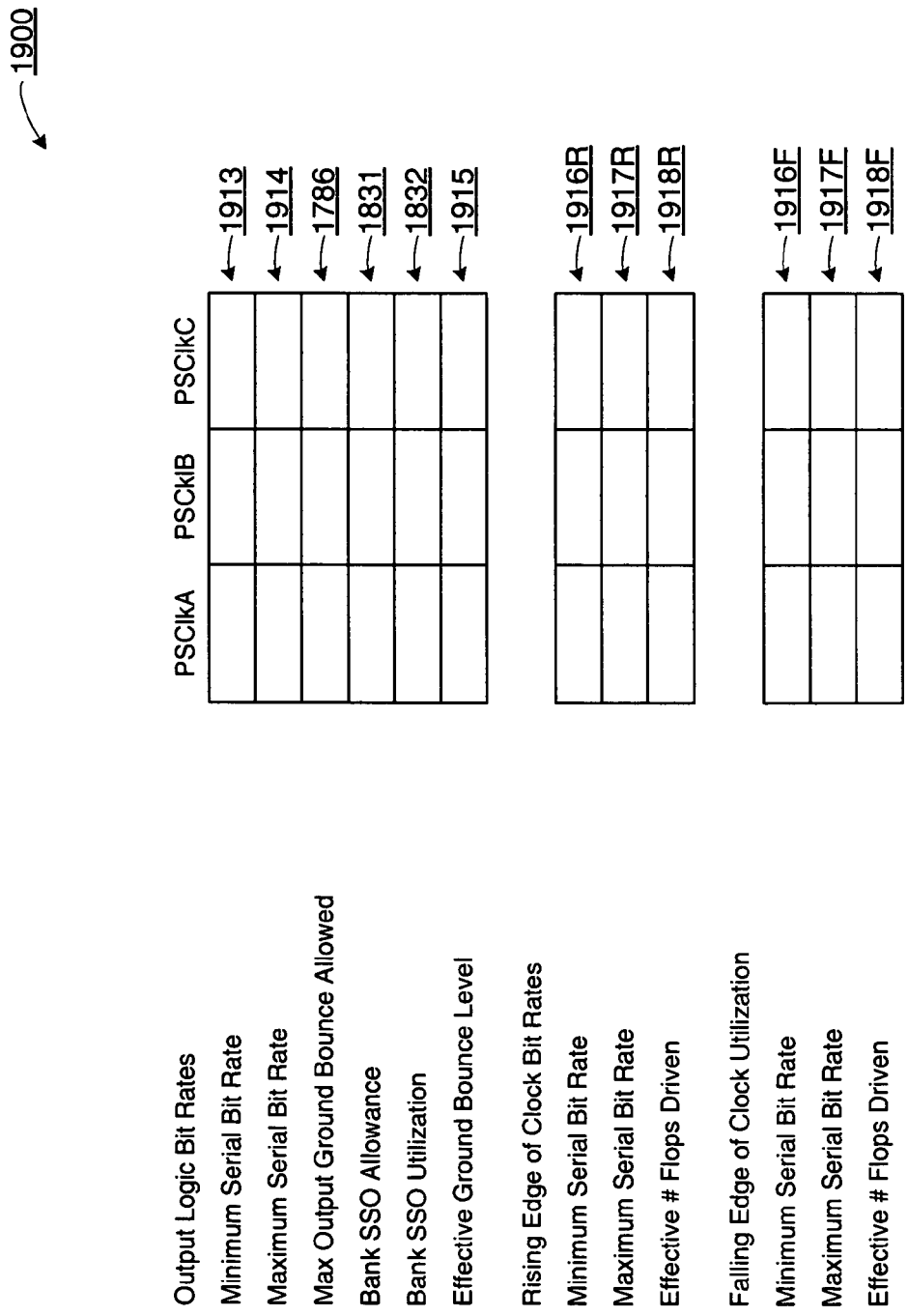
Figures 5, 17C:
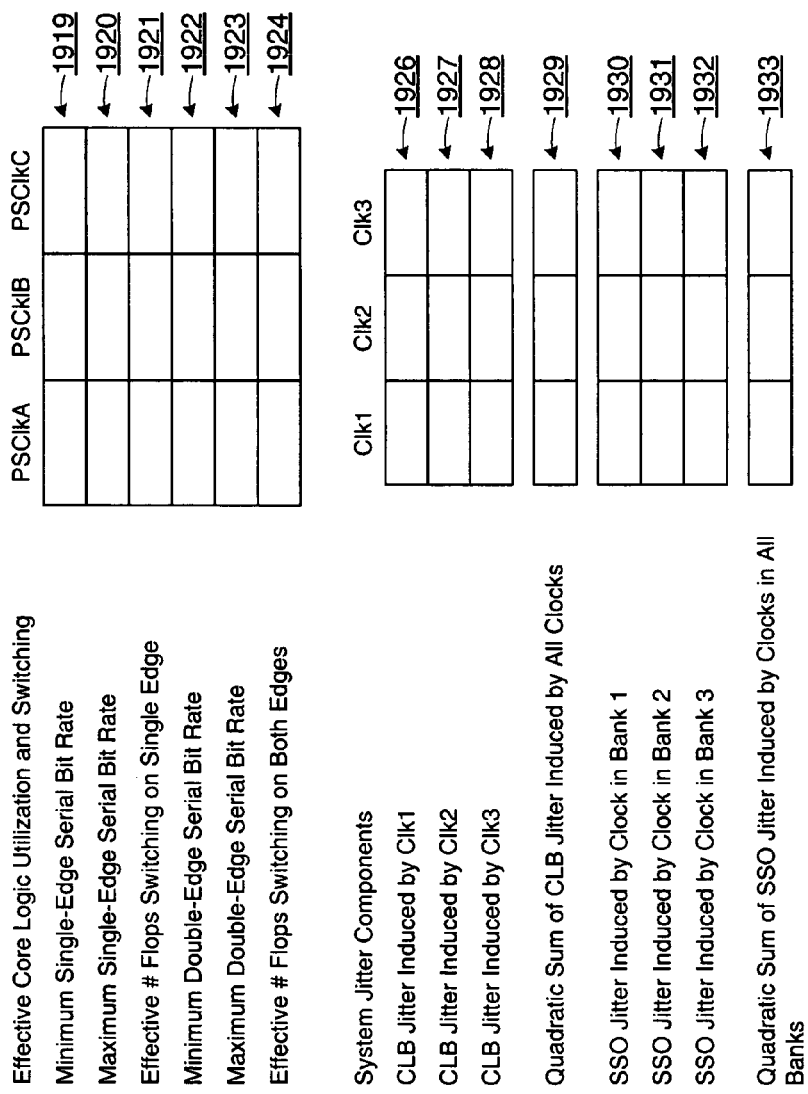

FIG. 17C, collectively FIGS. 17C-1 through 17C-5, is a spreadsheet diagram depicting an exemplary embodiment of an SJP portion 1900 of a user interface, such as may be implemented as part of a user interface 250 of FIG. 2B. SJP portion 1900 is for an SJP module, such as SJP module 275 of FIG. 2C. SJP portion 1900 may be used to predict jitter of a user's proposed design to be implemented, and accordingly there will be logic implementation associated with the design for which jitter is to be accounted for. This logic implementation may be an instantiation of a design in programmable logic. Notably, some fields, which may be propagated in multiple locations of a user interface as noted above, have previously been described, and thus description of same is not repeated. Although three clock domains and three banks are used for purposes of example, fewer or more than three of each may be implemented.

Output logic implementation in an FPGA has been described above with reference to fields 1870, 1814 through 1816, and 1866 of FIG. 17B. Additionally, an output clock entry status may be displayed for each bank in fields 1906. A jitter reduction factor and quality of implementation may be specified by a user for each bank in fields 1908 and 1910, respectively. The quality of implementation may for example be generally characterized as being either poor, fair, or good.

WASSO utilization percentage may be used as in this example with reference to fields 1786, 1814 through 1816, 1831, 1832, 1870, and 1866 of FIG. 17B; or alternatively actual calculations based on the number of output drivers and input drivers, among other factors may be used. However, the WASSO utilization generally accounts for the different input and output driver device types, strengths, and quantities. The WASSO utilization value also generally accounts for acceptable ground bounce level, effects of virtual power and ground, and phase shifting, among other effects used to provide a WASSO utilization value.

A core logic implementation section may have multiple clock domains which are generally shown here as clocks 1, 2, and 3; however, fewer or more than three clock domains may be used. A name for each clock may be used for association in a design and provided by a user or loaded from an ISE database into fields 1902. Minimum clock frequency optionally may be specified by a user in fields 1903 for each clock domain, and a maximum clock frequency may be specified by a user or loaded from an ISE database into fields 1904 for each clock domain. A core clock entry status for each clock domain may be provided in fields 1901.

The number of flip-flops, including LUTs, driven by a rising edge of a clock signal and the number of flip-flops driven by a falling edge of a clock signal may be input by a user or loaded from an ISE database for each clock domain into fields 1905R and 1905F respectively. Clock enable duty cycles for rising and falling edge clock utilizations may be input by a user into fields 1907R and 1907F respectively. Jitter reduction scaling factors for rising and falling edge clock utilizations may be input by a user into fields 1909R and 1909F respectively. Jitter reduction quality of implementation (e.g., poor, fair, good) for rising and falling edge clock utilizations may be input by a user into fields 1911R and 1911F respectively.

System jitter prediction for clocks may be done. Peak period ("cycle") jitter allowed by a user may be specified for each clock domain in fields 1934 from peak-to-peak or from cycle-to cycle. Jitter status for each clock domain may be displayed in fields 1935. Maximum peak jitter based on PDS and nominal and minimum peak jitter based on ASNS may be calculated for respectively populating fields 1936 through 1938 for each clock domain with timing values, such as in picoseconds. Maximum peak jitter based on PDS and nominal and minimum peak jitter based on ASNS may be calculated for respectively populating fields 1939 through 1941 for each clock domain based on unit intervals. Notably, the ASNS module is described below in additional detail with reference to FIG. 17D.

Parameters for derived clocks and phase-shifted clocks may be calculated. For this example three phase-shifted clocks are used, although the number of phase-shifted clocks may be equivalent to the total number of clock domains. Thus, fewer or more than three phase-shifted clocks may be used.

In fields 1942, a user may specify an input clock source for each phase-shifted clock. Notably, the source clock may be any of the clocks specified in the domain and some clocks may be repeated for more than one type of phase-shifted clock. A user may select either a maximum or a minimum frequency for each clock in fields 1943. An input clock frequency may be calculated and placed in fields 1944.

A Digital Phase Shift ("DPS") mode and DPS setting, which may be selected from any of a list of such settings, may be placed by a user for each phase-shifted clock domain into fields 1945 and 1946, respectively. A peak-to-peak or cycle-to-cycle jitter limit may be input by a user in fields 1947 for each phase-shifted clock domain. Accordingly, a determination may be made as to jitter status, namely whether jitter is within an acceptable limit, and a pass or fail indication may be placed for each phase-shifted clock domain in fields 1948. Maximum peak jitter based on PDS and nominal and minimum peak jitter based on ASNS may be calculated for respectively populating fields 1949 through 1951 for each phase-shifted clock domain with timing values, such as in picoseconds. Maximum peak jitter based on PDS and nominal and minimum peak jitter based on ASNS may be calculated for respectively populating fields 1952 through 1954 for each phase-shifted clock domain based on unit intervals.

Notably, fields 1786, 1831 and 1832 have been previously described, and thus values for populating these fields may be replicated here. Maximum and minimum serial bit rates for output logic may be calculated for each clock domain and populated in fields 1913 and 1914, respectively. An effective ground bounce level may be calculated for each clock domain and populated in fields 1915. Rising and falling edge clock bit rates may be separately calculated for population of fields. For example, a minimum serial bit rate, a maximum serial bit rate, and an effective number of flip-flops driven may be calculated for rising-edge triggered clocking for population of fields 1916R, 1917R, and 1918R, respectively. Moreover, a minimum serial bit rate, a maximum serial bit rate, and an effective number of flip-flops driven may be calculated for falling-edge triggered clocking for population of fields 1916F, 1917F, and 1918F, respectively.

Effective core logic utilization and switching may be calculated for SDR and DDR applications. For example, minimum single-edge serial bit rate, maximum single-edge serial bit rate, and an effective number of flip-flops switching on a single edge of a clock signal may be calculated for each clock domain for respective population of fields 1919 through 1921. Moreover, minimum double-edge serial bit rate, maximum double-edge serial bit rate, and an effective number of flip-flops switching on both edges of a clock signal may be calculated for respective population of fields 1922 through 1924 for each clock domain.

Quadratic summation of CLB jitter induced by all clocks, including phase-shifted clocks, may be calculated and placed into fields 1929. Contribution due to coincident occurrence of clocks may be taken into account for this calculation.

System jitter components may be calculated for jitter for each CLB induced by a respective clock signal. Again, only three clock domains are described; however, it should be appreciated that fewer or more than three clock domains may be implemented. CLB jitter induced by clock signals 1 through 3 may be specified for each clock in fields 1926 through 1928, respectively. Notably, though not illustratively shown in the exemplary user interface of FIG. 17C, fields 1926 through 1928 may be broken out into four separate categories. For example, CLB jitter may be calculated for single-edge switching separately from double-edge switching. Additionally, CLB jitter may be calculated for clocks operating at their minimum frequency separately from clocks operating at their maximum frequency. Using these four separate subcategories, four sets of fields 1926 through 1928 may be generated with a set of separate quadratic summation fields 1929 for each of the four sets. Notably, quadratic summation may be done for each clock domain.

Additionally, a quadratic sum of all SSO jitter induced by all clock signals may be calculated for each bank and placed into fields 1933. SSO jitter induced by each clock signal may be calculated for each bank and placed in fields 1930 through 1932. Notably, though not illustratively shown in the exemplary user interface of FIG. 17C, fields 1930 through 1932 may be broken out into separate categories for jitter due to minimum frequency of a clock causing SSO switching and due to maximum frequency of a clock causing SSO switching. A quadratic sum of all SSO jitter induced by all clock signals may be calculated for each bank and placed in fields 1933. This quadratic sum may be done separately for minimum frequency clocking and maximum frequency clocking, and a quadratic summation may be done for each clock domain.

Notably, the system jitter prediction module uses a quadratic sum of what is indicated as SSO. However, this SSO calculation is based on the WASSO. Notably, the WASSO takes into account SSI. Accordingly, SSO within system jitter predictor module 1900 is actually taking into account both SSO and SSI. Furthermore, jitter values calculated within the system jitter predictor module 1900 may be included in a place and route software tool for placement and routing where jitter is taken into account.

In summary, the SJP module employs such parameters as minimum and maximum clock frequency, clock enable duty cycle, a jitter reduction factor, a jitter reduction quality of implementation, and a number of CLBs, LUTs, or flip-flops used to calculate the amount of jitter expected from a user's design. The amount of jitter predicted could be any number of types, including: period jitter, cycle-to-cycle jitter, half-period jitter, high-pulse jitter, low-pulse jitter, Duty Cycle Distortion ("DCD"), periodic jitter ("Pj"), Data Dependent jitter ("DDj"), Random jitter ("Rj"), Total jitter ("Tj"), Deterministic jitter ("Dj"), and Inter-Symbol Interference ("ISI"), among other known types of jitter. The effective data toggle frequency may be calculated based on clock frequency and clock enables, and whether rising, falling, or both rising and falling clock edges are used. Notably, a logic block may have multiple clocks, multiple clock enables, and multiple staggered clock enables. Additionally, differences in jitter as a result of phase shifting, which could be based on manufacturer's characterization data, curves, graphs, formulas, simulations, parasitic extractions, calculations, or the like may be accounted for. Phase shift parameters include clock frequency, shift mode, and the value of phase offset. Moreover, differences in jitter as a function of variation in temperature (e.g., scaling factor percentage variation or picoseconds of jitter per degree Celsius), or voltages (e.g., scaling factor percentage variation or picoseconds of jitter per mV of supply variation), as determined by manufacturer's characterization data, calculations, formula, curves, graphs, and the like, may be accounted for. Additionally, it should be appreciated that timing closure with an FPGA router may be obtained by providing system jitter numbers that are used as part of the router's timing constraints.

It should be appreciated that jitter may be determined from scaling the number of LUTs or flip-flops used in a user's design against the number of LUTs or flip-flops used in manufacturer's characterization. Jitter values may be determined by looking up manufacturer's characterization data, by interpolation of such data, by insertion and replication of such data, by mathematical computation of formula, and the like. Though only CLB blocks and I/O blocks have been described, it should be appreciated that noise of other circuitry on the FPGA, including microprocessors, microcontrollers, DCMs, Digital Frequency Shifters, Phase-Locked Loops, Digital Phase Shifters, Phase-Matched Clock Dividers, BRAMs, DSPs, and MGTs, among other types of known circuits may likewise be addressed. Furthermore, although an example of an FPGA is used, any other integrated circuit having noise, such as a CPU, microprocessor, signal processor, image processor, or network processor, among other known types of integrated circuits may be used.

Accordingly, predictions or estimates of clock or output jitter that is caused by noise generated by an integrated circuit device itself as a result of internal logic switching or output driver switching may be obtained. Such generated noise may be affected by PDS response of discrete capacitors on the PCB, buried capacitance on the PCB, discrete capacitors on the package substrate, buried capacitance on package substrate, and embedded capacitance in the integrated circuit die. The SJP module is applicable to any timing parameter associated with or caused by a circuit. Moreover, one or more than one clock domains may be accounted for.

ASNS Interface

Figures 1, 17D:
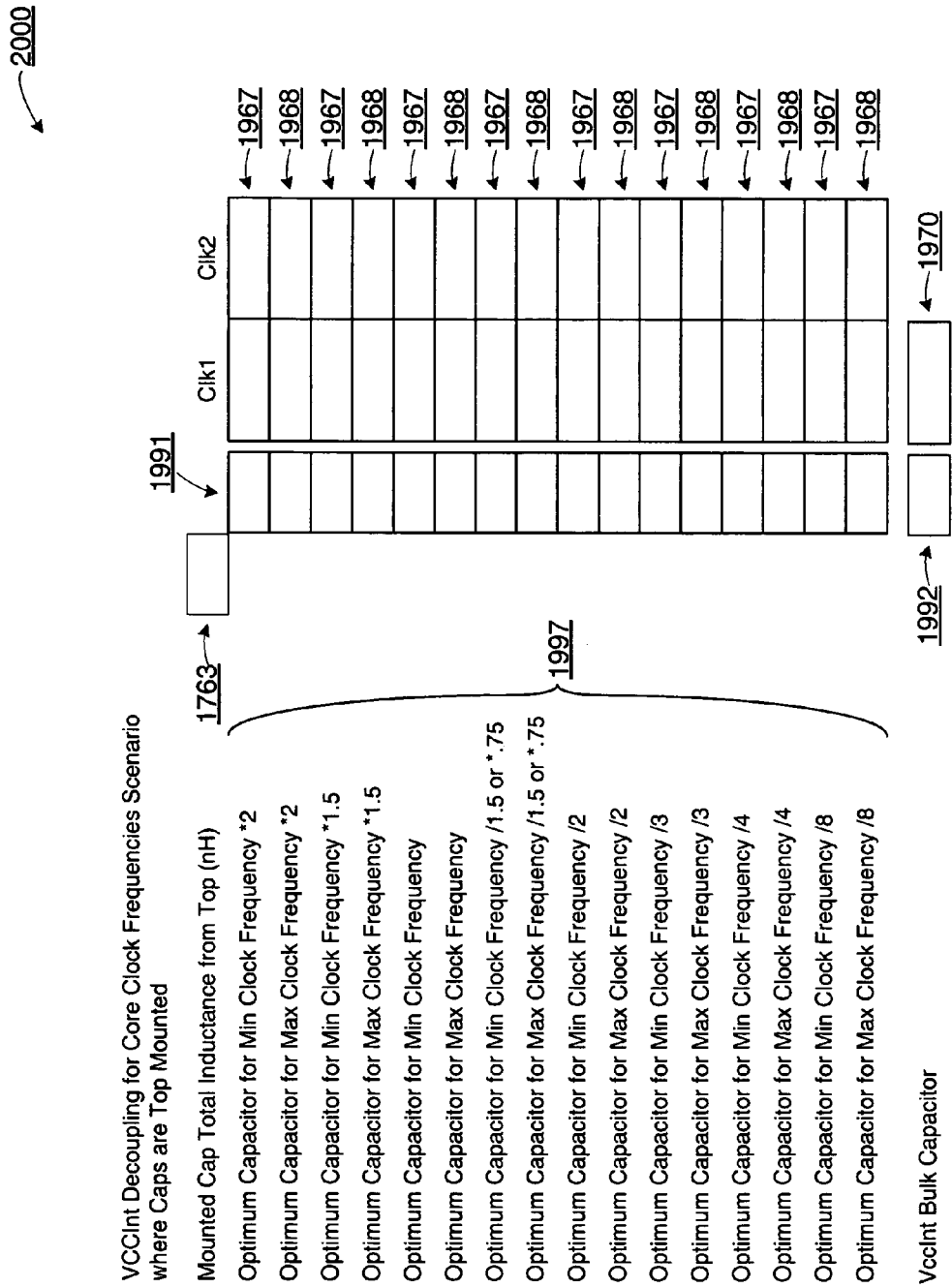
FIG. 17D, collectively
Figures 2, 17D:
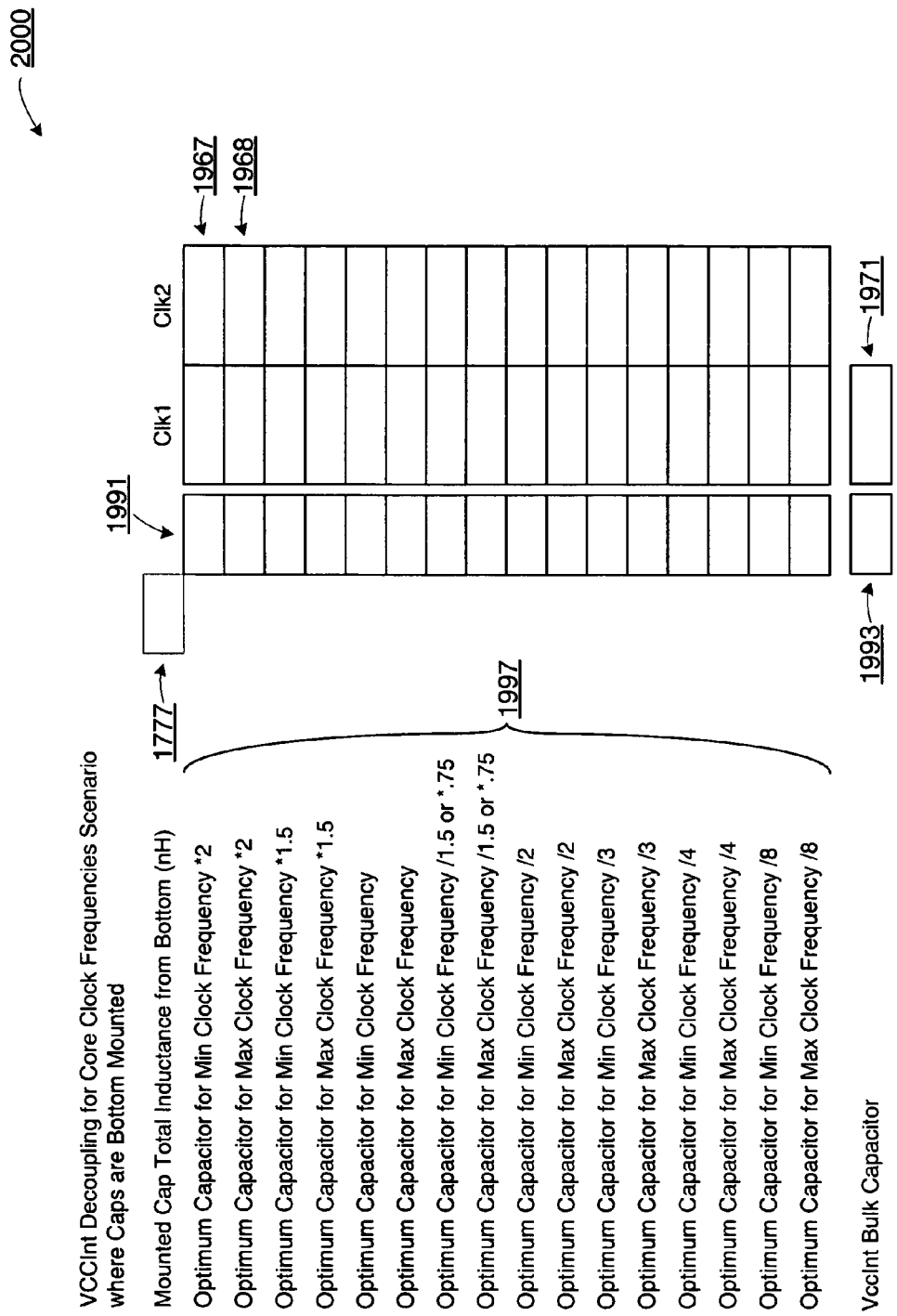
Figures 3, 17D:
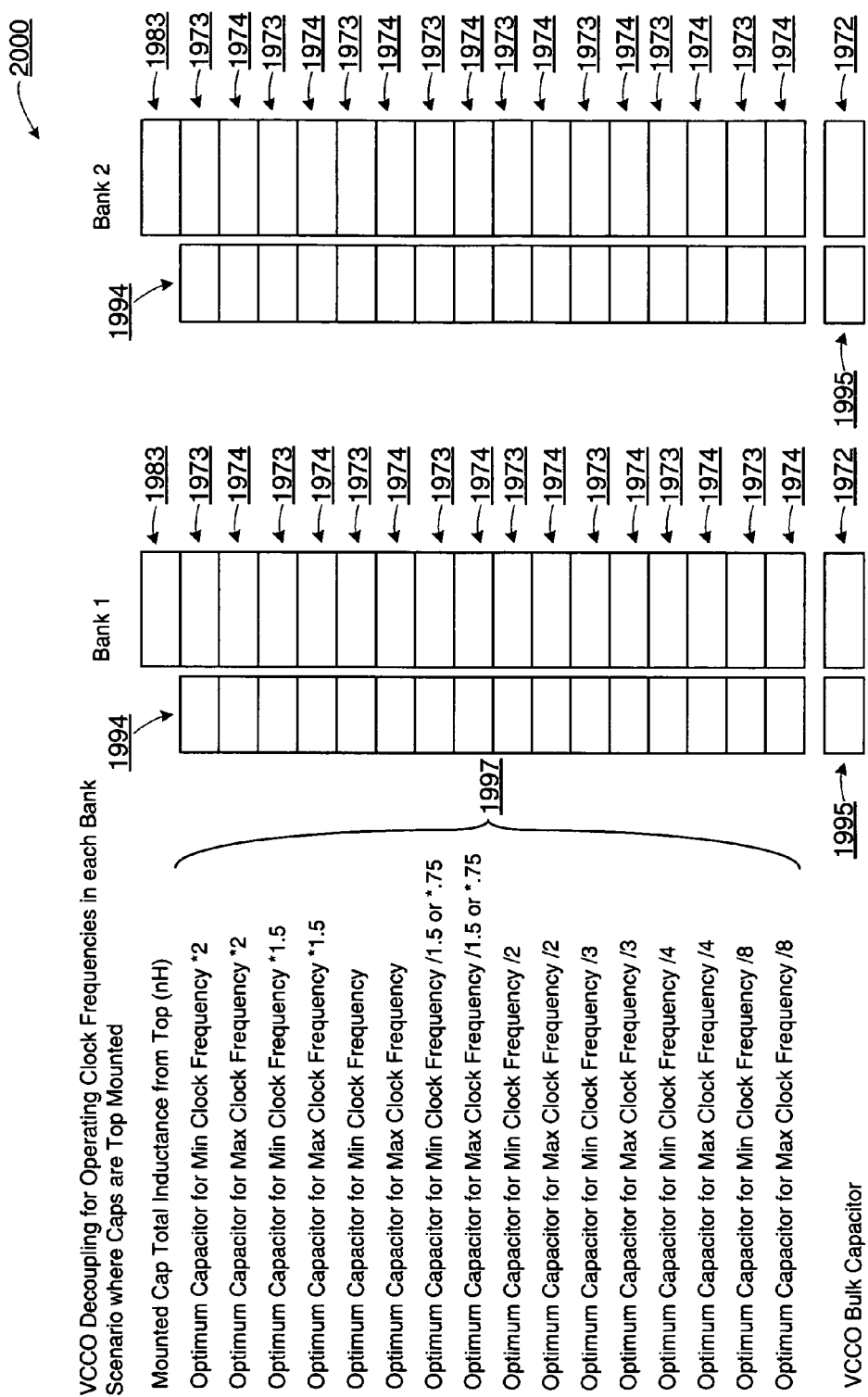

FIG. 17D, collectively FIGS. 17D-1 through 17D-3, is a spreadsheet diagram depicting an exemplary embodiment of an ASNS analysis portion 2000 of a user interface, such as may be implemented as part of a user interface 250 of FIG. 2B. Portion 2000 is for an ASNS analysis module, such as ASNS analysis module 274 of FIG. 2C. ASNS analysis portion 2000 may be used to determine capacitors to be used for lowering the PDS noise profile. Notably, fields 1801 through 1807, 1861 through 1864, 1902 through 1904 described with reference to FIG. 17C may be included in portion 2000, or values from such fields used by ASNS analysis portion 2000 may be obtained from SJP portion 1900 of FIG. 17C.

Although two clock domains and two banks are used for purposes of example, fewer or more than two of each may be implemented. Vcc internal decoupling for core clock frequencies may be addressed in order to determine which capacitors to use for lowering the PDS noise profile. However, it should be understood that whether a capacitor is mounted to a top side or bottom side of a PCB can have a different effect. Accordingly, top- and bottom-mounted capacitor scenarios are described below. Additionally, a total inductance from either a top- or bottom-mounted capacitor may be obtained from PCB analysis portion 1700 described with reference to FIG. 17A. Accordingly, field 1763 may include a top-mounted capacitor total inductance as obtained from PCB analysis portion 1700 of FIG. 17A. An optimum capacitor value from minimum and maximum clock frequencies for each clock frequency used or multiples or fractions thereof as indicated from list 1997 may be determined for respectively populating fields for each clock domain. Although particular multiples or divisors are used with respect to minimum and maximum clock frequencies, it should be understood that other values may be used. Moreover, although up to a two times frequency multiple is illustratively shown, such frequency multiplier may be greater than 2. Likewise, although up to a frequency divisor of 8 is illustratively shown, such divisor may be greater than 8. Furthermore, rather than a 1.5 frequency divisor, a 0.75 frequency multiplier may be used. Thus, it should be appreciated that for each clock signal, an optimum capacitor value for a minimum clock frequency times or divided by a multiple thereof may be calculated and placed in fields 1967, and an optimum capacitor value for a maximum clock frequency, including any multiple or division thereof, may be placed in fields 1968. Fields 1991 may be used to specify the number of capacitors use for each capacitor stack of respective capacitances from fields 1967 and 1968. For this particular example of Vcc internal, a Vcc internal bulk capacitor value may be specified in field 1970 for a top-mounted capacitor and the number of such bulk capacitors may be specified in field 1992. Thus, generally a user may specify a Vcc power supply switching frequency, described above, and a bulk capacitor targeted toward that switching frequency may be calculated.

The above example may be repeated except for a bottom-mounted capacitor having an inductance indicated in field 1777 as obtained from PCB analysis portion 1700 of FIG. 17A. For this particular example of Vcc internal, a Vcc internal bulk capacitor value may be specified in field 1971 for a bottom-mounted capacitor and the number of such bulk capacitors may be specified in field 1993. Notably, while the example for core clock frequencies for clock domains is for Vcc internal, it should be appreciated that this may be done for other supply voltages, including Vcc auxiliary.

Additionally, capacitance values for decoupling capacitors for operating clock frequencies in each bank may be determined. For example, capacitance values for decoupling capacitors for VCCO for operating clock frequencies in each bank may be determined as illustratively shown. Notably, fields 1983 are for specifying an inductance associated with a top-mounted capacitor on a bank-by-bank basis. This inductance may be obtained from the calculation of inductance for each VCCO supply from PCB analysis portion 1700 of FIG. 17A. Each VCCO supply has a separate inductance calculated for it. Fields 1994 are for specifying the number of capacitors used for each calculated value of capacitance. The calculated values of capacitance in fields 1973 and 1974 may be for a minimum and maximum clock frequency, respectively, as listed in list 1997. Each bank further has a specified bulk capacitance value in field 1972 and a number of capacitors to form the stack in field 1995. Notably, although this example is for a top-mounted capacitor, it may be replicated for a bottom-mounted capacitor, though not shown for purposes of clarity. Moreover, although this particular example is for VCCO, it should be understood that it may be replicated for other supply voltages as well.

It should be appreciated that the above examples are for an FPGA, and more particularly for Xilinx FPGA of Xilinx, Inc. of San Jose, Calif. However, it should be understood that even though an FPGA in this example generally uses VCCO for output and Vcc internal and Vcc auxiliary for core logic, other supply types of voltages and configurations thereof may be used. It should further be appreciated that each bank may be operated at a different voltage level and may be operated with one or more than one clock frequency. Furthermore, it should be appreciated that a range of frequencies may be specified by a user and capacitor values covering the range of frequencies may be provided. Notably, a fundamental frequency and variance of that fundamental frequency are identified for providing optimum capacitor values to reduce noise and, more particularly, the PDS noise profile at those identified discrete frequencies, namely the fundamental frequency, harmonics, and sub-harmonics thereof, may be reduced. The harmonics, the effective number of flip-flops, and the degree that logic changes or switches as a percentage of each clock cycle, among other variables, may all have an effect on this determination.

To handle internal logic as implemented in an FPGA, profiles of the internal logic as well as the outputs of the circuit design may be generated for each internal logic block as well as for each output bank. Thus, for example, the number of flip-flops utilized in a circuit design with respect to internal logic may be specified for each block. The operating clock frequency maximum and minimum as well as the clock enable duty cycle for each block may be specified. For the FPGA output profile, output clock frequency minimum and maximum, as well as output clock enable duty cycle for each bank, which may include a middle top combination of banks or a middle bottom combination of banks, may be specified. The total number of I/O devices in a bank for the output profile may be hard coded and specified for each bank as obtained from a database. The total number of I/O devices for each bank may be calculated. Additionally, the number of dedicated power and ground pairs in a bank, which may be hard coded for each bank, may be obtained from a database. Thus, for example, a manufacturer of an IC may provide a database having this power and ground pair information for each bank.

Notably, a targeted PDS design may be determined for each specific user design by targeting its operating clock frequencies, their harmonics, their sub-harmonics, and their effective serial bit rates. Noise suppression may be specifically targeted at these frequencies by having each capacitor's self-resonance frequency ("SRF") specifically targeted at such frequencies. Optimum noise suppression may be provided by positioning a capacitor's self-resonant frequency at the user's operating clock frequency and serial bit rates. This optimization may be repeated for harmonics (higher order) or sub-harmonics (lower order) of the user's operating frequency. The PDS and Power Distribution Noise ("PDN") response of an IC and IC package may be compensated for by altering the PDS response of the PCB. These same techniques may be applied to the PCB, whether a plug-in and backplane, daughter card and mother board, or other combination. Furthermore, these same techniques may be applied to the IC package and substrate, and to the semiconductor die itself by altering the on-chip capacitance.

Additionally, various parameters may be accounted for including: mounting inductance, which may have a profound effect on self-resonant frequency; differences in mounting inductance between top-mount and bottom-mount positions; and differences in capacitance due to variations in temperature (scaling factor percentage variation or pF per degree Celsius), or voltages (scaling factor percentage variation or pF per mV of supply variation), as determined by manufacturer's characterization data, curves, graphs, formulas, simulations, parasitic extractions, calculations, or the like. Moreover, relationships may be shown including: impedance response (e.g., impedance (Z) versus frequency) of a combination of capacitors used; noise rejection ratio (e.g., noise level (dB) versus frequency) of a combination of capacitors used; and S21 parameter rejection ratio of a combination of capacitors used.

Additionally, other parameters may be determined including: the optimum value of a capacitor based on effective data toggle frequency, which is a product of clock frequency and clock enable duty cycle; buried capacitances and buried capacitors' ESR, and ESL from PCB analysis module, including combining their response with discrete capacitors' response; Parallel Resonance Frequencies (anti-resonances) that arise from the interaction between PDS of discrete capacitors and buried capacitances or that arise between the bulk capacitor and the high-frequency MLCC, including calculating discrete capacitor value(s) to suppress such frequencies; the number of capacitors used at each frequency using the number of CLBs, LUTs, or flip-flops; a number of capacitors based on achieving a certain impedance level at an operating clock frequency; a number of capacitors used based on a target impedance based on the number of LUTs used; anti-resonances that come about between the PCB's buried capacitance and the discrete capacitor's response, including determining discrete capacitor values to suppress such anti-resonance; and anti-resonance between a bulk capacitor and a high-frequency capacitor, including discrete capacitor values to suppress such anti-resonance. Moreover, optimum values that may be determined include: optimum low-frequency capacitor values targeted at the switching frequency of voltage regulators; optimum high-frequency capacitor values targeted at the fundamental clock frequency, its harmonics and sub-harmonics, and the serial data bit rates; and optimum capacitor values to suppress Parallel (Anti-) Resonances, namely targeted resonances that come about from one or more of the following: a) interaction among high-frequency capacitors themselves; b) interaction between high-frequency capacitors and low-frequency capacitors, and c) interaction between high-frequency capacitors and the PCB's buried capacitances. A user may use a lump model, a finite element model, or a field solver for one-dimensional ("1D"), two-dimensional ("2D"), or three-dimensional ("3D") modeling to solve for capacitance values. A user may use temperature as a derating factor for the value of capacitance.

ASNS as described herein may be used to suppress clock jitter, duty cycle distortion, output uncertainty, data push-in/push-out, ground bounce, and VCC bounce parameters associated with or caused by activity of a circuit or function that resides within a FPGA environment, and more generally, any semiconductor device, PCB, or IC package substrate, among other known configurations. Furthermore, this may be done for devices using one or more than one clock domain or using one or more than one supply voltage.

Clock Planner Interface

Figures 1, 18:
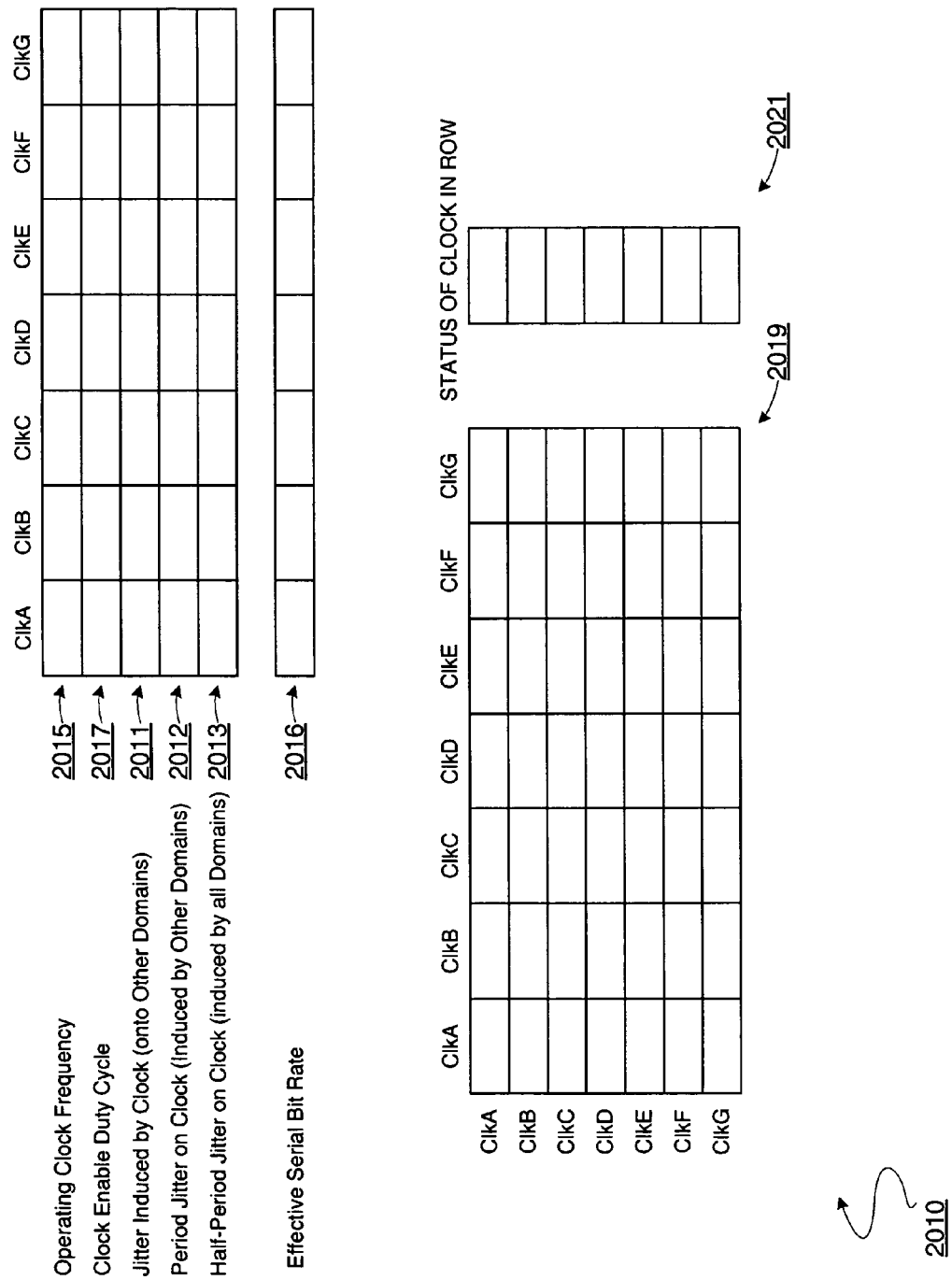
FIG. 18, collectively
Figures 2, 18:
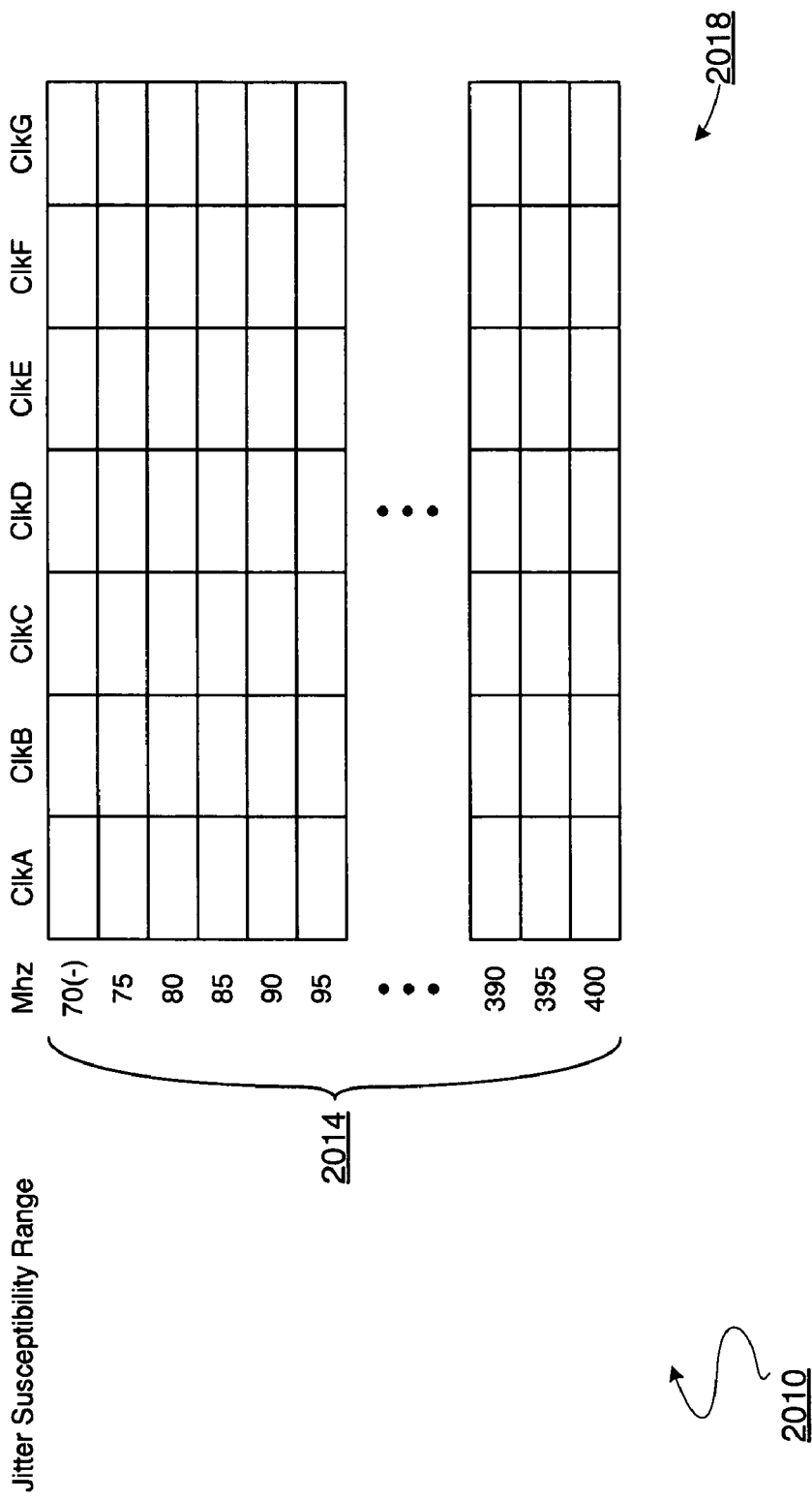

FIG. 18, collectively FIGS. 18-1 and 18-2, is a spreadsheet diagram depicting an exemplary embodiment of a clock planner 2010, which may be implemented as part of user interface 250 of FIG. 2B. Notably, clock planner 2010 may include operating clock frequency fields 2015 and clock enable duty cycle fields 2017 for input by a user here. Notably, frequency of operation of clocks gives an indication of how often switching events may occur, and thus this information may be used for determining jitter, including predicting jitter.

Even though seven clock domains, namely domains ClkA through ClkG, are illustratively shown, fewer or more than seven clock domains may be used. Jitter induced by each clock domain onto one or more other clock domains may be determined for population in fields 2011. Period jitter induced by other clock domains on each clock domain may be determined for population in fields 2012. Half-period jitter induced by all clock domains on each clock domain may be determined for population of fields 2013. Notably, peak-to-peak jitter for fields 2011 through 2013 need not be expressed as a quantity, but may be expressed as a relative quantitative term, such as "little," "low," "high," and "most" for example. Effective serial bit rate for each clock may be calculated for populating fields 2016. Moreover, a clock domain by clock domain array 2019 may provide a status 2021, such as logic high or low, of each clock signal.

Clock planner 2010 may include a jitter susceptibility array 2018. A jitter susceptibility range 2014, such as from 70 to 400 Mhz, may be provided for each clock domain in 5 Mhz increments. Of course, other jitter susceptibility ranges, as well as other increments, may be used. Jitter susceptibility array 2018 may indicate within which portions of jitter susceptibility range 2014 jitter is least, more, and most susceptible to other bit rates operating at an indicated frequency range.

Accordingly, clock planner 2010 provides a means to visually display a range of clock frequencies where jitter is least, nominal, and most. This is may be done based on manufacturer's characterization data, or may be done through other means such as curves, graphs, formulas, simulations, parasitic extractions, calculations, or the like. "Least," "nominal," and "most" may be generally defined as less than approximately 200 ps, approximately 200-599 ps, and greater than 600 ps, respectively.

An individual capacitor's imaginary ESR may be determined from:

$$X(2F) = (wL) - \left(\frac{1}{wC}\right), \tag{6}$$

where w=2πF, for F being frequency, L being inductance, and C being capacitance. The equation for an individual capacitor's overall impedance is:

$$Z(F) = \sqrt{(ESR)^2 + X^2}. \tag{7}$$

The equation for the real portion of admittance is:

$$G = \frac{ESR}{Z^2}. \tag{8}$$

The equation for the imaginary portion of admittance is:

$$B = \frac{-X}{Z^2}. \tag{9}$$

The equation for overall PDS response is:

$$Z(All) = \frac{1}{\sqrt{Gi^2 + Bi^2}}. \tag{10}$$

Notably, examples of I/O Standards that may be used include TTL, GTL, HSTL, SSTL, PECL, BLVDS, GTL, GTLP, PCI, CMOS, and DCI, as well as known variations thereof, such as low voltage versions, among other known interface standards. Additionally, the maximum number of SSOs for each power/ground pair may vary from manufacturer to manufacturer. With respect to Sparse Chevron packages, as well as other configurations for increasing the number of power/ground pairs in proximity to signal pins, the maximum number of SSOs per power/ground pair may be higher.

Figure 19A:
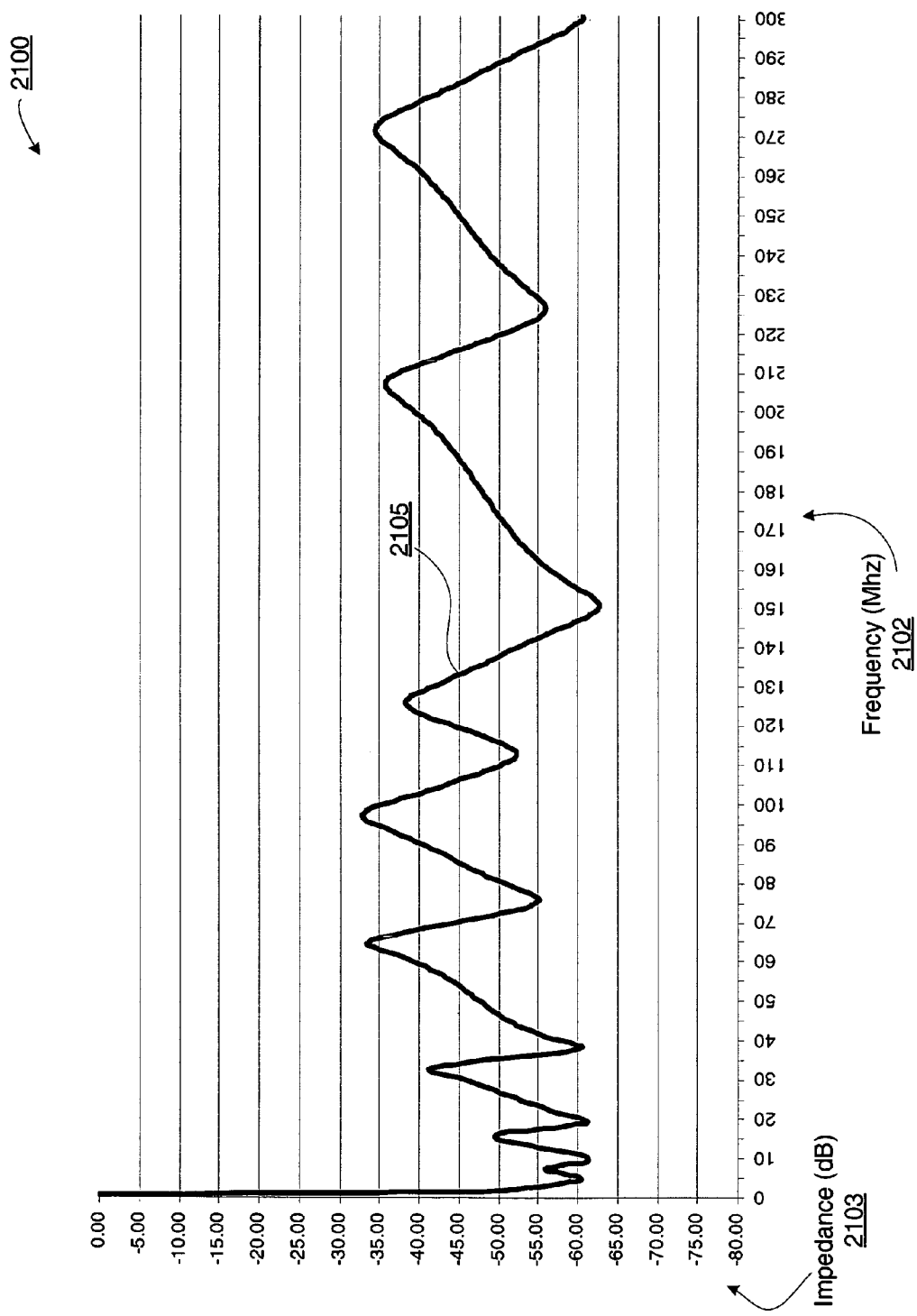
FIG. 19A is a graphical diagram depicting an exemplary embodiment of a noise rejection ratio as frequency is plotted versus impedance.

With the values input by a user and subsequently calculated by one or more modules of a system noise management suite 260 as described herein, graphs may be generated for the various data points. For example, FIG. 19A is a graphical diagram depicting an exemplary embodiment of noise rejection ratio 2100 as frequency 2102 is plotted versus impedance 2103. Curve 2105 represents a projected noise rejection ratio as may be expected on a network analyzer for the absolute value of the S21 or S12 S-parameter.

Figure 19B:
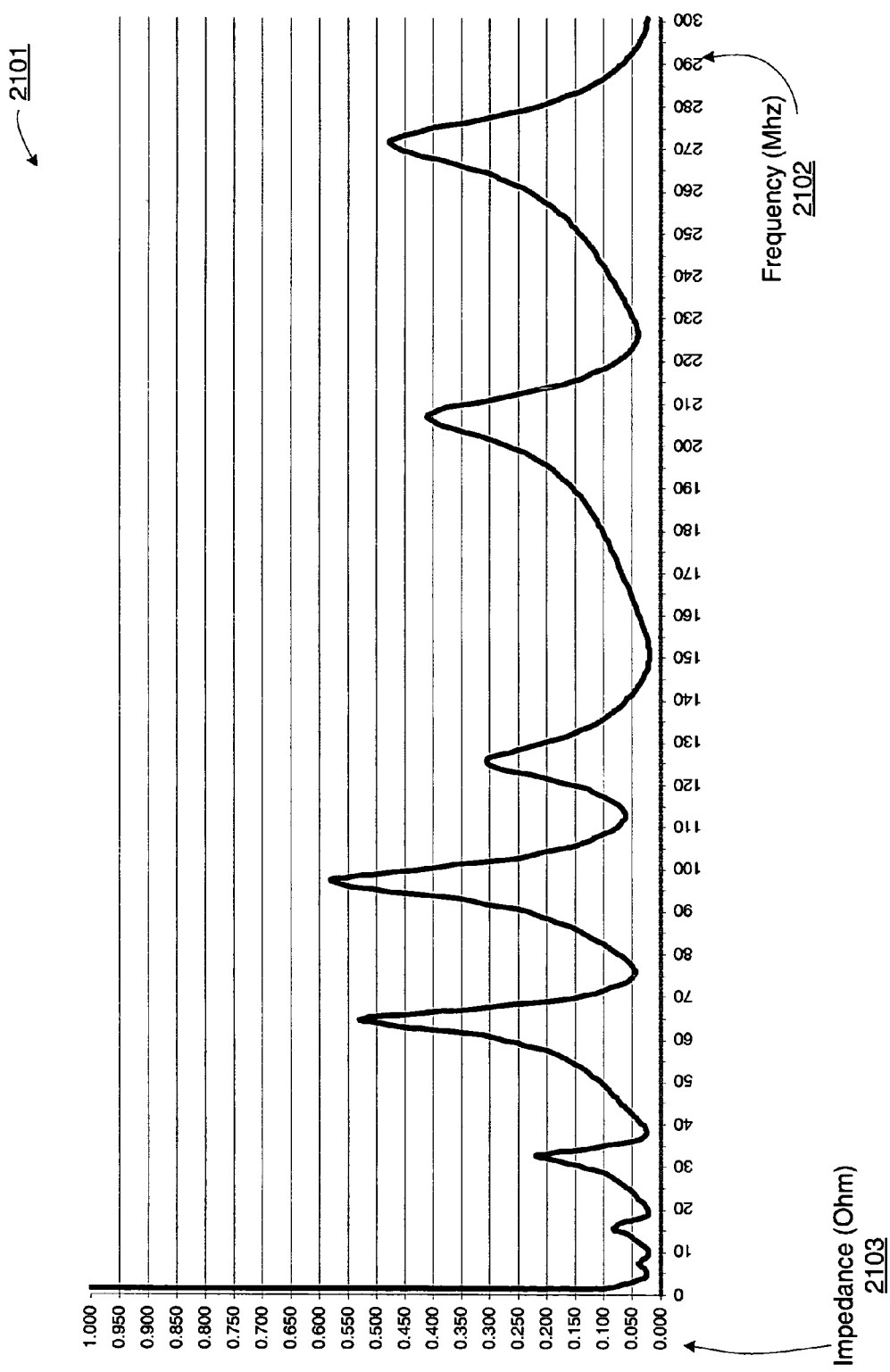
FIG. 19B is a graphical diagram depicting an exemplary embodiment of a power distribution system ("PDS") response for a resonant condition.

FIG. 19B is a graphical diagram depicting an exemplary embodiment of a PDS response 2101 for a resonant condition. Notably, multiples or fractions of a fundamental frequency, such as a frequency of operation, may be used to plot frequency 2102 versus impedance 2103. Curves of PDS response 2101 represent outputs of an exemplary implementation of an ASNS analysis module 274 of FIG. 2C as described herein.

Figure 20:
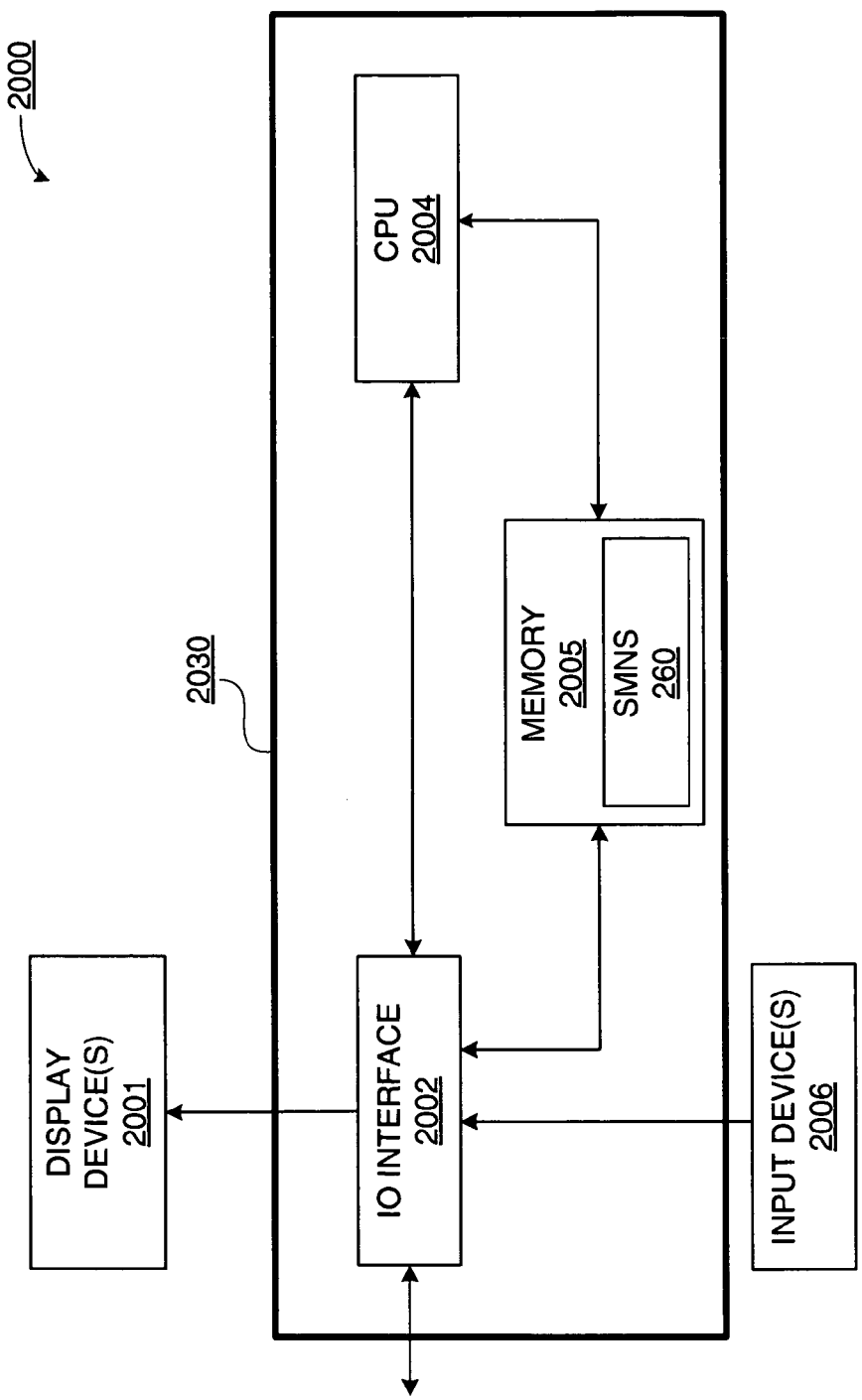
FIG. 20 is a block diagram depicting an exemplary embodiment of a computer system.

FIG. 20 is a block diagram depicting an exemplary embodiment of a computer system 2000. Computer system 2000 may include a programmed computer 2030 coupled to one or more display devices 2001, such as Cathode Ray Tube ("CRT") displays, Plasma displays, Liquid Crystal Displays ("LCD"), and to one or more input devices 2006, such as a keyboard and a cursor pointing device. Other known configurations of a computer system may be used.

Programmed computer 2030 may be programmed with a known operating system, which may be Mac OS, Java Virtual Machine, Linux, Solaris, Unix, or a Windows operating system, among other known platforms. Programmed computer 2030 includes a central processing unit ("CPU") 2004, memory 2005, and an input/output ("I/O") interface 2002. CPU 2004 may be a type of microprocessor known in the art, such as available from IBM, Intel, and Advanced Micro Devices for example. Support circuits (not shown) may include conventional cache, power supplies, clock circuits, data registers, and the like. Memory 2005 may be directly coupled to CPU 2004 or coupled through I/O interface 2002. At least a portion of an operating system may be disposed in memory 2005. Memory 2005 may include one or more of the following: random access memory, read only memory, magneto-resistive read/write memory, optical read/write memory, cache memory, magnetic read/write memory, and the like, as well as signal-bearing media as described below.

I/O interface 2002 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 2002 may be coupled to a conventional keyboard, network, mouse, display printer, and interface circuitry adapted to receive and transmit data, such as data files and the like. Notably, programmed computer 2030 may be coupled to a number of client computers, server computers, or any combination thereof via a conventional network infrastructure, such as a company's Intranet or the Internet, for example, allowing distributed use for interface generation.

Memory 2005 may store all or portions of one or more programs or data to implement processes in accordance with one or more aspects of the invention to provide all or part of system noise management suite ("SNMS") 260. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more program(s) of system noise management suite 260, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Furthermore, such signal-bearing media may be in the form of a carrier wave or other signal propagation medium via a communication link for streaming information, including downloading all or a portion of a computer program product. Such signal-bearing media, when carrying computer-readable instructions that direct functions of one or more aspects of the invention, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, although user inputs may be shown as being directly into various modules for clarity, such inputs may be part of a user interface front end to such modules and an SNMS Engine. This provides one unified interface where the user may input all parameters used for analyses performed by modules. Claim(s) listing steps do not imply any order of the steps. Trademarks are the property of their respective owners.

What is claimed is:

1. A method for noise suppression for an implementation of an integrated circuit design, the method comprising:
   obtaining first clock operating parameters for logic blocks of the integrated circuit design;
   obtaining second clock operating parameters for input/output banks of the integrated circuit design;
   obtaining at least one switching frequency associated with at least one power supply source;
   determining first and second capacitor values for the at least one power supply source responsive to the first clock operating parameters, the second clock operating parameters, and the at least one switching frequency;
   the first capacitor values being associated with a first frequency range of operation;
   the second capacitor values being associated with a second frequency range of operation which is higher than the first frequency range of operation; and
   determining third capacitor values for suppression of anti-resonances.

2. The method according to claim 1, wherein the first capacitor values are targeted at the at least one switching frequency.

3. The method according to claim 2, wherein the at least one switching frequency is associated with at least one voltage regulator.

4. The method according to claim 1, wherein the second capacitor values are targeted at a clock frequency of at least one of the first clock operating parameters and the second clock operating parameters.

5. The method according to claim 4, wherein the second capacitor values are targeted at a fundamental frequency and harmonics thereof of the clock frequency.

6. The method according to claim 5, wherein the second capacitor values are targeted at sub-harmonics of the fundamental frequency of the clock frequency.

7. The method according to claim 1, further comprising selecting first capacitors, second capacitors, and third capacitors respectively associated with the first, second, and third capacitor values.

8. The method according to claim 7, wherein the third capacitor values are targeted at least in part responsive to interaction between the second capacitors themselves.

9. The method according to claim 7, wherein the third capacitor values are targeted at least in part responsive to interaction between the second capacitors and the first capacitors.

10. The method according to claim 7, further comprising determining at least one buried capacitance of a printed circuit board to which an implementation of the integrated circuit design is to be coupled as part of the system implementation.

11. The method according to claim 10, wherein the third capacitor values are targeted at least in part responsive to interaction between the second capacitors and the at least one buried capacitance.

12. The method according to claim 1, further comprising:
  determining a number of configuration logic blocks, look-up tables, and flip-flops used for the logic blocks and the input/output banks;
  determining a number of capacitors to use for discrete frequencies of a power distribution of noise response, the discrete frequencies being for a primary clock frequency of at least one of the first clock operating parameters and the second clock operating parameters and being for harmonics and sub-harmonics of the primary clock frequency.

13. The method according to claim 12, wherein the first clock operating parameters include first minimum and maximum clock frequencies, first clock activation duty cycle, and one or more active clock edges.

14. The method according to claim 13, wherein the second clock operating parameters include second minimum and maximum clock frequencies, second clock activation duty cycle, and flip-flop type.

15. The method according to claim 1 further comprising determining capacitors to use for the first, second, and third capacitor values, the capacitors for targeting noise suppression at discrete frequencies of a power distribution noise response, the capacitors respectively having self-resonance frequencies for application to the discrete frequencies.

16. The method according to claim 15, further comprising:
  determining mounting inductance for the capacitors associated with the first, second, and third capacitor values.

17. The method according to claim 16, wherein the mounting inductance of the capacitors is a factor in determining self-resonance frequencies thereof.

18. The method according to claim 17, wherein the mounting inductance includes differences between top and bottom mounting of the capacitors.

19. A program storage device readable by a machine, tangibly embodying software for noise suppression for an integrated circuit design, the software comprising:
  code for obtaining first clock operating parameters for logic blocks of the integrated circuit design;
  code for obtaining second clock operating parameters for input/output banks of the integrated circuit design;
  code for obtaining switching frequencies associated with power supply voltages;
  code for determining first capacitor values for at least one power supply source responsive to the first clock operating parameters, the second clock operating parameters, and the switching frequencies;
  code for determining second capacitor values for the at least one power supply source responsive to the first clock operating parameters, the second clock operating parameters, and the switching frequencies; and
  code for determining third capacitor values for suppression of anti-resonances associated with the power supply voltages.

20. The program storage device according to claim 19, wherein the software is for application specific noise suppression for an instantiation of the integrated circuit design in a programmable logic device.

* * * * *